(12) United States Patent
Nagahama et al.

(10) Patent No.: US 6,563,114 B1
(45) Date of Patent: May 13, 2003

(54) SUBSTRATE INSPECTING SYSTEM USING ELECTRON BEAM AND SUBSTRATE INSPECTING METHOD USING ELECTRON BEAM

(75) Inventors: Ichirota Nagahama, Yokohama (JP); Yuuichiro Yamazaki, Tokyo-To (JP); Takamitsu Nagai, Yokohama (JP); Motosuke Miyoshi, Tokyo-To (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/518,096

(22) Filed: Mar. 3, 2000

(30) Foreign Application Priority Data

Mar. 5, 1999 (JP) .......................................... 11-059042
Sep. 22, 1999 (JP) .......................................... 11-269346

(51) Int. Cl.$^7$ ............................................ H01J 37/145
(52) U.S. Cl. .................... 250/310; 250/311; 250/492.2; 250/397; 250/306
(58) Field of Search .................. 250/306, 310, 250/305, 311, 397, 492.2

(56) References Cited

U.S. PATENT DOCUMENTS 5,576,833 A 11/1996 Miyoshi et al.
6,265,719 B1 * 7/2001 Yamazaki et al. .......... 250/310

FOREIGN PATENT DOCUMENTS

JP          4-242060          8/1992

OTHER PUBLICATIONS

K. Tsuno, "Simulation of a Wien Filter as Beam Separator in a Low Energy Electron Microscope," Ultramicroscopy 55 (1994), 127–140.

* cited by examiner

Primary Examiner—John R. Lee
Assistant Examiner—David A. Vanore
(74) Attorney, Agent, or Firm—Finnegan, Henderson, Farabow, Garrett & Dunner, L.L.P.

(57) ABSTRACT

A host computer controlling a secondary optical system under such an image focusing condition that secondary beams obtained from an arbitrary region on a substrate form an image on a MCP detector, in accordance with a correlation between a state of the substrate and an energy of the secondary electrons and the reflected electrons upon the secondary optical system, in which the energy of the secondary electron beams is various depending on the state of the substrate. The host computer also measures quantitatively a physical and/or chemical characteristic of the substrate on a basis of the image focusing condition and the image signals.

21 Claims, 42 Drawing Sheets

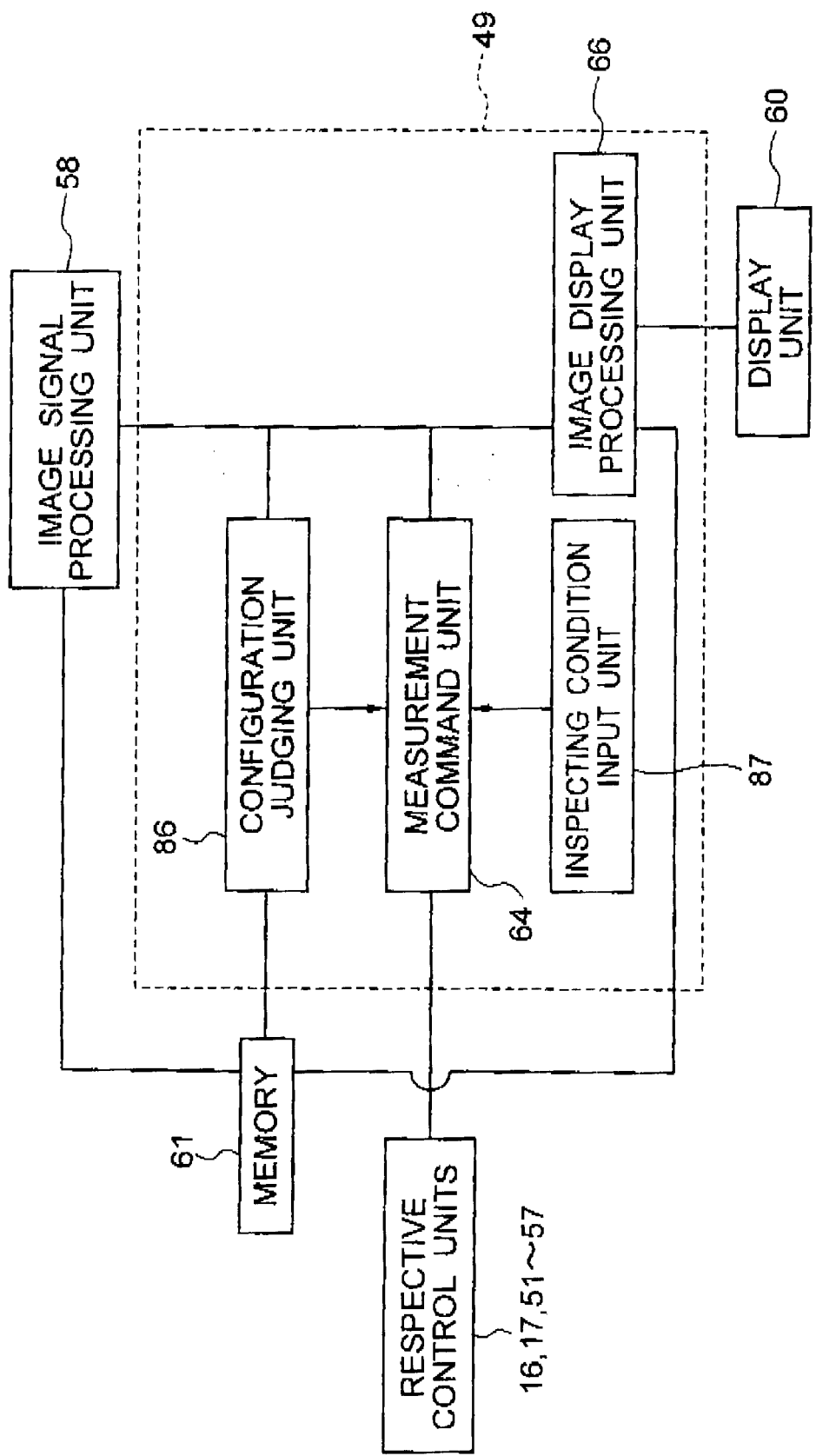

SUBSTRATE INSPECTING SYSTEM USING ELECTRON BEAM AND SUBSTRATE INSPECTING METHOD USING ELECTRON BEAM

BACKGROUND OF THE INVENTION

1. Field of the Invention

The present invention relates generally to a substrate inspecting system and a substrate inspecting method and, more particularly, to a substrate inspecting system and a substrate inspecting method of inspecting physical/chemical characteristics of a substrate surface by use of electron beams.

2. Description of the Prior Art

As for a system for inspecting a defect in a semiconductor pattern by use of electron beams, Japanese Patent Application Laid-Open Publication No. 7-249393 discloses a method of obtaining an electron image indicating a state of the surface of the substrate, wherein an electron beam irradiating unit generates electron beams assuming a rectangular shape and irradiates the substrate defined as an inspection target with the electron beams as primary beams, secondary electrons, reflected electrons and backward scatter electrons (which will hereinafter be referred to as secondary electrons etc.) occurred from the substrate are guided and converged as secondary beams, and a mapping projection unit projects the secondary beams in enlargement on an electron detector, thereby obtaining the electron image thereof.

By irradiating the substrate with the primary beams, there might occur a local difference in terms of electric potential in surface regions on the substrate, depending on variations in configuration and material of the surface part of the substrate, i.e., the substrate surface or layers in the vicinity of the surface.

According to the method disclosed in the above Publication, the electron beams having a large area in section scan over the substrate, whereby a two-dimensional electron image of the substrate surface can be obtained. There arises a possibility from obtaining the above electron image, in which a physical characteristic and a chemical characteristic of the surface part of the substrate can be precisely quantitatively measured, and, if there exists a method of actualizing this in a tangible manner, it might be expected that a remarkable progress can be seen in an analysis of the physical/chemical characteristics of the substrate.

SUMMARY OF THE INVENTION

It is a primary object of the present invention to provide a substrate inspecting system and a substrate inspecting method which are capable of measuring precisely quantitatively physical/chemical characteristics of a substrate.

An energy which the secondary electrons etc., emitted from a substrate surface have, when traveling to a secondary optical system, depends upon an electric potential on the substrate surface. Therefore, a condition under which the secondary beams focus into an image on a detection surface, i.e., upon an MCP detector, varies depending on the energy of the secondary electrons etc., heading to the secondary optical system.

The inventors of the present patent application, with an emphasis put on this point, have discovered that there is established substantially a linear correlation between the image focusing condition of the secondary optical system and a surface potential distribution of the substrate. By utilizing this correlation, the inventors of the patent application have contrived a substrate inspecting system and a substrate inspecting method which are capable of quantitatively measuring electrical/physical characteristics of the substrate.

According to the first aspect of the present invention, there is provided;

A substrate inspecting system comprising: an electron beam irradiating device for irradiating a substrate defined as an inspection target with a primary electron beam, the irradiation of the primary electron beam causing secondary electrons and reflected electrons to generate from the substrate; an electron beam detection device for detecting an image and for outputting signals of the image, the detection device having a surface facing the substrate, the secondary electron beam being made of the secondary electrons and the reflected electrons generated from the substrate, and the image being formed by the secondary electron beam and indicating a state of surface part of the substrate; a projection device for projecting the secondary electrons and the reflected electrons as the secondary beam in enlargement on the surface of the electron beam detection device, the projection device including: an electron beam separator for separating the secondary electron beam from the primary beam, by deflecting the primary electron beam to travel to the substrate, and by allowing the secondary electron beam to travel in a direction of the electron beam detection device; and, a control device for controlling the projection device so as to have an image forming condition in accordance with a correlation between a state of the substrate and an energy of the secondary electrons and the reflected electrons, and for detecting a physical characteristic and/or a chemical characteristic of the substrate on the basis of the image signals obtained by the electron beam detection device, the energy of the secondary electrons and the reflected electrons being various depending on the state of the substrate, and the image forming condition is a condition for forming the secondary beam on the surface of the electron beam detection device.

According to the present invention, the secondary beams are controlled under such an image forming condition that the secondary beams, from a arbitrary region on the substrate, form an image in accordance with the correlation between a state of the substrate and an energy of secondary electrons and the reflection electrons because the energy varies depending on an electrical state of the substrate. Physical and/or chemical characteristics of the substrate are to be quantitatively measured based on the image signals obtained under this image forming condition. It is therefore feasible to inspect a defect in the physical and/or chemical characteristics of the substrate in the process of being manufactured in a non-contact manner. This makes it possible to promptly specify a manufacturing process with the defect.

According to the second aspect of the present invention, there is provided;

A substrate inspecting system comprising: an electron beam irradiating device for irradiating a substrate defined as an inspection target with a primary electron beam, the substrate being to be formed with an integrated circuit, the irradiation of the primary electron beam causing secondary electrons and reflected electrons to generate from the substrate; an electron beam detection device for detecting an image and for outputting signals of the image, the detection device having a surface facing the substrate, the secondary electron beam being made of the secondary electrons and the reflected electrons generated from the substrate, and the image being formed by the secondary electron beam and indicating a state of surface part of the substrate; a projection device for projecting the secondary electrons and the reflected electrons as the secondary beam in enlargement on the surface of the electron beam detection device, the projection device including: an electron beam separator for separating the secondary electron beam from the primary beam, by deflecting the primary electron beam to travel to the substrate, and by allowing the secondary electron beam to travel in a direction of the electron beam detection device; a storage device for storing design information of the integrated circuit; an image signal processing device for outputting numerical value data indicating an electrical state of the integrated circuit on the basis of signals of the image and the design information; an arithmetic device for calculating, based on the numerical value data, a threshold value serving as a criterion for judging whether or not the integrated circuit has an electrical defect; and, a control device for controlling the projection device so as to have an image forming condition in accordance with a correlation between a state of the substrate and an energy of the secondary electrons and the reflected electrons, and for detecting an electrical defect in the integrated circuit by comparing the numerical value data with the threshold value, the energy of the secondary electrons and the reflected electrons being varies depending on the electrical state of the integrated circuit, and the image forming condition is a condition for forming the secondary beam on the surface of the electron beam detection device.

The integrated circuit described above includes an insulator provided between wires (which will hereinafter be called an inter-wire insulator) in addition to the wires, and the inspection target may be either the wire within the integrated circuit or the inter-wire insulator.

According to the third aspect of the present invention, there is provided;

A substrate inspecting method comprising: a step of irradiating a substrate defined as an inspection target with a primary electron beam, the irradiating of the primary electron beam causing secondary electrons and reflected electrons to generate from the substrate; a step of deflecting the primary electron beam to travel to the substrate; a step of projecting the secondary electrons and the reflected electrons as a secondary beam in enlargement, the projecting step including a procedure for allowing the secondary electron beam to travel in a direction opposite side of the substrate; a step of detecting an image and for outputting signals of the image; the image being formed by the secondary electron beam and indicating a state of the substrate; a step of controlling the secondary electron beam under such a image forming condition that the secondary beam from an arbitrary region on the substrate forms an image in a position of detecting the secondary beam in accordance with a correlation between a state of the substrate and an energy of the secondary electrons and the reflected electrons; and, a step of detecting a physical characteristic and/or a chemical characteristic of the substrate on the basis of the image signals obtained under the image forming condition, the energy of the secondary electrons and the reflected electrons being various depending on the state of the substrate.

According to the fourth aspect of the present invention, there is provided;

A substrate inspecting method comprising: a step of irradiating a substrate formed with an integrated circuit defined as an inspection target with a primary electron beam, the irradiating of the primary electron beam causing secondary electrons and reflected electrons to generate from the substrate; a step of deflecting the primary electron beam to travel to the substrate; a step of projecting the secondary electrons and the reflected electrons as a secondary beam in enlargement, the projecting step including a procedure for allowing the secondary electron beam to travel in a direction opposite side of the substrate; a step of detecting an image and for outputting signals of the image, the image being formed by the secondary electron beam and indicating a state of the substrate; a step of controlling the secondary electron beam under such a image forming condition that the secondary beam from an arbitrary region on the substrate forms an image in a position of detecting the secondary beams in accordance with a correlation between a state of the substrate and an energy of the secondary electrons and the reflected electrons, the energy of the secondary electrons and the reflected electrons being various depending on the state of the substrate, a step of storing design information of the integrated circuit; a step of processing the image signals and outputting numerical value data which indicates an electrical state of the integrated circuit on the basis of the image signals and the design information thereof; a step of calculating, based on the numerical value data, a threshold value serving as a criterion for judging whether or not the integrated circuit is appropriately formed; and, a step of detecting an electrically defective portion in the integrated circuit by comparing the numerical value data with the threshold value.

The integrated circuit described above includes an inter-wire insulator in addition to the wires, and the inspection target may be either the wire within the integrated circuit or the inter-wire insulator.

BRIEF DESCRIPTION OF DRAWINGS

FIG. 19 is a block diagram schematically showing a principal construction of the host computer provided in a fifth embodiment of the substrate inspecting system of the present invention;

DESCRIPTION OF THE PREFERRED EMBODIMENTS

Figure 1:
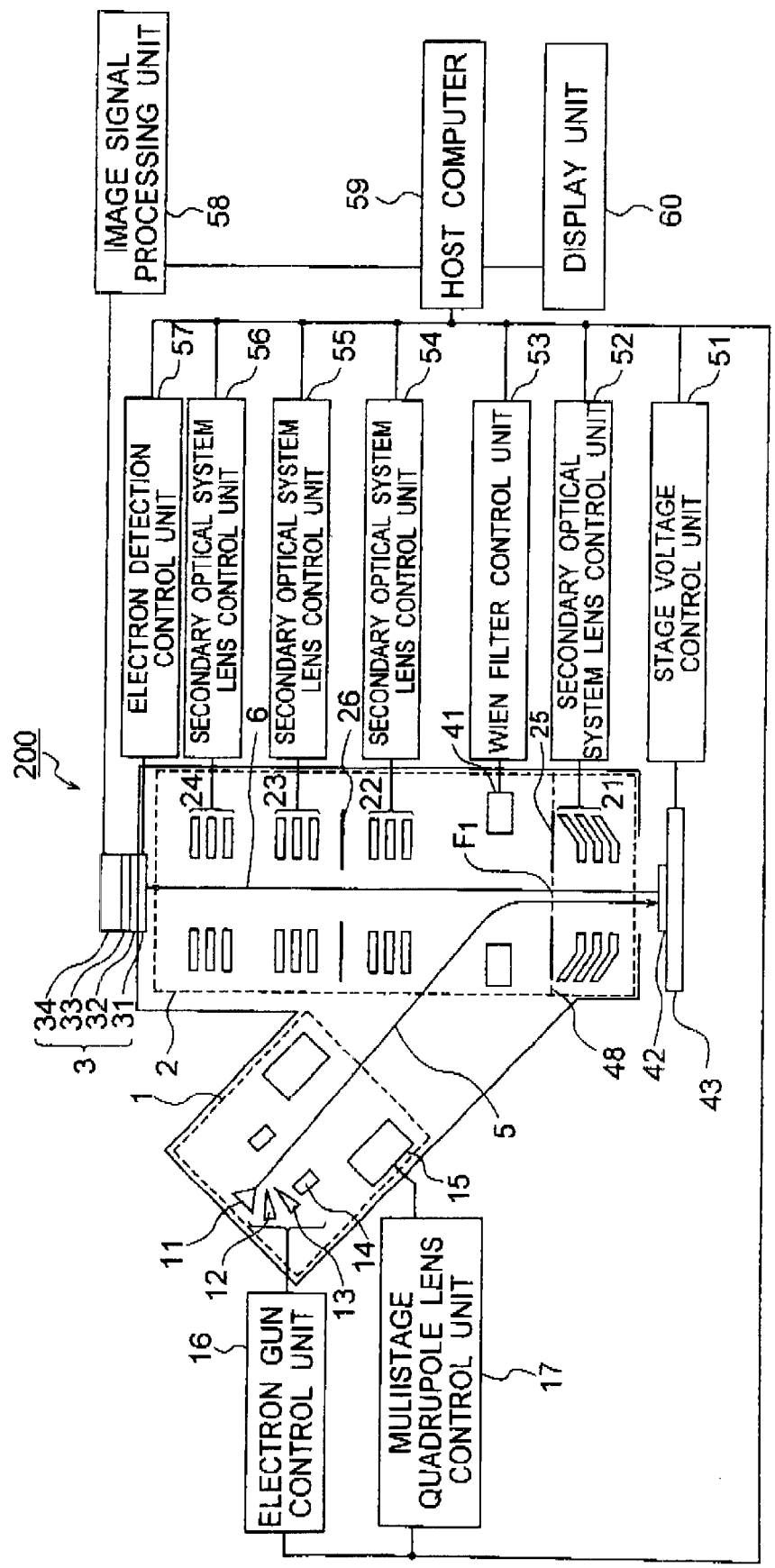
FIG. 1 is a block diagram schematically showing an architecture of a substrate inspecting system related to the present invention by way of one example thereof.

To start with, one example of a substrate inspecting system related to the present invention will hereinafter be described with reference to the accompanying drawings. Note that throughout the following drawings, the same components are marked with the same reference numerals, of which repetitive explanations are omitted.

A feature of the substrate inspecting system shown in this example is, in addition to the method disclosed in Japanese Patent Application No. 7-249393 described above, such a point that a Wien filter is used as one of electron beam separators. The Wien filter deflects a primary beam to travel in a direction substantially perpendicular to a substrate surface, and allows a secondary beam to travel through inside the same Wien filter in a direction of a beam detection device.

FIG. 1 is a block diagram schematically illustrating an architecture of the substrate inspecting system. A substrate inspecting system 200 shown in FIG. 1 includes a primary optical system 1, an electron gun control unit 16 for controlling this optical system 1, a multistage quadrupole lens control unit 17 for controlling the same system 1, a secondary optical system 2, secondary optical system lens control units 52 and 54 through 56 for controlling the secondary optical system 2, an electron detection unit 3, an electron detection control unit 57 for controlling the electron detection unit 3, a Wien filter 41, a Wien filter control unit 53 for controlling the Wien filter 41, a stage 43, a stage voltage control unit 51 for controlling the stage 43, an image signal processing unit 58, a host computer 59, and a display unit 60.

The primary optical system 1 has an electron gun 10 and a multistage quadrupole lens system. The electron gun 10 includes a lanthanum hexaboride ($LaB_6$) filamentary cathode 11 having a rectangular electron emitting surface with a major axis of 100–700 μm and a minor axis of 15 μm, a Wehnelt electrode (Wehnelt cylinder) 12 formed with a rectangular opening, an anode 13 for drawing the electron beam and irradiating it as a primary beam 5, and a beam-axis adjusting deflector 14. The electron gun control unit 16 controls an acceleration voltage and an outgoing current of the primary beam 5. Further, the quadrupole lens system has a multistage quadrupole lens 15 for converging the primary beams 5 under the control of the multistage quadrupole lens control unit 17.

The primary beams 5 emitted from the filamentary cathode 11 are so converged as to take substantially a rectangular sectional shape by the multistage quadrupole lens 15 and the control unit 17 thereof, and are obliquely incident upon the Wien filter 41. The filamentary cathode 11 has the rectangular electron emitting surface, and hence the electron beams take substantially the rectangle in sectional configuration, with the result that a region of the irradiation upon the substrate is enlarged enough to enhance an inspection efficiency. Incidentally, the inspection efficiency can be also enhanced if using the electron beams assuming, other than the rectangle, an elongate section having an aspect ratio of over 1 such as, for example, linear and elongate elliptical shapes. There may be, however, used the electron beams taking a variety of sectional configurations without being confined to the elongate shapes.

The primary beams 5 are deflected by the Wien filter 41 in a direction perpendicular to the surface of the substrate 42, and exit from the Wien filter 41. Thereafter, the primary beams 5 are reduced in size by a cathode lens 21 defined as a rotation symmetric electrostatic lens, and impinge upon the substrate 41 as substantially rectangular beams having a major axis on the order of several-hundreds μm and a minor axis on the order of 25 μm.

The stage 43 incorporates a mechanism horizontally movable to each beam axis of the secondary beams 6 exiting from the substrate 42 as well as of the primary beams 5 incident on the substrate 42, whereby the beams scan over the entire surface of the substrate 42 while moving the substrate 42 placed on an upper surface of the stage 43. Further, the stage 43 is contrived so that a stage voltage control unit 51 is capable of applying a negative voltage to the substrate 42. With this contrivance, the secondary electrons, etc. emitted from the substrate 42 are accelerated and made incident as the secondary beams 6 upon the secondary optical system 2. It is therefore feasible to decrease an aberration of the secondary beams 6. Further, a damage to the substrate 42 can be reduced by restraining an incident energy of the primary beams 5 upon the substrate 42.

Figure 2:
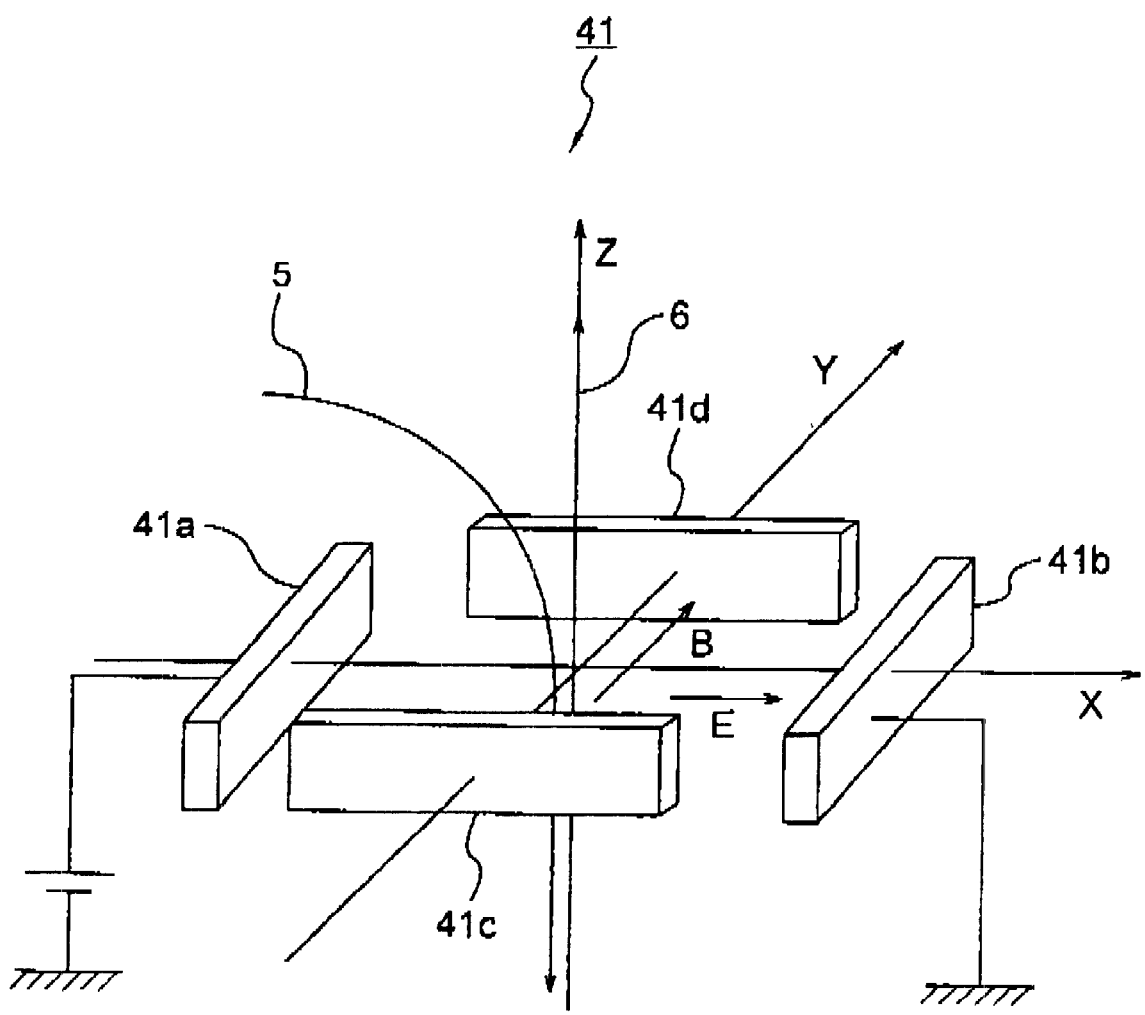
FIG. 2 is an explanatory view showing a basic construction of a Wien filter incorporated into the substrate inspecting system shown in FIG. 1.

FIG. 2 shows a basic construction of the Wien filter 41. As illustrated in FIG. 2, the Wien filter 41 includes two pieces of electrodes 41a, 41b disposed in a face-to-face relationship and controlled by the Wien filter control unit 43 (see FIG. 1), and two pieces of magnetic poles 41c, 41d. In a three-dimensional space XYZ shown in FIG. 2, supposing that the Z-axis is an optical axis of the mapping projection system, the Wien filter 41 takes such a structure that electric fields E and B are orthogonal to each other with the plane XY perpendicular to the Z-axis. This structure functions such that there travel straight only charged particles, satisfying a Wien condition of $qE=vB$ (where q is the particle charge, and v is the velocity of rectilinearly traveling charged particles), among the incident charged particles.

Figure 3A:
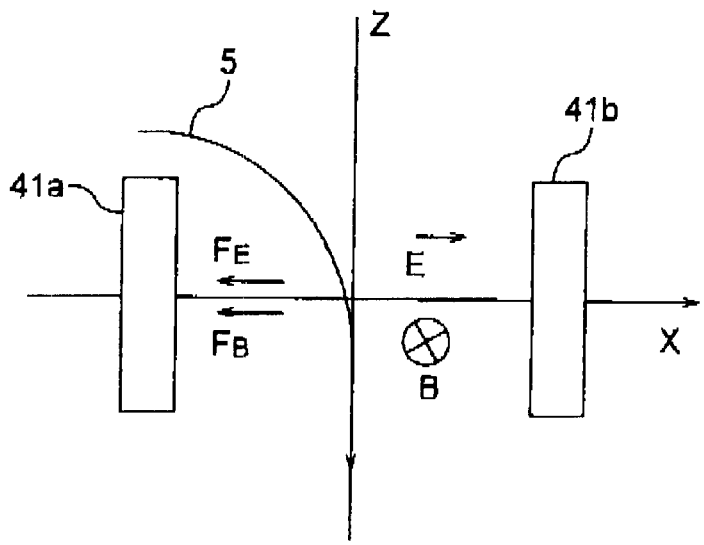
FIGS. 3A and 3B are explanatory views each showing a trajectory of electron beams passing through the Wien filter shown in FIG. 2.
Figure 3B:
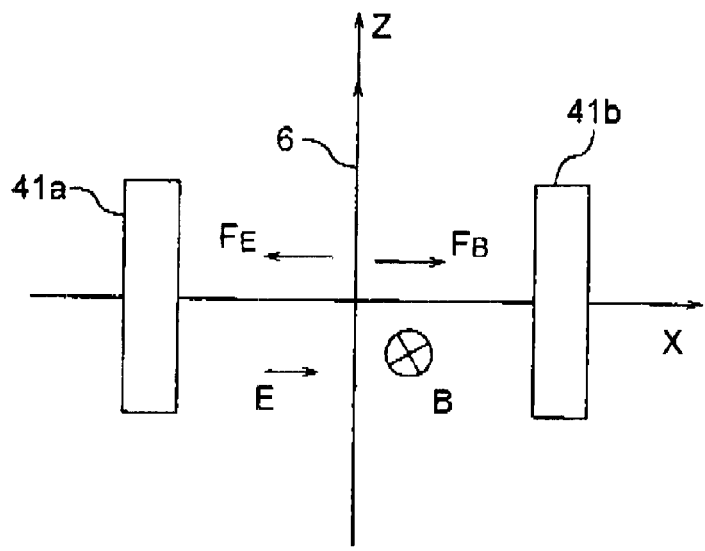

FIGS, 3A and 3B are explanatory views each showing a trajectory of the electron beam passing through the Wien filter 41, as well as being sectional views out by the plane XZ (Y=0) in FIG. 2. As shown in FIG. 3A, according to the substrate inspecting system 200, a force $F_B$ based on the magnetic field and a force $F_E$ based on an electric field act on the primary beams 5 in the same direction, which are incident upon the Wien filter 41. The primary beams 5 are thereby deflected to strike vertically on the surface of the substrate 42. On the other hand, as shown in FIG. 3B, the force $F_B$ based on the magnetic field and the force $F_E$ based on an electric field act on the secondary beams 6 in the opposite direction, and besides a Wien condition of $F_B=F_E$ is established. Hence, the secondary beams 6 travel straight without being deflected and are incident on the secondary optical system 2.

Figure 4:
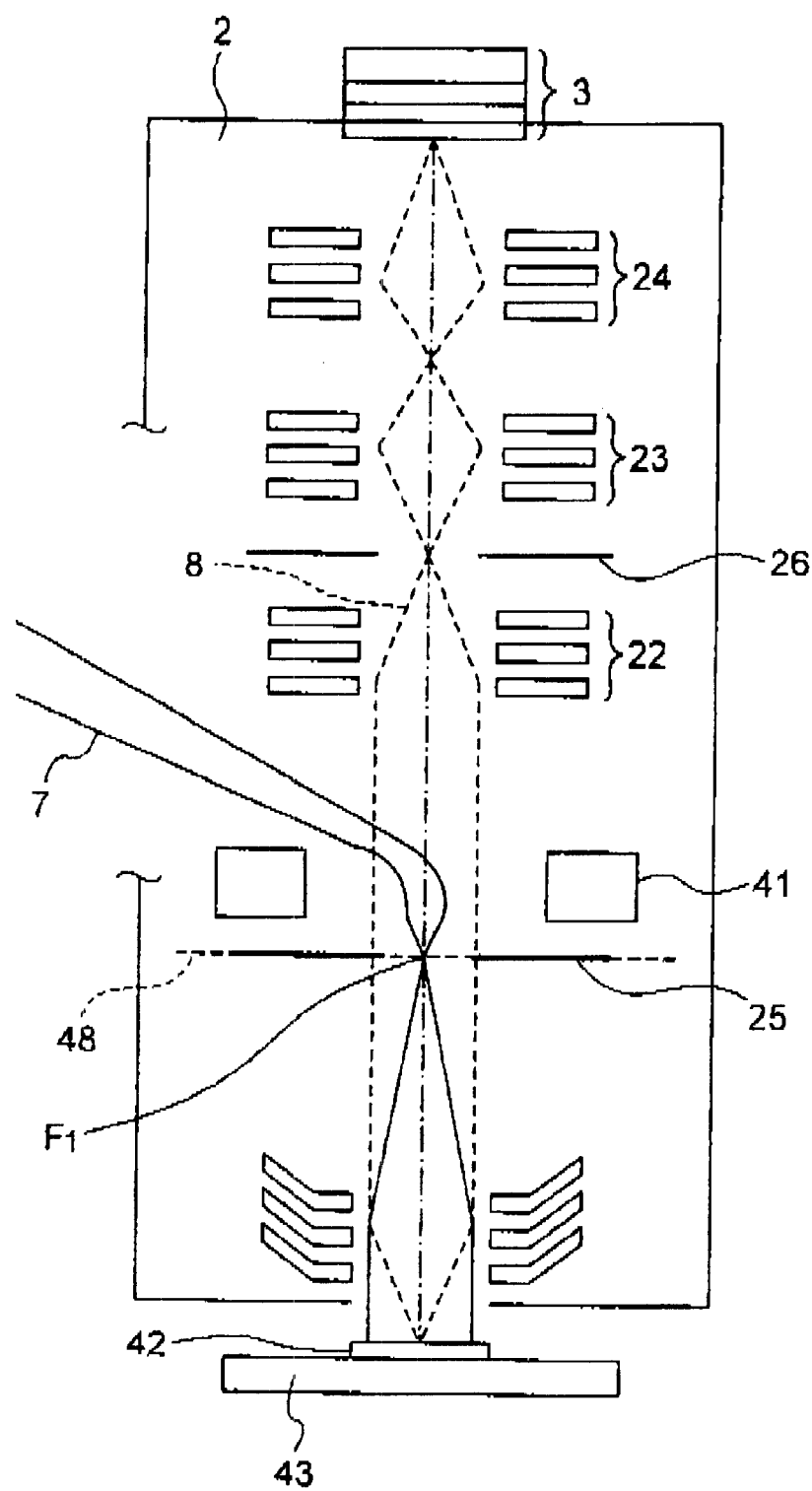
FIG. 4 is an explanatory view showing a trajectory of the electron beams in the substrate inspecting system shown in FIG. 1.

Referring back to FIG. 1, the secondary optical system 2 includes a cathode lens 21 classified as a rotation symmetric electrostatic lens, a second lens 22, a third lens 23, a fourth lens 24 and a field stop 26 disposed between the second lens 22 and the third lens 23. The cathode lens 21, the second lens 22, the third lens 23 and the fourth lens 24 are controlled respectively by secondary optical system lens control units 52, 54, 55, 56. The secondary optical system 2 further includes an aperture angle stop 25, of which an imaginary line extends through a focal point F1 between the Wien filter 41 and the cathode lens 21, disposed within a focal plane 48 defined as a plane perpendicular to the beam axis. The reason why the aperture angle stop 25 is thus disposed in the position of the focal plane 48, is that if trying to focus the secondary beams 6 into an image only through the cathode lens 21, a lens function becomes intensive enough to easily cause the aberration. Therefore, as shown in the explanatory view of the beam trajectory in FIG. 4, there is configured a double telecentric system combined with the second lens 22, i.e., an optical system of which both of an entrance pupil and an exit pupil exist at the infinity, and one single image formation is carried out. Further, the aperture angle stop 25 is disposed within the focal plane 48 of this image focusing optical system, whereby the aberration of the secondary beams 6 (a beam trajectory 8) can be reduced.

The electron detection unit 3 has an MCP (Micro-Channel Plate) detector 31, a fluorescent plate 32, a light guide 33 and an imaging element 34 including a CCD (Charge Coupled Device), etc. The secondary beams 6 incident on the MCP detector 31 via the secondary optical system 2 are amplified by the MCP detector 31, and impinge on the fluorescent plate 32. A fluorescent image formed therein is detected as image signals by the imaging element 34 via the light guide 33.

These image signals are supplied to an image processing unit 58, wherein the image signals are subjected to a variety of image processing. Then, the image signals are supplied as image data to a host computer 59. The host computer 59 displays on a display unit 60 these pieces of image data as an electron image defined as an image formed by the secondary electrons emitted from the surface of the substrate 42 and representing a state of the substrate 42.

Next, a relationship between the irradiation of the electron beams and a surface potential distribution of the substrate, will be explained.

When irradiating the substrate with the electron beams, a local difference in electric potential on the surface of the substrate, depending on variation in configuration and material of the substrate and also in structure of an electric circuit based thereon. This point will be explained more specifically with reference to the drawings.

Figure 5:
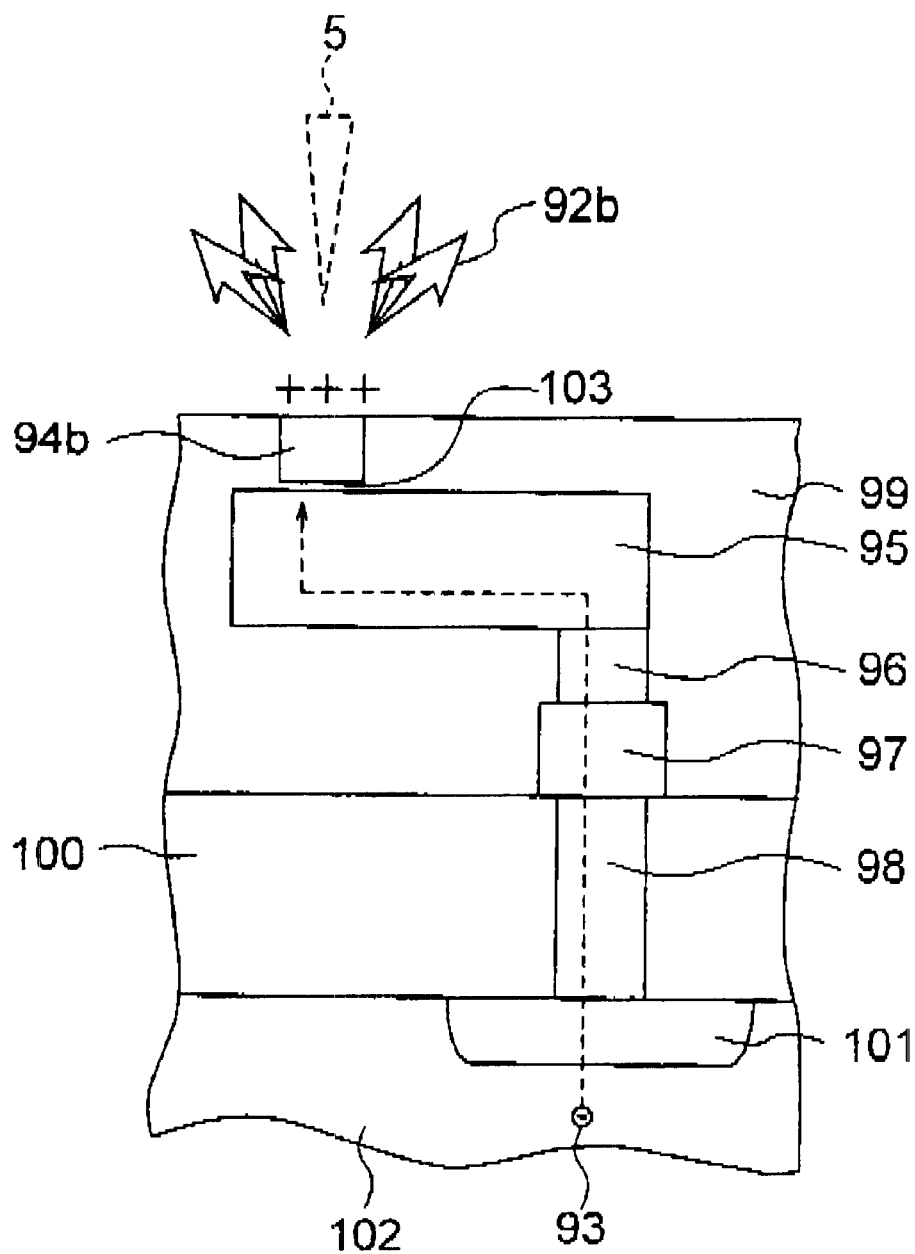
FIG. 5 is an explanatory fragmentary sectional view schematically showing the substrate for an assistance of explaining a substrate inspecting method of the present invention.
Figure 6:
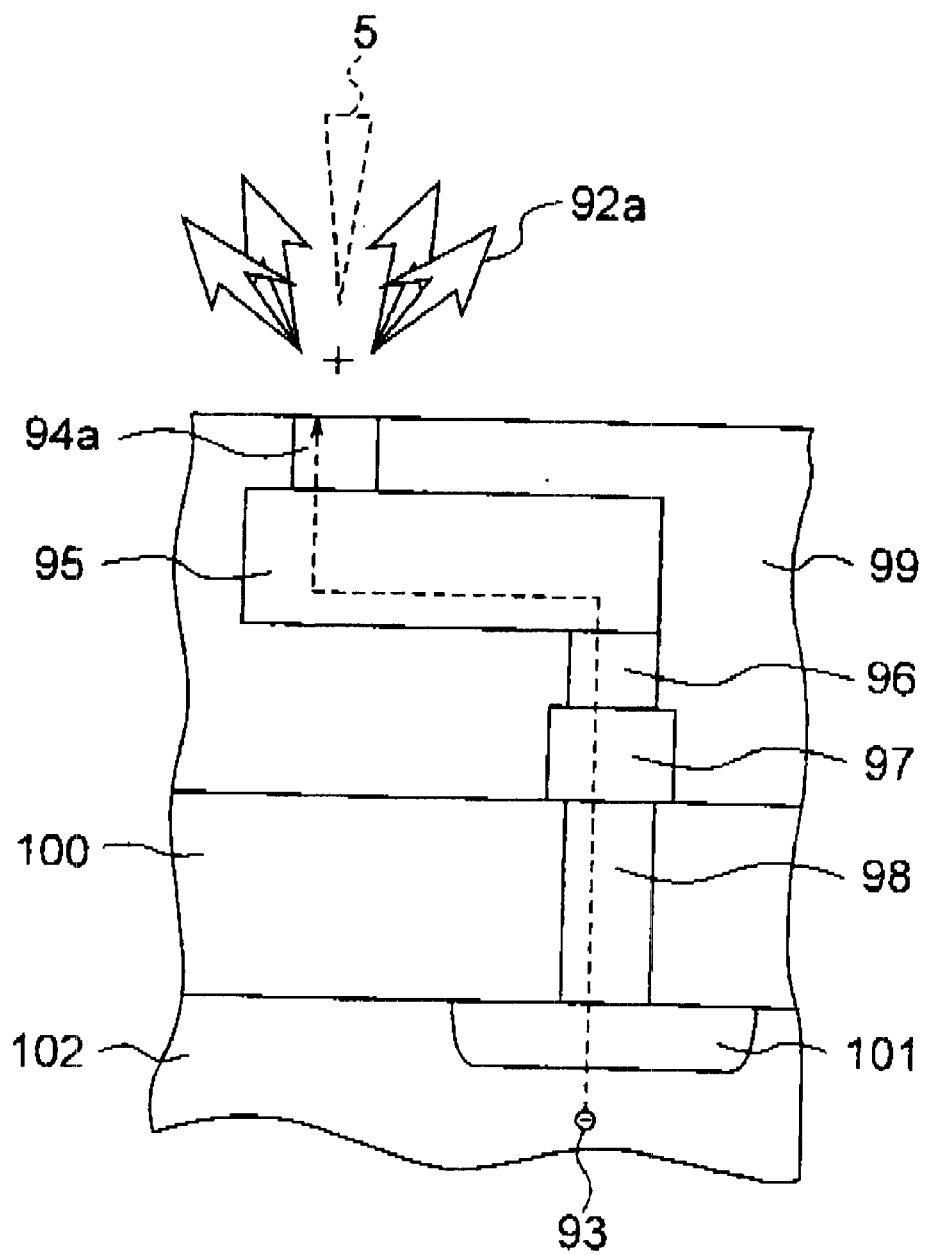
FIG. 6 is an explanatory fragmentary sectional view schematically showing the substrate for the assistance of explaining the substrate inspecting method of the present invention.

FIGS. 5 and 6 are fragmentary sectional views schematically showing a defective area and a normal area of a substrate 102. As illustrated in FIGS. 5 and 6, a semiconductor circuit device having a multi-layer wire extending over a BPSG layer 100 and a $SiO_2$ layer 99, is provided on the semiconductor substrate 102. In the normal area shown in FIG. 6, a via-plug 94a 102 is electrically connected to an impurity diffused layer 101 on the substrate surface via a metal wire 95, a via-plug 96, a metal wire 97 and an electrode contact 98. While on the other hand, in the defective area shown in FIG. 5, an open defective portion 103 exists between a via-plug 94b and a metal wire 95, and hence the via-plug 94b does not become electrically conductive to an impurity diffused layer 101.

When the surface of the via-plug 94a is irradiated with the primary beams 5, a positive charge occurs on the surface of the via-plug 94a, however, the via-plug 94a is electrically normally conductive to the multi-layer wire extending to the impurity diffused layer 101, and therefore electrons 93 are supplied to the surface of the via-plug 94a from the substrate 102, thereby neutralizing the positive charge. By contrast, when the surface of the via-plug 94b shown in FIG. 5 is irradiated with the primary beams 5, the electrons 93 are not supplied from the substrate 102, so that the positive charge occurred on the surface of the via-plug 94a is not neutralized and the surface potential changes relatively toward a positive pole. Thus, there occurs a difference between the surface potentials of the via-plugs 94a, 94b irradiated with the electron beams, depending on whether or not there is the electric conduction between the via-plug 94 and the impurity diffused layer 101.

The potential difference on the substrate surface appears as a difference in terms of an energy quantity when the secondary electrons etc., generated on the substrate surface impinge on the secondary optical system. Therefore, an image focusing condition of the secondary optical system under which the secondary beams generated from the areas having the different surface potentials and incident on the secondary optical system focus into the image, becomes different per region on the substrate surface.

Accordingly, if a correlation between the image focusing condition of the secondary optical system and the surface potential of the substrate is previously obvious, a change in the surface potential of the substrate can be quantitatively measured by controlling the secondary optical system so that the secondary beams focus into the image on the MCP detector.

Figure 7:
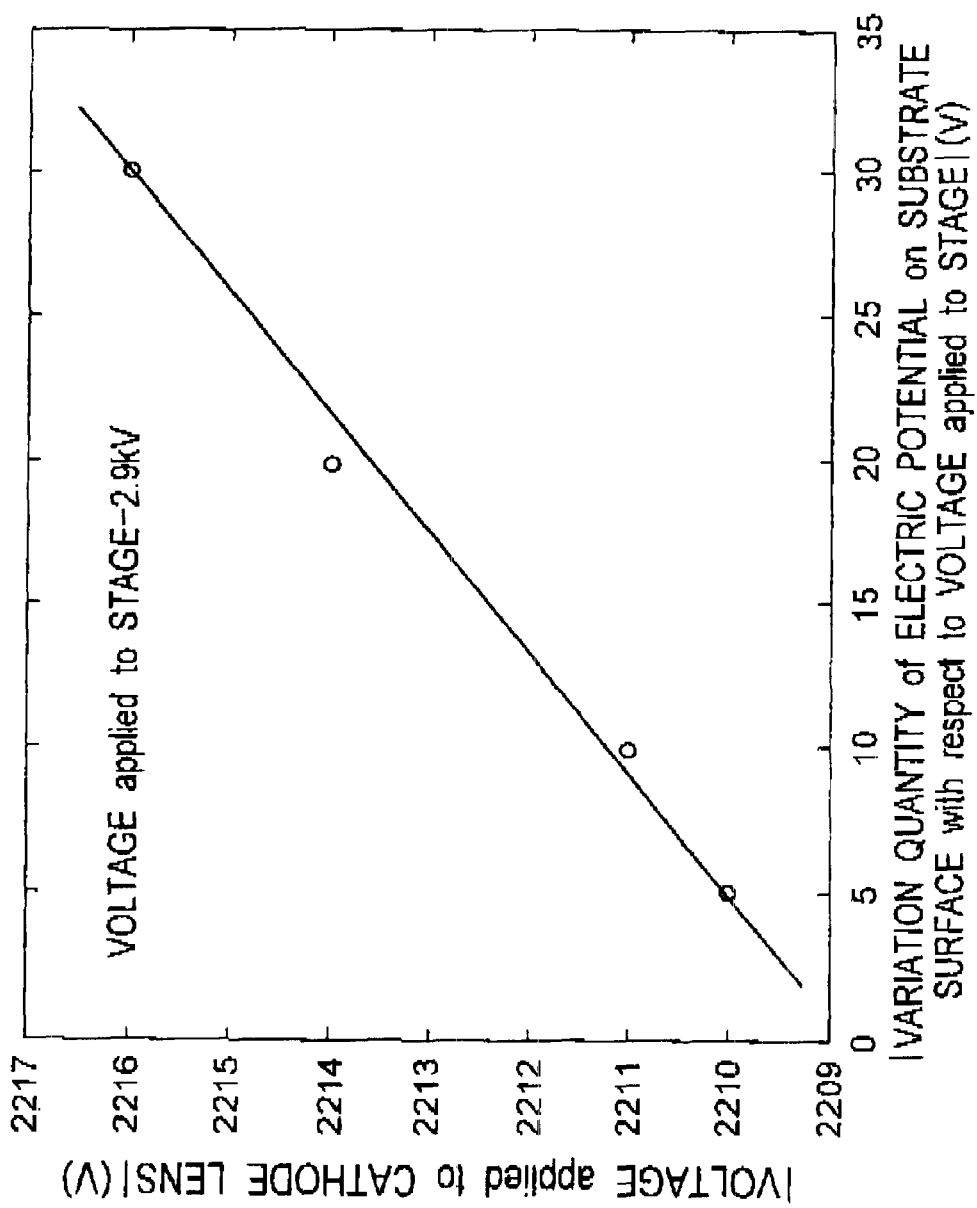
FIG. 7 is a characteristic graph showing a correlation between a voltage V (absolute value) applied to a cathode lens and a variation quantity (absolute value) of an electric potential on the substrate surface with respect to a voltage applied to a stage.

FIG. 7 shows one example of the correlation between the image focusing condition of the secondary optical system and the surface potential of the substrate, which was discovered by the inventors of the present patent application. FIG. 7 shows a correlation between a voltage V (absolute value) applied to the cathode lens 21 (see FIG. 1) defined as one of the mapping projection elements of the secondary optical system and a change quantity (absolute value) of the surface potential of the substrate with respect to the stage applied voltage. FIG. 7 shows, when applying a voltage of −2.9 kV to the stage 43 (see FIG. 1), the relation (calculated values) between the change quantity of the surface potential of the substrate on the basis of this stage-applied voltage and the voltage applied to the cathode lens 21 for causing the secondary electrons etc as the secondary beams 6 emitted from the substrate surface to focus the image on the MCP detector 31 (see FIG. 1).

When controlling the cathode lens 21 so that the secondary beams 6 emitted from the different areas on the substrate surface focus into respective images on the MCP detector 31 by utilizing substantially the linear correlation described above, the potential difference between the different areas on the surface of the substrate 42 can be quantitatively measured from the respective voltage applied to the cathode lens 21 in the case of properly focusing into the images. Incidentally, FIG. 7 shows the example of controlling the voltage applied to the cathode lens 21, however, without being limited to this control mode, the difference between the surface potentials of the substrate can be measured by controlling other constructive elements of the secondary optical system such as, e.g., the second lens 22, the third lens 23 and the fourth lens 24 or the Wien filter 41. This point is the same in each of embodiments of the present invention which will hereinafter be discussed later.

Some embodiments of the present invention will be described with reference to the drawings.

To begin with, a first embodiment of the substrate inspecting system of the present invention will be explained referring to the drawings. A feature of the first embodiment is, as illustrated in FIG. 8, that the substrate inspecting system includes an image formation judging unit 62 for judging whether or not the images of the secondary beams 6 are properly formed on the electron detection unit 3, and a substrate surface potential calculating unit 63 for calculating potentials of measuring areas based on a formula of relation between the image focusing condition and the surface potential.

Figure 8:
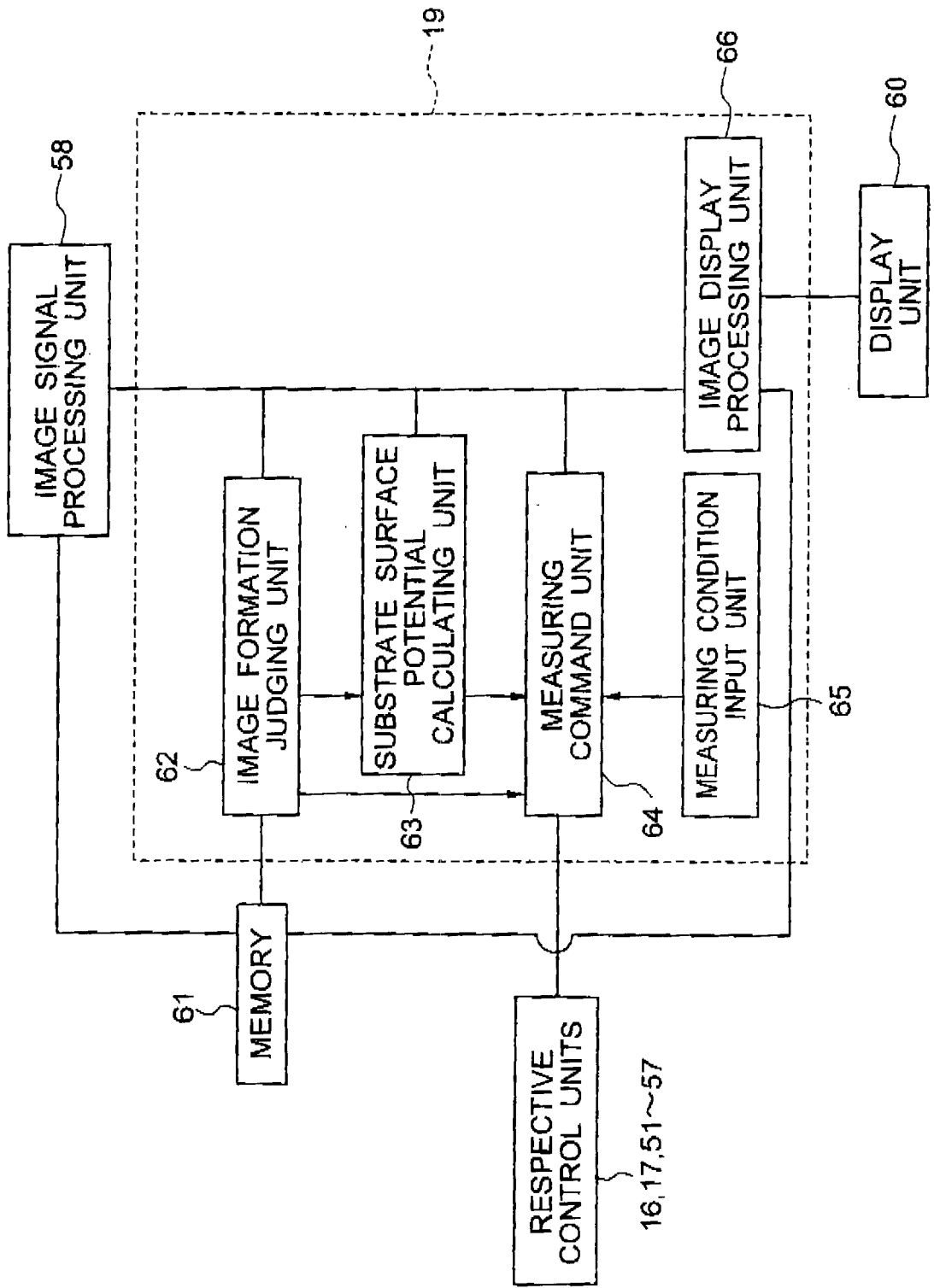
FIG. 8 is a block diagram schematically showing a principal construction of a host computer provided in a first embodiment of the substrate inspecting system of the present invention.

FIG. 8 is a block diagram schematically illustrating a principal architecture of a host computer 19 defined as a control device incorporated into the substrate inspecting system 20 in the first embodiment. Other constructions of the substrate inspecting system 20 are substantially the same as the substrate inspecting system 200 shown in FIG. 1.

As shown in FIG. 8, the host computer 19 includes a measuring condition input unit 65 for inputting items of measuring conditions, a measurement command unit 64 for supplying control signals to the respective control units until the measurement is finished since an input of the measuring condition has been received, and an image formation judging unit 62 for judging whether or not the secondary beams 6 properly focus into the images by receiving the supply of the control signals from the image signal processing unit 58. The host computer 19 further includes a memory 61 for storing the image signals, and an image display processing unit 66 for reading the image signals from the memory 61, then processing these signals to covert them into signals displayable on the display unit 60, and displaying electron images on the display unit 60.

An operation of the substrate inspecting system in the first embodiment will be discussed referring to the drawings by way of a first embodiment of the substrate inspecting method according to the present invention.

At the first onset, the measuring conditions are inputted from the measuring condition input unit 65. The measuring conditions may be positional information on the measuring spots in the surface area of the substrate, the voltage applied to the stage 43, an electron beam emission current value, and an electron beam acceleration voltage value.

The measurement command unit 64 having received an input of the measuring conditions generates a control signal to move the state 43 and to irradiate the measuring spots with the electron beams until the measurement is finished. Image signals about the respective measuring spots, which are detected by the electron detection unit 3 and supplied to the image signal processing unit 58, are subjected to predetermined signal processing and supplied to the image formation judging unit 62. The image formation judging unit 62 judges based on the image signals whether or not the images of the secondary beams are adequately formed on the electron detection unit 3. The image formation judging unit 62, when judging that the electron images are not properly formed, sends a result of the judgment to the measurement command unit 64, and the measurement command unit 64 transmits the control signals to the individual control units after changing the setting of image focusing conditions, and the electron images are obtained by re-irradiating the measuring spots with the electron beams. The image formation judging unit 62, if judging that the electron images are properly formed, sends a result of the judgment to the measurement command unit 64, and stores the memory 61 with the image signals thereof. The measurement command unit 64 receiving the result of this judgment and supplies the substrate surface potential calculating unit 63 with the image focusing conditions at that time. Then, the measurement command unit 64 moves the state 43 to a next measuring spot through a stage voltage control unit 51 and irradiates this spot with the electron beams. The substrate surface potential calculating unit 63, based on the relational formula between the image focusing condition and the surface potential, calculates an electric potential of the measuring spot from the image focusing condition supplied to the unit 63 itself, and makes the memory 61 stored with this potential this potential.

Upon an end of the measurements of all the measuring spots, the measurement command unit 64 outputs an end-of-measurement signal to finish the supply of the control signals to the respective control units 16, 17, 51–57. The image display processing unit 66 receives the end-of-measurement signal, then reads the calculated potentials of all the measuring spots on the substrate surface from the memory 61, and displays the surface potentials on the display unit 60.

Note that the electric potentials of all the measuring spots on the substrate surface are displayed after finishing the measurements of all the spots in this embodiment, however, without being confined to this mode, the substrate surface potentials calculated by the substrate surface potential calculating unit 63 may also be, as a matter of course, sequentially displayed per measuring spot on the display unit 60. In this mode, when an abnormal surface potential is displayed, it is feasible to confirm a configuration and an electrical characteristic of that spot by obtaining the electron image thereof. This is the same in each of the following embodiments.

Figure 9:
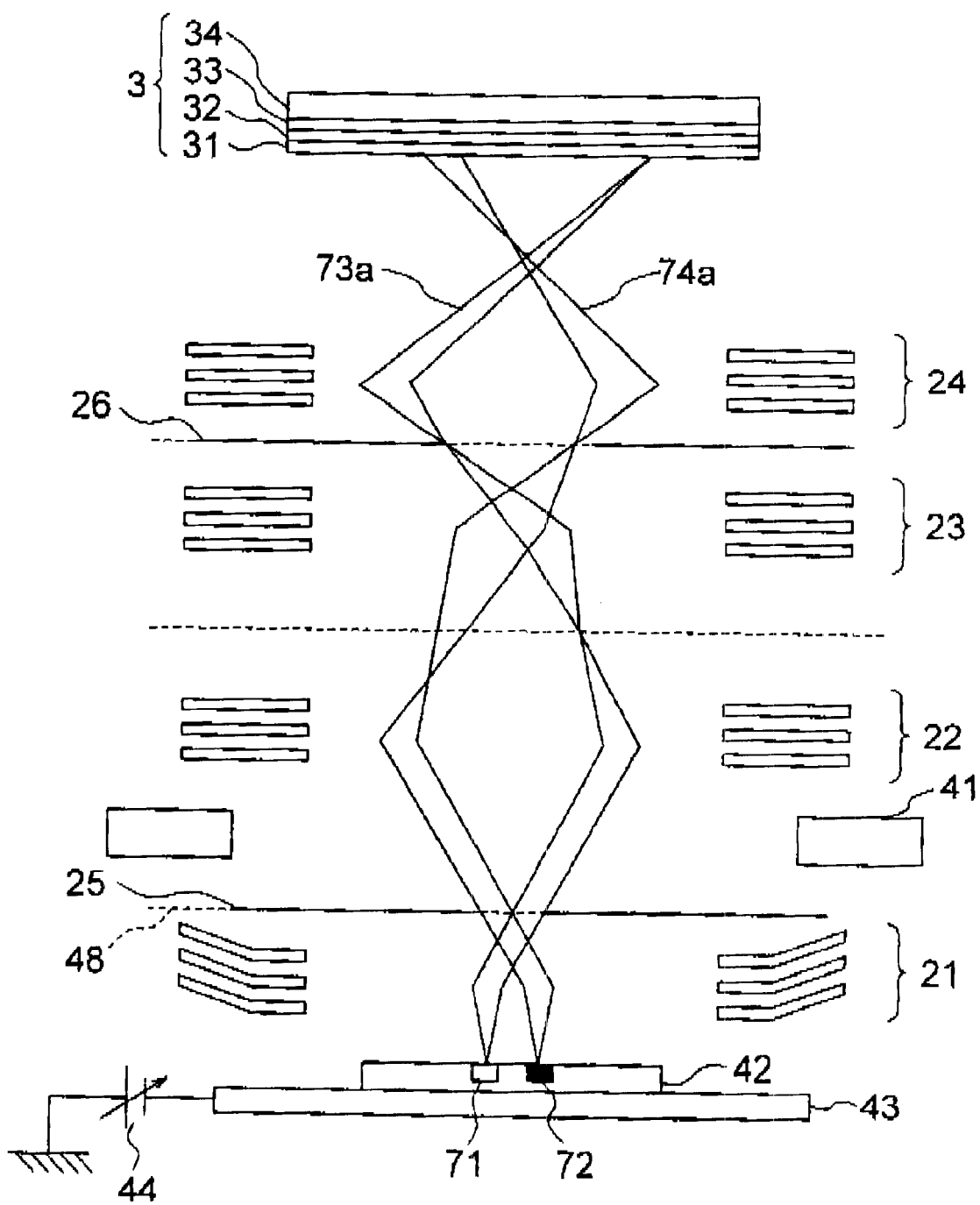
FIG. 9 is an explanatory schematic view showing a first embodiment of the substrate inspecting method of the present invention.
Figure 10:
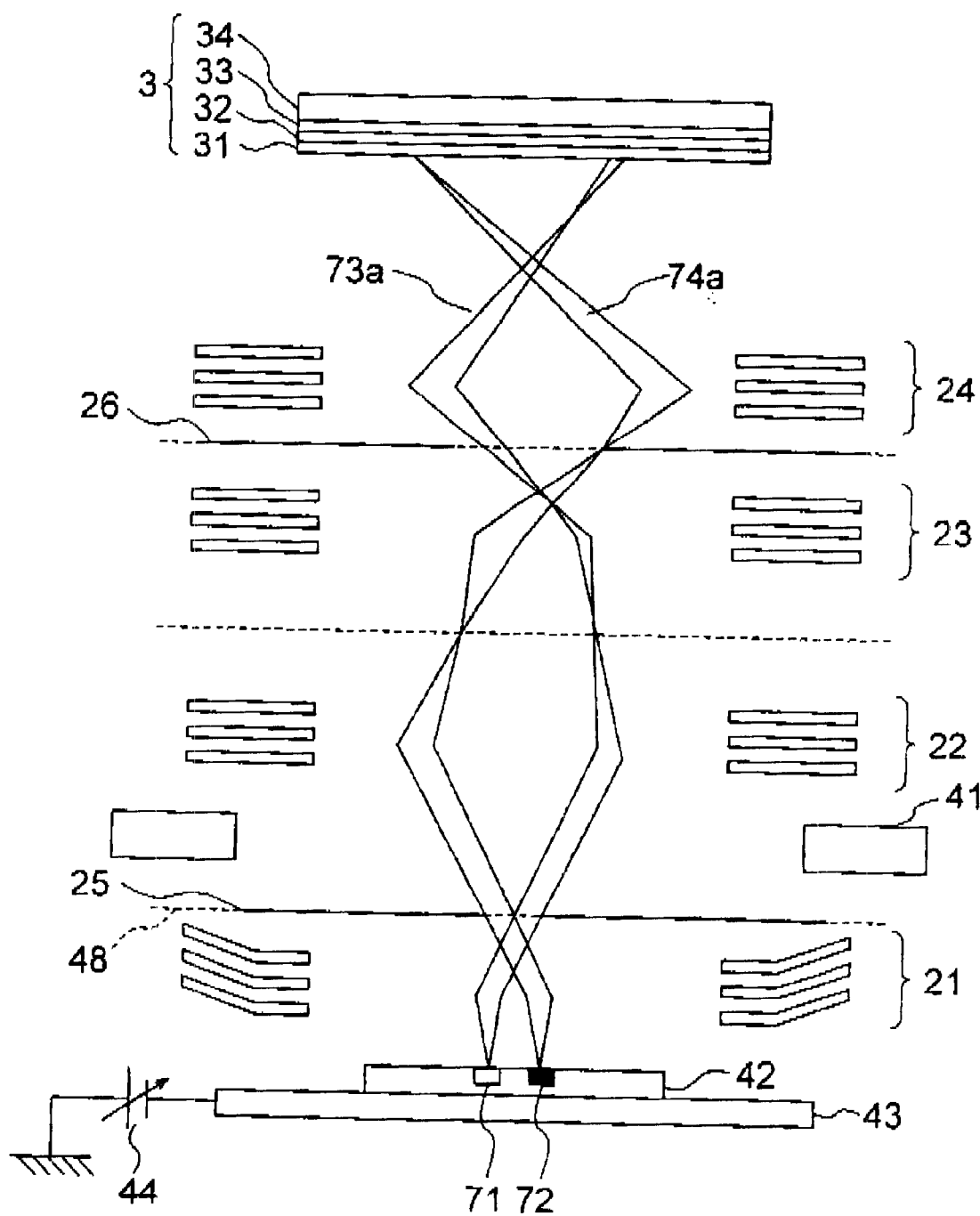
FIG. 10 is an explanatory schematic view showing the first embodiment of the substrate inspecting method of the present invention.

The operation of the substrate inspecting system 20 will be explained in greater details with reference to schematic views in FIGS. 9 and 10. Referring to FIGS. 9 and 10, regions 71, 72 on the substrate 42 are part of the measuring spots. A beam trajectory 73a is a trajectory of secondary beams AA consisting of the secondary electrons etc. emitted from the region 71, and a beam trajectory 74a is a trajectory of secondary beams BB consisting of the secondary electrons etc. emitted from the region 72. As described above the incident energies of the secondary beams AA and of the secondary beams BB upon the secondary optical system depend on the surface potentials of the regions 71, 72, and hence the image focusing condition for causing the secondary beams AA, BB to focus into the image.

Such being the case, with respect to at first the region 71, the measurement command unit 64 receives the result of the judgment of the image formation judging unit 62 and adjusts the voltage applied to the secondary optical system 2, thereby the secondary beams AA properly focus into the image on the MCP detector 31 as illustrated in FIG. 9. Next, similarly with respect to the region 72, the measurement command unit 64 adjusts the voltage applied to the secondary optical system 2, thereby the secondary beams BB focuses into the image. As a result, the surface potential difference between the region 71 and the region 72 can be quantitatively measured based on the correlation (see FIG. 7) between the voltage applied (the image focusing condition) to the secondary optical system and the surface potential of the substrate.

Thus, according to the substrate inspecting method in the first embodiment, the secondary beams are controlled so that the secondary beams emitted from the desired region on the substrate focus into the image based on the image focusing condition of the secondary beams, and therefore the surface potential at the desired region can be quantitatively measured.

The embodiment discussed above has dealt with the mode of detecting the surface potential difference between the regions 71, 72 different from each other, however, without being restricted to this mode, the surface potential of only, e.g., the region 71 or 72 may be calculated based on the correlation between the image focusing condition of the secondary optical system and the surface potential of the substrate.

Next, a second embodiment of the substrate inspecting system according to the present invention will be discussed with reference to the drawings. A feature of the second embodiment is to obtain an electron image of an arbitrary potential region on the substrate surface and positional information thereof by controlling the secondary optical system so that the secondary beams from only the region having an arbitrary potential focus into the image.

Figure 11:
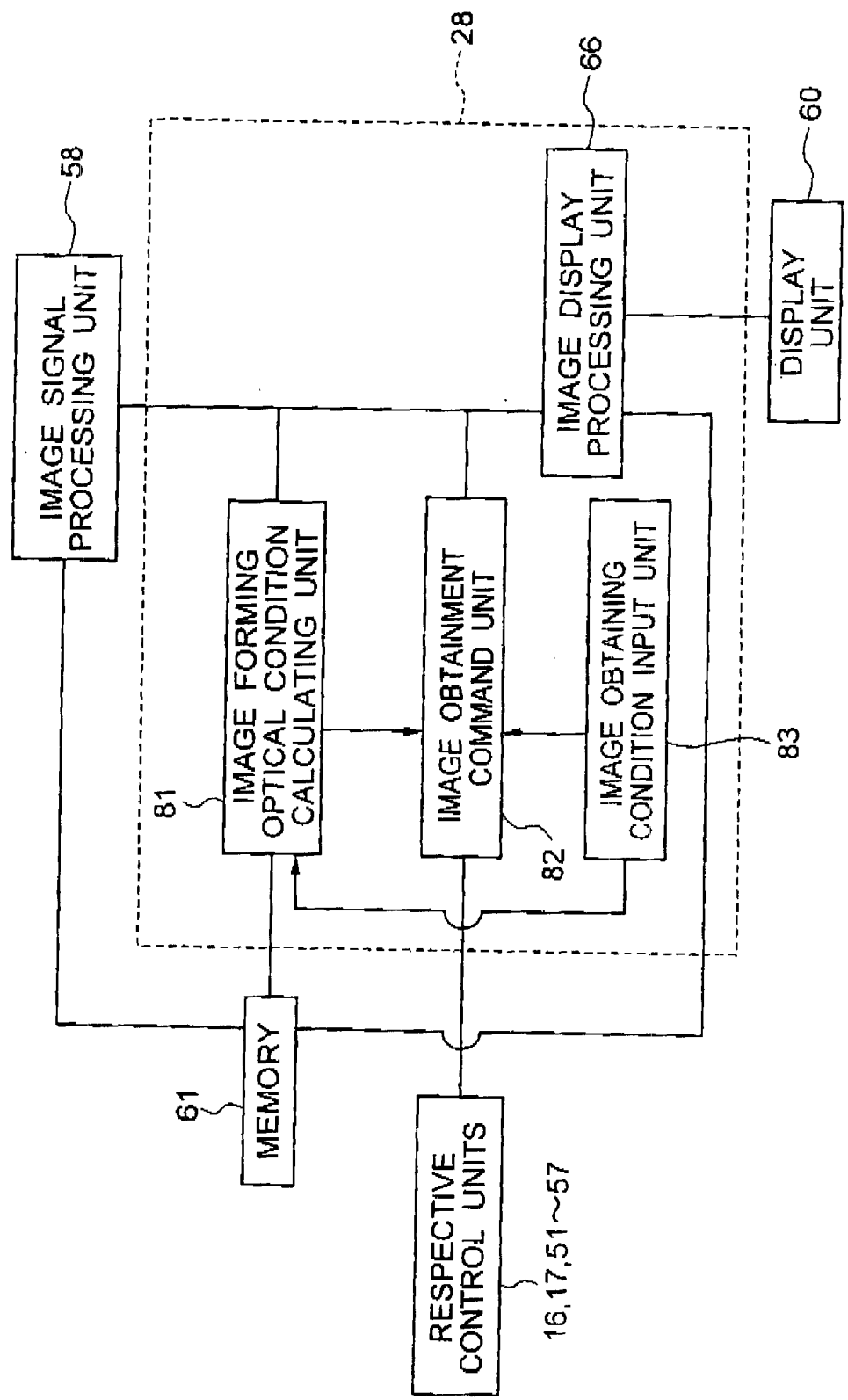
FIG. 11 is a block diagram schematically showing a principal construction of the host computer provided in a second embodiment of the substrate inspecting system of the present invention.

FIG. 11 is a block diagram schematically illustrating a principal architecture of a host computer 28 incorporated into a substrate inspecting system 30 in the second embodiment. Other constructions of the substrate inspecting system 30 are substantially the same as the substrate inspecting system 200 shown in FIG. 1.

The host computer 28 includes an image obtaining condition input unit 83 for inputting an image obtaining condition input unit 83 for inputting an image obtaining condition, an image focusing optical condition calculating unit 81 for calculation an image focusing optical condition of the secondary optical system, which corresponds to the image obtaining condition inputted, and an image obtainment command unit 82 for supply the image focusing optical condition calculation unit 81 with the inputted image obtaining condition and transmitting control signals to the respective control units 16, 17 and 51 through 57 on the basis of a result of the calculation by the image focusing optical condition calculation unit 81.

An operation of the substrate inspecting system 30 will be described by way of a second embodiment of the substrate inspecting method of the present invention.

To begin with, the image obtaining condition input unit 83 inputs a predetermined image obtaining condition. The image obtaining condition contains information on a surface voltage value of the substrate so that an image of the spot, exhibiting a desired potential, of the surface area of the substrate, can be obtained.

The image obtainment command unit 82 supplies the image focusing optical condition calculating unit 81 with the information on the surface voltage value of the substrate in the inputted image obtaining condition. The image focusing optical condition calculating unit 81, based on the correlation (see FIG. 7) between the image focusing condition given above and the surface potential of the substrate, calculates the image focusing condition of the secondary optical system, which corresponds to the inputted surface voltage value, and notifies the image obtainment command unit 82 of a result of this calculation. The image obtainment command unit 82, upon receiving the calculated result, transmits the control signals to the individual control units 16, 17 and 51 through 57 to perform the irradiation of the electron beams while moving the stage 43, and makes the electron detection unit 3 detect the secondary beams and output the image signals. The detected image signals are processed through predetermined signal processing by the image signal processing unit 58 and stored in the memory 61. The image signals are then transmitted via an image display processing unit 66 and displayed as an electron image on the display unit 60.

Thus, the substrate inspecting system 30 in the second embodiment is capable of obtaining the electron image of the spot, exhibiting the desired potential, of the surface area of the substrate, and is therefore, if there arise a problem about magnitudes of a resistance value of a contact portion between wires or between the wire and the impurity diffused layer and of an internal resistance value of the multi-layer wire, capable of detecting the positional information of the spot having the electric potential corresponding thereto and also a configuration thereof.

Next, a third embodiment of the substrate inspecting system according to the present invention will be explained with reference to the drawings. A substrate inspecting system 40 in the third embodiment has such a characteristic point as to include a two-dimensional potential distribution chart creating unit 67 for obtaining two-dimensional potential distribution information about the substrate surface.

Figure 12:
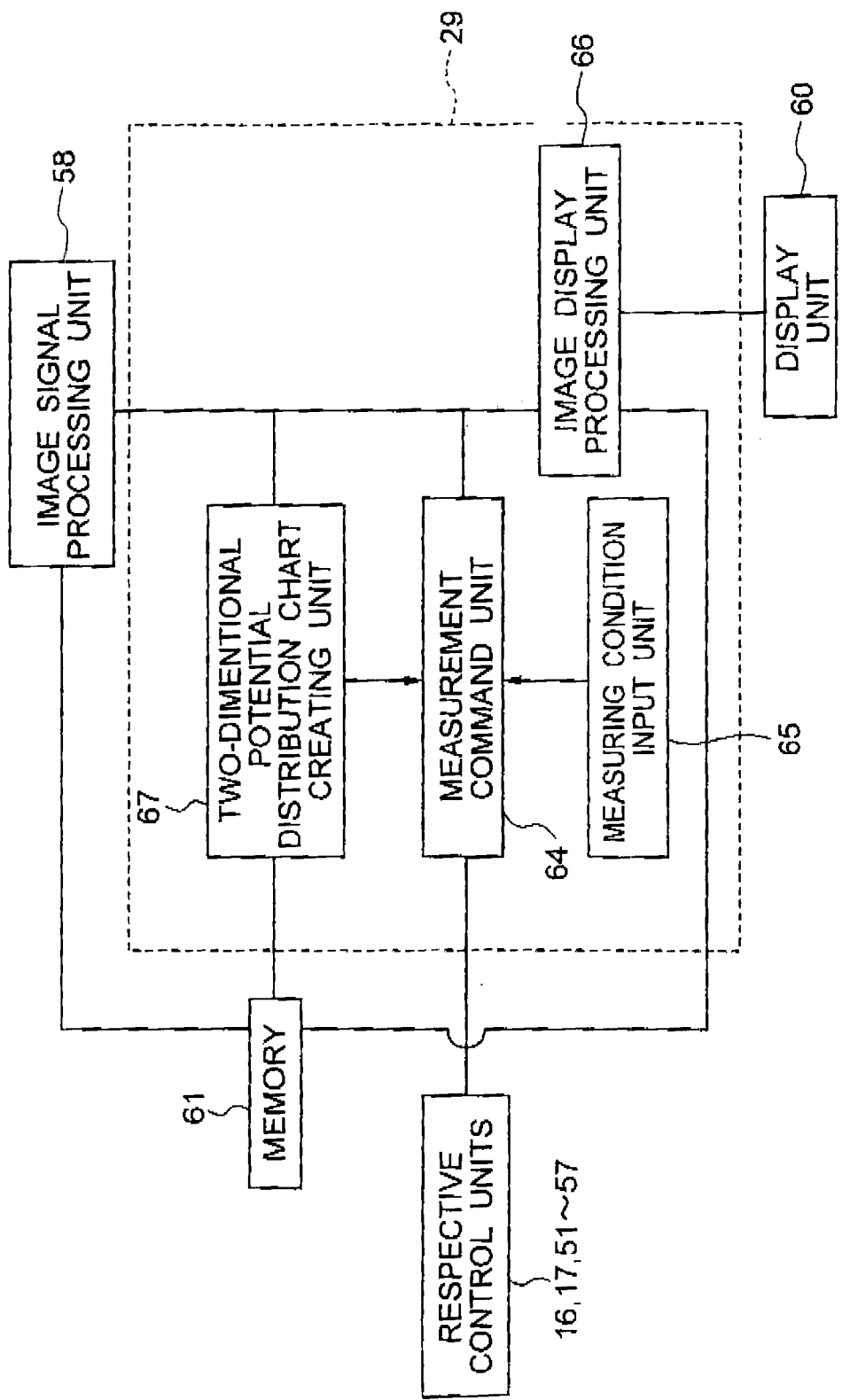
FIG. 12 is a block diagram schematically showing a principal construction of the host computer provided in a third embodiment of the substrate inspecting system of the present invention.

FIG. 12 is a block diagram schematically illustrating a principal architecture of a host computer 29 incorporated into a substrate inspecting system 40 in the third embodiment. Other constructions of the substrate inspecting system 40 are substantially the same as the substrate inspecting system 200 shown in FIG. 1.

The host computer 29 includes the two-dimensional potential distribution chart creating unit 67 characteristic of the third embodiment in addition to the measuring condition input unit 65, the measurement command unit 64 and the image display processing unit 66.

An operation of the substrate inspecting system 40 will be explained referring to the drawings by way of a third embodiment of the substrate inspecting method of the present invention.

Figure 13:
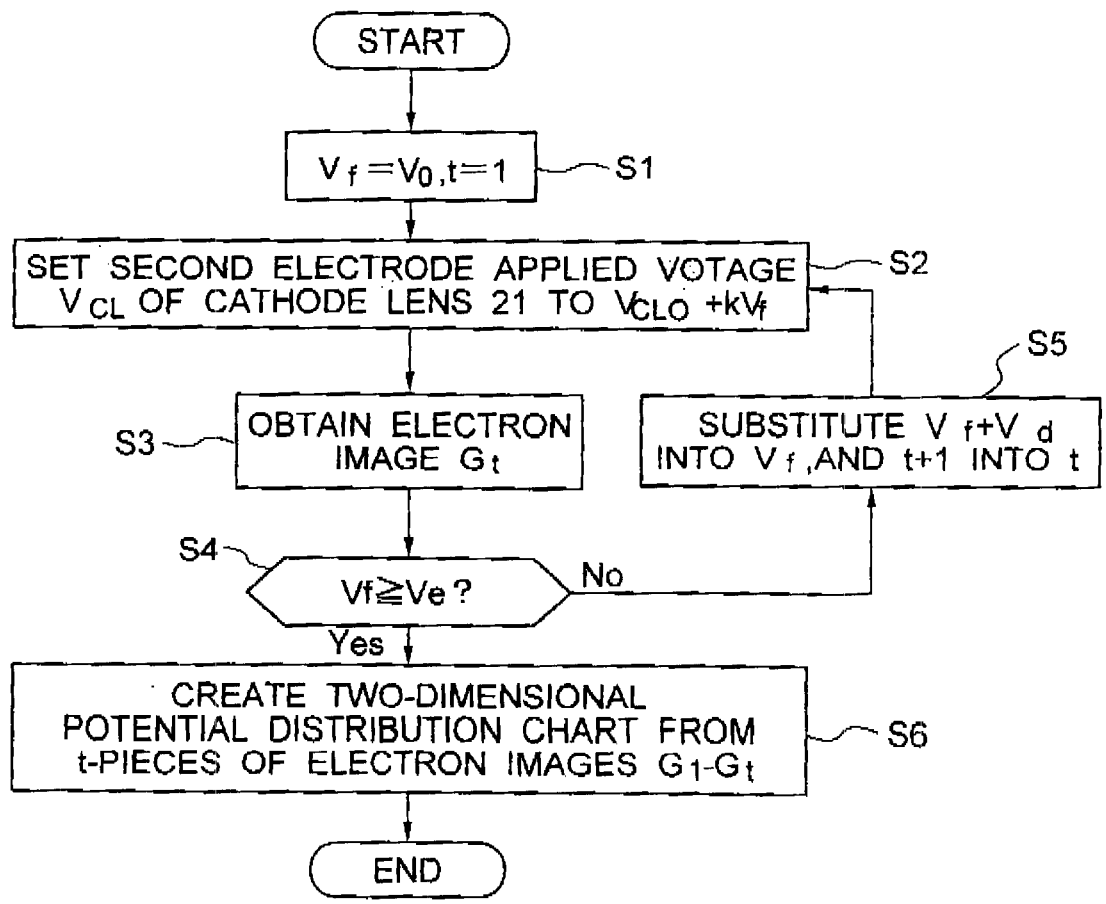
FIG. 13 is an explanatory flowchart showing a third embodiment of the substrate inspecting method of the present invention.

FIG. 13 is an explanatory flowchart showing the substrate inspecting method in the third embodiment. Referring to FIG. 13, t is the number of electron images for creating a two-dimensional potential distribution chart, $G_t$ at t-th electron image, $V_f$ is the substrate surface potential (V), $V_0$–$V_e$ is the measurement range ($V_0 < V_f < V_e$), $V_{CL}$ is the voltage (V) applied to a second electrode of the cathode lens 21, and $V_{CLO}$ is $V_{CL}$ (V) as an image focusing condition corresponding to $V_O$, and $V_d$ is the measurement resolution (V) of the substrate inspecting system. Further, there is established a relation such as $V_{CL} = V_{CLO} + k\,V_f$ (see FIG. 7).

When inputting those measuring conditions from the measuring condition input unit 65, the measurement command unit 64 at first substitutes (t=1), $V_O$ into $V_f$ in order to obtain a first sheet of surface potential charge(step S1). The second electrode applied voltage $V_{CL}$ of the cathode lens 21 is set to $V_{CLO} + k\,V_f$ ($F_v = V_0$) in accordance with the relational formula given above,(step S2). A predetermined region on the substrate surface is irradiated with the electron beams while moving the stage under this image focusing condition, and the first selection image $G_t$ (t=1; G1) is thereby obtained and is stored in the memory 61 (step S3). Upon obtaining the electron image, the measurement command unit 64 judges whether the measurement is finished or not by comparing $V_f$ with $V_e$ (step S4). If $V_f$ is under $V_e$ ($V_f < V_e$), and when judging that the measurement is not yet finished, the measurement command unit 64 substitutes $V_f + F_d$ into $V_f$ and t+1 into T (step S5), and a next electron image $G_t$(t=2; $G_2$) is acquired, when involves changing the image focusing condition by a value of the resolution of the substrate inspecting system 40 and stored in the memory 61. If $V_f$ is equal to or over $V_e$ ($V_f > V_e$), and when judging that the measurement is finished, the measurement command unit 64 outputs the control signal indicating the end of the measurement. The two-dimensional potential distribution creating unit 67, upon receiving this control signal, reads t-pieces of electron images $G_1$–$G_t$ from the memory 61 and creates a two-dimensional potential distribution chart by synthesizing these images. Then, the two-dimensional potential distribution chart is stored in the memory 61 and displayed on the display unit 60 through the image display processing unit 66 (step S6).

As discussed above, the substrate inspecting system in the third embodiment is capable of obtaining the two-dimensional potential distribution information on the substrate surface with a simple construction. As a result, the substrate inspecting system is capable of examining a distribution of the resistance value, e.g., tin the respective via-plugs. Note that in accordance with the third embodiment discussed above, the electron image $G_t$ of the predetermined region on the substrate surface is obtained so that the two-dimensional potential processing time even when using the memory 61 having a small capacity. If both of the processing time and the capacity of the memory 61 have some allowances, however, the two-dimensional potential distribution information over the entire regions on the substrate surface can be, as a matter of course, obtained. Further, as a substitute for the mode of displaying the two-dimension potential distribution chart created by synthesizing all the electron images after finishing the measurement, the electron images each obtained per image focusing condition may be sequentially displayed in superposition and thus synthesized on the display unit 60.

Next, a fourth embodiment of the substrate inspecting system of the present invention will be described referring to the drawings. A feature of the fourth embodiment is to detect defective electrical characteristic information about the wire arranged on the substrate under the image focusing condition of the secondary optical system.

Figure 14:
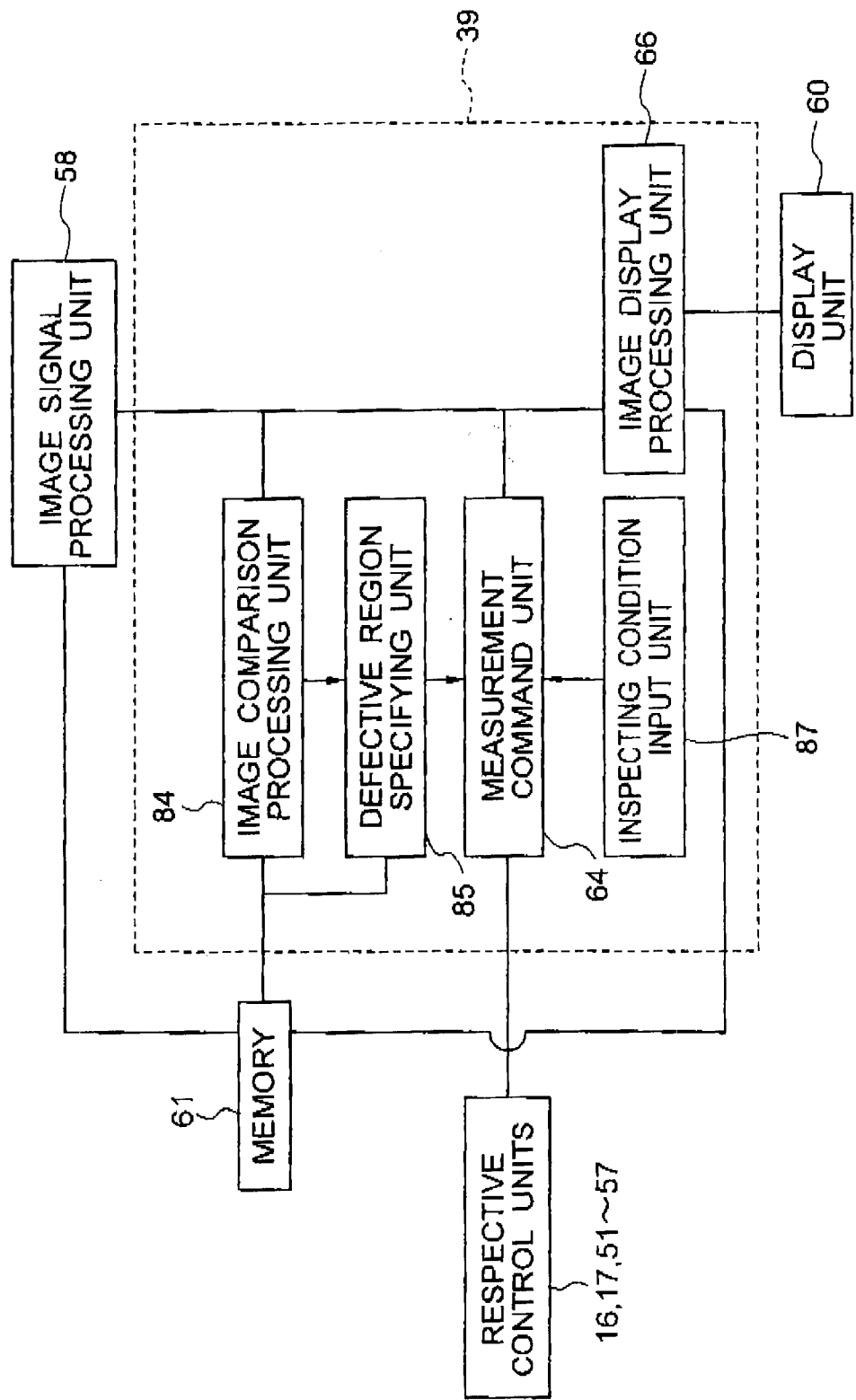
FIG. 14 is a block diagram schematically showing a principal construction of the host computer provided in a fourth embodiment of the substrate inspecting system of the present invention.

FIG. 14 is a block diagram schematically illustrating a principal architecture of a host computer 39 incorporated into a substrate inspecting system 50 in the fourth embodiment. Other constructions of the substrate inspecting system 50 are substantially the same as the substrate inspecting system 200 shown in FIG. 1.

The host computer 39 shown in FIG. 14 includes, in addition to an inspecting condition input unit 87, the measurement command unit 64 and the image display processing unit 66, an image comparison processing unit 84 and a defective region specifying unit 85 which are characteristic of the fourth embodiment.

An operation of the substrate inspecting system 50 will be explained by way of a fourth embodiment of the substrate inspecting method of the present invention. A characteristic point of the fourth embodiment of the substrate inspecting method of the focusing condition of the secondary optical system is adjusted beforehand with respect to an inspection target region through a stage-scan, and the stage-scan is again executed based on the adjusted image condition, thereby detecting a via-plug defect such as that shown in FIG. 5.

Figure 17:
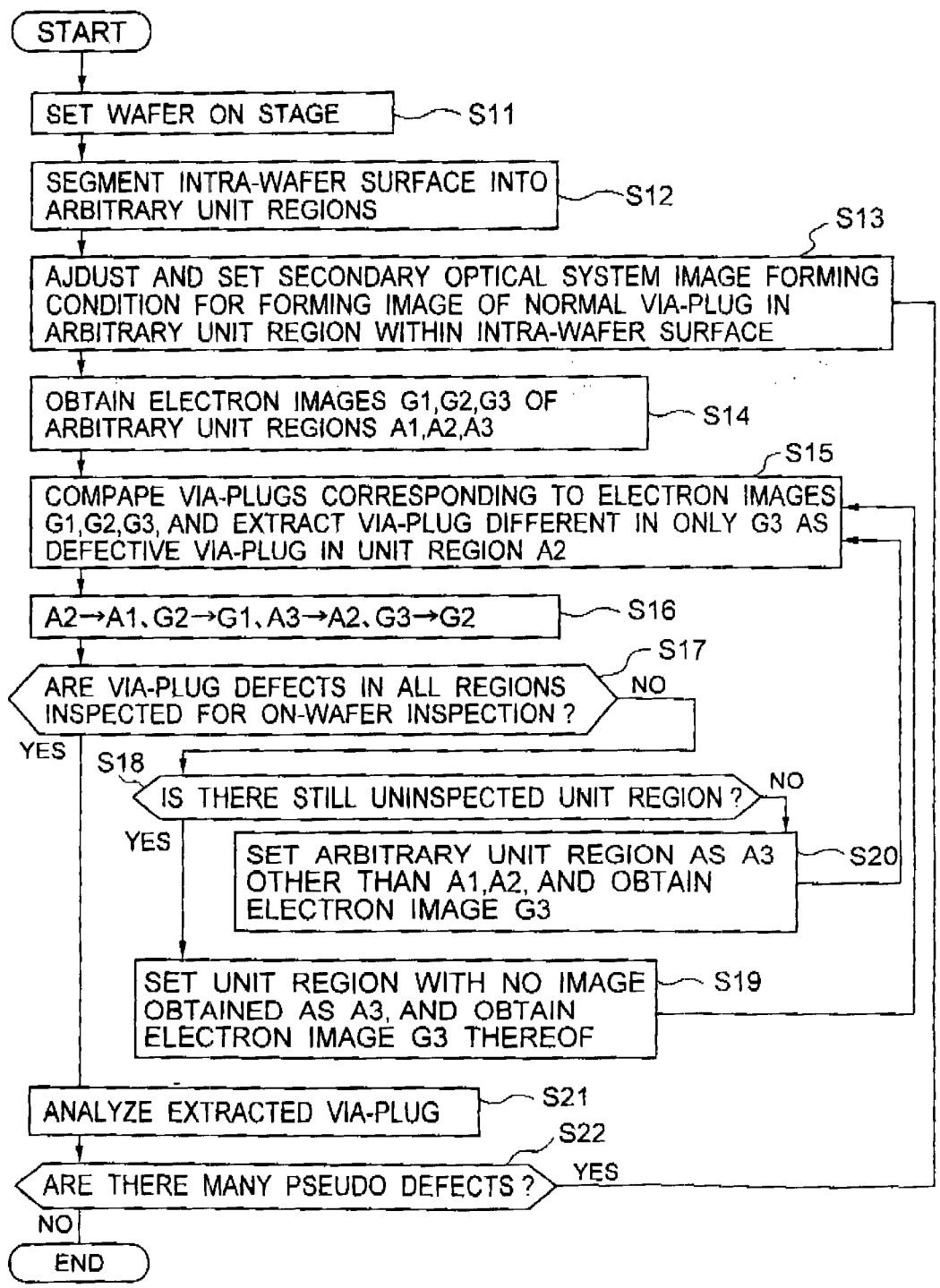
FIG. 17 is an explanatory flowchart showing the fourth embodiment of the substrate inspecting method of the present invention.
Figure 18:
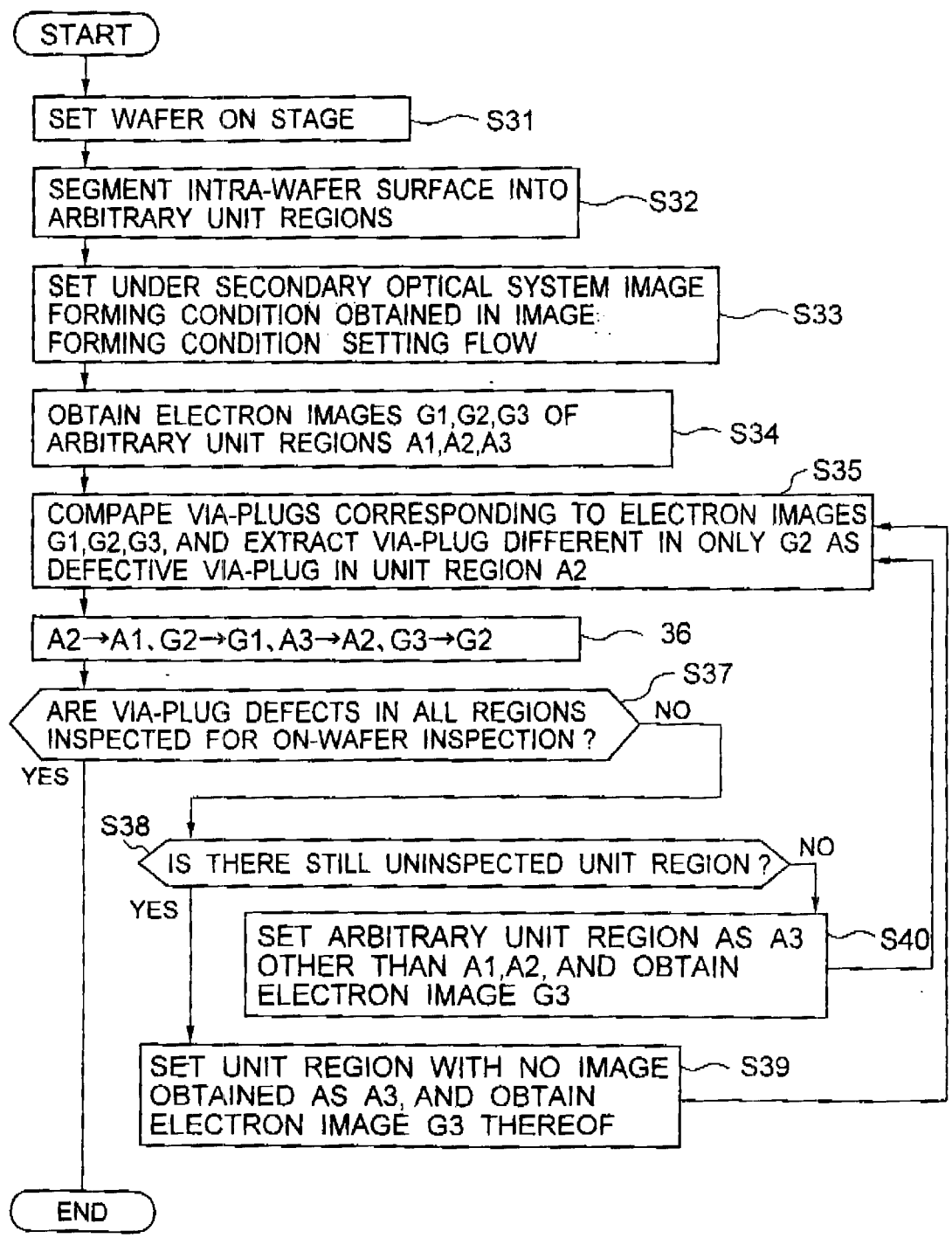
FIG. 18 is an explanatory flowchart showing the fourth embodiment of the substrate inspecting method of the present invention.

FIGS. 15 and 16A–16D are explanatory schematic views showing the fourth embodiment. Further, FIGS. 17 and 18 are explanatory flowcharts showing the fourth embodiment. FIG. 17 shows a processing flow for adjusting the image focusing condition of the secondary optical system. FIG. 18 shows a processing flow for checking the via-plug defect on the basis of the processing flow in FIG. 17.

Figure 15:
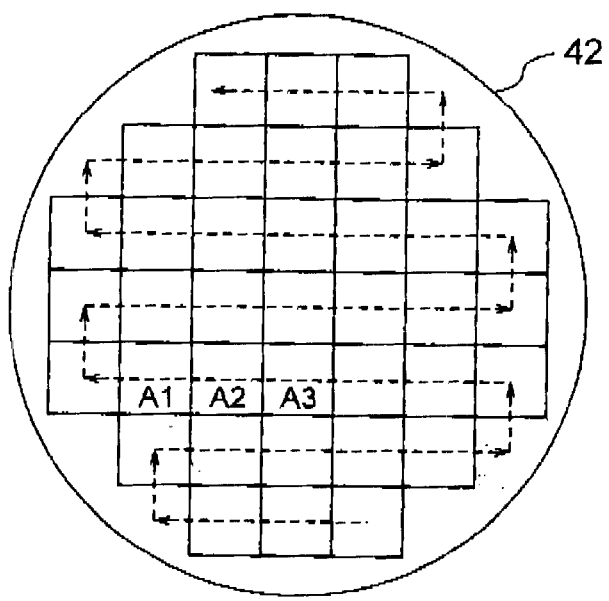
FIG. 15 is an explanatory schematic view showing the substrate inspecting method of the present invention.

To start with, as shown in FIG. 17, a wafer 42 categorized as an inspection target substrate is set on the stage (step S11). An inspection target region in the surface area of the wafer 42 is segmented into arbitrary unit regions as illustrated in FIG. 15 (step S12). The unit region may be set to an arbitrary size in consideration of a yield in a manufacturing process of the wafer 42 and an allowable inspection time, however, the target regions is segmented so that the respective unit regions are arranged in the same layout.

Referring back to FIG. 17, if the via-plug is normally formed in this arbitrary unit region, an image focusing condition of the secondary optical system for causing the secondary beams to focus into an image on the electron detection unit is set and inputted from the inspecting condition input unit 87, and the measurement command fly, unit 64 transmits the control signals, based this condition to the individual control units 16, 17 and 51 through 57 (step S13). This image focusing condition is individually determined based on design information, taking a wire material, etc. into consideration.

Next, the measurement command unit 64 generates control signals to irradiate three arbitrary unit regions A1, A2, A3 with the electron beams while moving the stage 43 as indicated the broken lines with arrowheads in FIG. 15 under the image focusing condition set in the above procedure, thereby obtaining image signals of electron images G1a, G2a, G3a of these unit regions (step S14). In an example illustrated in FIG. 15, the regions adjacent to each other are selected as the three unit regions, however, without being limited to this selection mode, any regions may be selected. This is the same in embodiments which will be discussed later on.

Figures 16A, 16B, 16C:
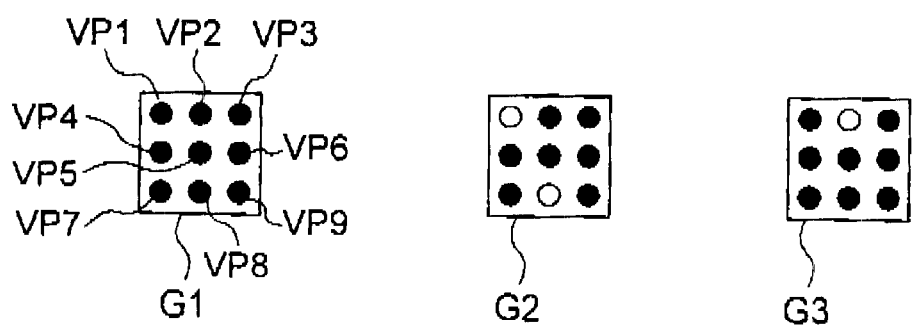
FIGS. 16A–16D are explanatory schematic views showing a fourth embodiment of the substrate inspecting method of the present invention.

FIGS. 16A–16C schematically illustrate the respectively-obtained electron images G1a, G2a, G3a of the unit regions A1, A2, A3, wherein the via-plugs normally formed among via-plugs VP1–VP9 are marked with black circles, whereas the via-plugs exhibiting defects such as an open defective portion (see FIG. 5) and a crack.

Figure 16D:
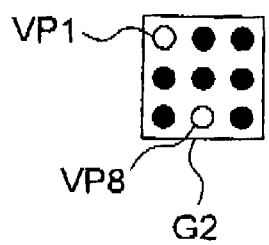

The image comparison processing unit 84 reads those electron images G1a, G2a, G3a from the memory 61, and compares the via-plugs corresponding thereto. With respect to only the electron image G2a, the different via-plugs, i.e., the via-plugs VP1, VP8 in an example shown in FIG. 16D are extracted as defective via-plugs within the unit region A2 and stored in the memory 61 (step S15 in FIG. 17).

Subsequently, the image comparison processing unit 84 deletes pieces of information about the unit region A1 and the electron image G1a from the memory 61. The image comparison processing unit 84 then sets the previous unit regions A2 and the electron image G2a as a new unit region A1 and an electron and image G1a thereof, and likewise makes the previous unit region A3 and electron image G3a stored as a new unit region A2 and a new electron image G2a thereof (step S16).

Next, the measurement command unit 64 judges whether or not the via-plugs in all the regions within the inspection target area on the wafer 42 are inspected to detect their defects (step S17). If the inspections of the defects in all the target regions are not yet finished, the measurement command unit 64 judges whether or not there is a unit region which is not yet inspected (step S18). If there exists the uninspected region, the unit region with no image obtained, e.g., adjacent in the opposite direction to the moving direction of the stage 43 is assumed to be A3, and the stage 43 is moved a distance corresponding to the unit region, thus obtaining the electron image G3a of the new unit region A3 (step S19). The electron image G3a is then supplied to the memory 61 and the image comparison processing unit 84 as well. The image comparison processing unit 84 extracts a defective via-plug in the new unit region A2, and stores the memory 61 with this defective via-plug.

If there is no uninspected region, for inspecting the electron image G3a of the unit region A3 just anterior thereto for finding out its defect, the measurement command unit 64 sets the unit region A2 just anterior thereto and an electron image G1a thereof as a new unit region A1 and a new electron image G1a, and similarly sets the unit region A3 just anterior thereto and the electron image G3a as a new unit region A2 and a new electron image G2a thereof (steps S15–S18). Thereafter, the measurement command unit 64 chooses an arbitrary unit region excluding the unit regions A1, A2 just anterior within the inspection target area as a final unit region A3, and obtains its electron image as an image G3a (step S20). Then, the measurement command unit 64 extracts a defective via-plug with respect to the electron image G2a of the last unit region A2, and stores the memory 61 with this defective via-plug (step S15).

Upon finishing the inspections of the via-plug defects in all the regions within the inspection target area on the wafer 42 (step S17), the measurement command unit 64 notifies the defective region specifying unit 85 of the end-of-inspection information, and the defective region specifying unit 85 reads the information on the defective via-plug out of the memory 61, and analyzes this piece of information (step S21). The defective region specifying unit 85 compares a numerical quantity of the detected defects with a predetermined threshold value based on an empirical value, etc. inputted beforehand as the inspecting condition, and thus judges a validity of the numerical quantity of the defects (step S22). If the numerical quantity of the detected defects is equal to or over the threshold value, the defective region specifying unit 85 judges that there are may pseudo defects such as mis-detecting the actually non-defective via-plugs as defects, and notifies the measurement command unit 64 of its information. The measurement command unit 64, upon receiving this piece of information, judges that the presumed image focusing condition is not valid, and adjusts the image focusing condition of the secondary, optical system. Then, the measurement command unit 64 repeats a loop of steps S13 through S22 described above. Whereas if the numerical quantity of the detected defects becomes under the threshold value, it is judged that the finally set image focusing condition is valid, and the image forming condition adjusting flow comes to an end.

Note that the defective region specifying unit 85 judges based on the threshold value whether or not there exist many pseudo defects in the fourth embodiment, however, if difficult to set a proper threshold value, an operator visually confirms the defective region detected by the substrate inspecting system 50 on the basis of SEM, etc. Then, the numerical quantity of the defects confirmed by the operator is compared with the numerical quantity of the defects detected by the substrate inspecting system 50, and, if a difference therebetween is large, the image focusing condition of the secondary optical system may be adjusted. This point is the same in the following fifth, eighth and eleventh embodiments.

Next, a procedure of re-executing the stage-scan based on the image focusing condition of the secondary opticals system which has been determined by the image focusing condition adjusting flow described above and actually detecting the defect in the via-plug on the wafer 42, will be explained referring to a flowchart in FIG. 18.

As shown in FIG. 18, to begin with, the wafer 42 defined as the inspection target substrate is set on the stage (step S31). An inspection target region in the surface area of the wafer 42 is segmented into arbitrary unit regions (see FIG. 15) (step S32).

Next, the measurement command unit 64 generates the control signals corresponding to the image focusing condition of the secondary optical system which has been gained by the above-described image focusing condition setting flow, and transmits the control signals to the respective control units 16, 17 and 51 through 57 (step S33).

Subsequently, the measurement command unit 64 irradiates three arbitrary unit regions, e.g., A1, A2, A3 shown in, FIG. 15 with the electron beams while moving the stage 43 under the set image forming condition, thereby obtaining image signals of electron images G1a, G2a, G3a of these unit regions (see FIGS. 16A–16C) and storing the memory 61 with these image signals (step S14).

Next, the image comparison processing unit 84 reads those electron images G1a, G2a, G3a from the memory 61, and compares the via-plugs corresponding thereto. Among these three electron images of G1a to G3a, the electron image G2a has the different via-plug VP8 from other electron images G1a, G3a (see FIG. 16D). The image comparison processing unit 84 extracts then the via-plug V8 of the electron image G2a as a defective via-plug within the unit region A2 and stored it in the memory 61 (step S35).

Subsequently, the image comparison processing unit 84 deletes pieces of information about the unit region A1 and the electron image G1a from the memory 61. The image comparison processing unit 84 likewise makes the previous unit region A3 and electron image G3a stored as a new unit region A2 and a new electron image G2a thereof (step S36).

Next, the measurement command unit 64 judges whether or not the via-plugs in all the regions within the inspection target area on the wafer 42 are inspected to detect their defects (step S37). If the inspections of the defects in all the target regions are not yet finished, the measurement command unit 64 judges whether or not there is an uninspected unit region (step S38). If there exists the uninspected region, the unit region with no image obtained is assumed to be A3, and the stage 43 is moved a distance corresponding to the unit region, thus obtaining the electron image G3a of the new unit region A3 (step S39). The electron image G3a is then supplied to the memory 61 and the image comparison processing unit 84 as well. The image comparison processing unit 84 extracts a defective via-plug in the new unit region A2, and stores the memory 61 with this defective via-plug.

If there is no uninspected region, for inspecting the electron image G3a of the unit region A3 just anterior thereto for finding out its defect, the measurement command unit 64 sets the unit region A2 just anterior thereto and an electron image G2a thereof as a new unit region A1 and a new electron image G1a thereof, and similarly sets the unit region A3 just anterior thereto and the electron image G3a as a new unit region A2 and a new electron image G2a thereof (steps S35–S38). Thereafter, the measurement command unit 64 selects an arbitrary unit region other than the unit regions A2, A3 just anterior within the inspection target area as a final unit region A3, and obtains its electron image as an image G3a (step S40). Then, the measurement command unit 64 would extract a defective via-plug in the electron image G2a of the last unit region A2, and store the memory 61 with this defective via-plug (step S35).

Upon finishing the inspections of the via-plug defects in all the regions within the inspection target area on the wafer 42 (step S37), the measurement command unit 64 notifies the respective control units 16, 17 and 51–57 of the end-of-inspection information, and sets those items back to the initial conditions. Then, the measurement command unit 64 reads the information on the defective via-plugs from the memory 61, and displays the information on the display unit 60 through the image display processing unit 66, and the defect inspection is finished.

As discussed above, according to the substrate inspecting system 50 in the fourth embodiment, the electron image per unit region is obtained by adjusting the secondary optical system image focusing condition for causing secondary beams emitted from the normal wire region to focus into the image. It is therefore feasible to detect the defective electrical characteristic of the wire on the substrate surface on the basis of these electron images. Further, the inspection can be carried out after finishing the each manufacturing process because of being inspectable in a non-contact manner, and the manufacturing process with an occurrence of the via-plug defect can be easily specified. With this contrivance, there is provided the substrate inspecting system capable of making a large contribution to an enhancement of yield in the semiconductor manufacturing process. Note that the electron images of the three unit regions are acquired and compared in the fourth embodiment, however, without being restricted to this mode, it is sufficiently possible to obtain the information on the defective characteristic also by obtaining and comparing the electron images of the two unit regions. Moreover, pieces of information on the defective regions may be sequentially displayed each time the defectives region is detected instead of displaying the information on all the defective regions upon finishing the defect inspection. These points are the same in embodiments which are to be discussed hereinafter.

Next, a fifth embodiment of the substrate inspecting system of the present invention will be described with reference to the drawings. What is characteristic of the fifth embodiment is that the substrate inspecting system includes a configuration judging unit for detecting a defective configuration such as a short-circuit defective portion and an open defective portion with respect to a metal wire arranged on the substrate surface.

FIG. 19 is a block diagram schematically illustrating a principal architecture of a host computer 49 incorporated into a substrate inspecting system 45 in the fifth embodiment. Other constructions of the substrate inspecting system 45 are substantially the same as the substrate inspecting system 200 shown in FIG. 1.

As illustrated in FIG. 19, the host computer 49 includes a configuration judging unit 86 characteristic of the fifth embodiment in addition to the inspecting condition input unit 87, the measurement command unit 64 and the image display processing unit 66.

An operation of the substrate inspecting system 45 in the fifth embodiment will be described referring to the drawings.

Figure 20A:
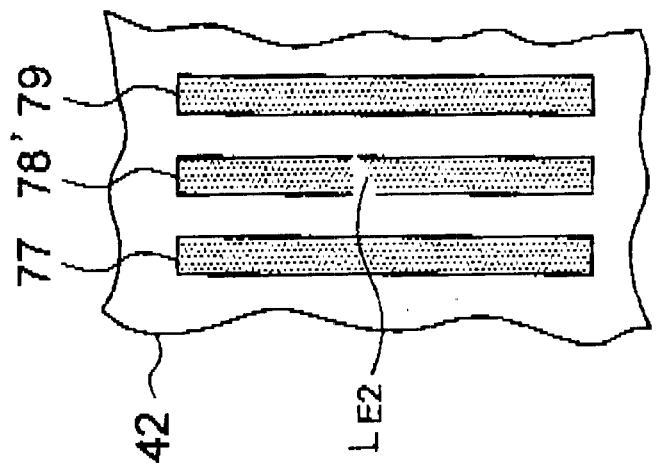
FIGS. 20A–20C are views showing one examples of defects in wires for assistance of explaining fifth and sixth embodiments of the substrate inspecting methods according to the present invention.
Figure 20B:
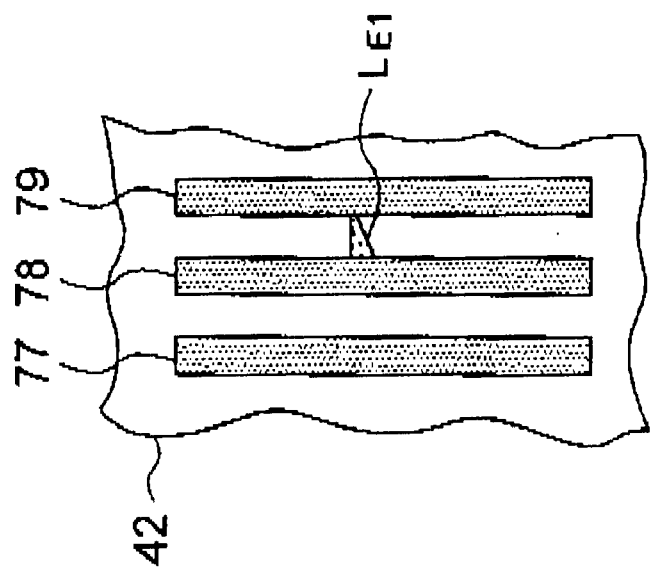
Figure 20C:
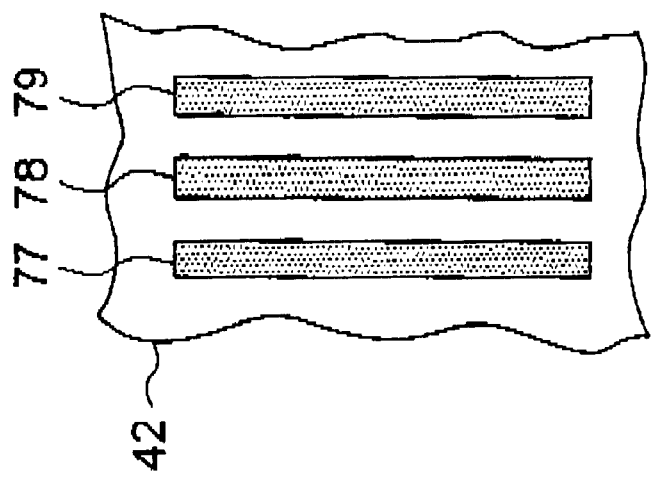

At first, contents of information on configurations detected in the fifth embodiment will be explained. FIGS. 20A–20C show examples of specific configurations of wire defective portions as detection targets. More specifically, FIG. 20A illustrates normal wires 77, 78, 79 formed as done in a design layout. FIG. 20B shows an example where a short-circuit defective portion $L_{E1}$ is formed between the wire 78 and the wire 79. Further, FIG. 20C exemplifies an example in which the wire 78 turns out to be a wire 78' having an open defective portion $L_{E2}$ due to a deficiency of embedding a metal material and so forth.

Herein, when the metal wires are formed as the design layout shows, the stage-scan is performed according to the secondary optical system image focusing condition under which the secondary beams emitted from the metal wires irradiated with the electron beams focus into their images on the electron detector, and the electron images are thus obtained, whereby the information on the wire configurations can be acquired.

Figure 21:
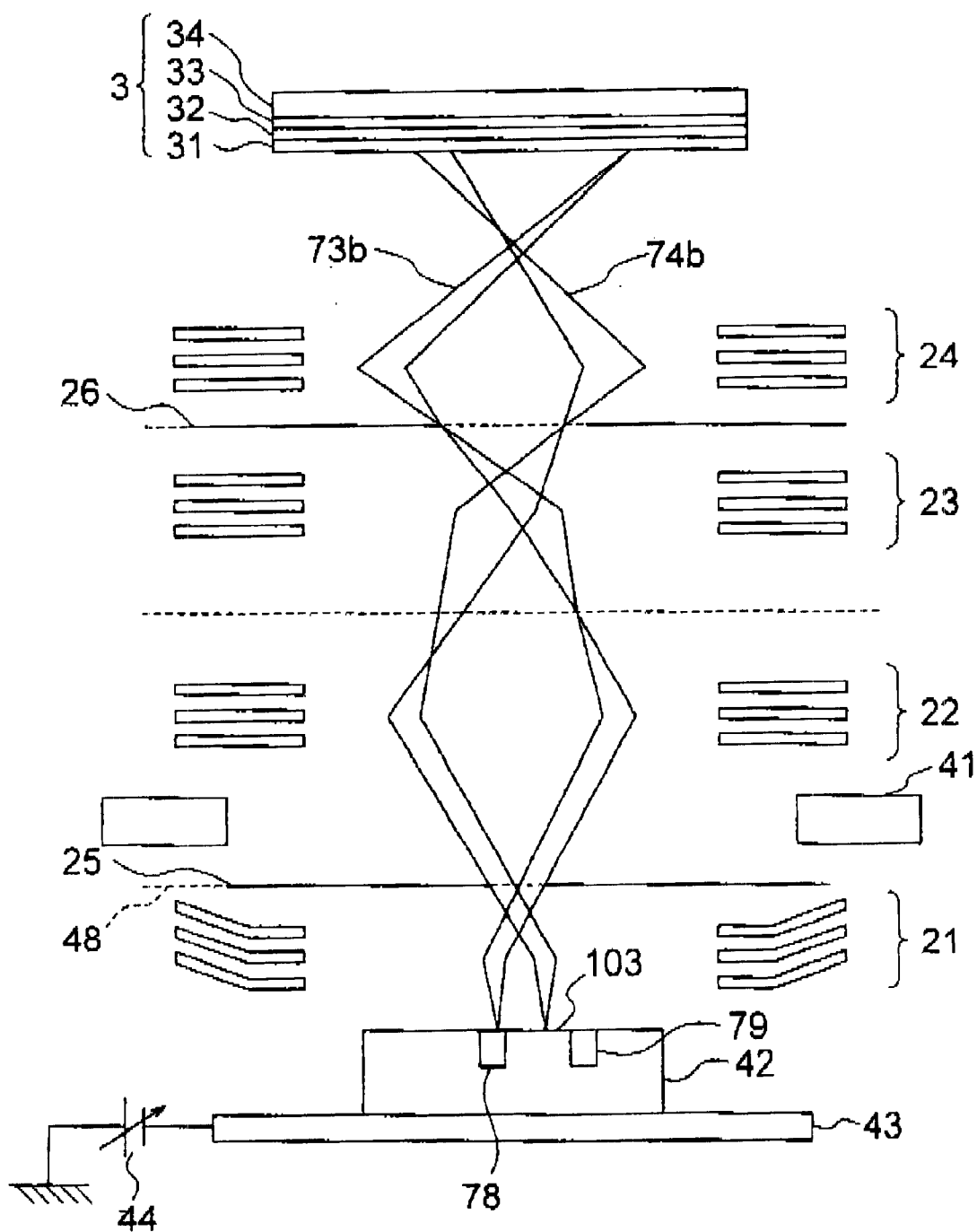
FIG. 21 is a schematic view showing the fifth embodiment of the substrate inspecting method of the present invention.
Figure 22:
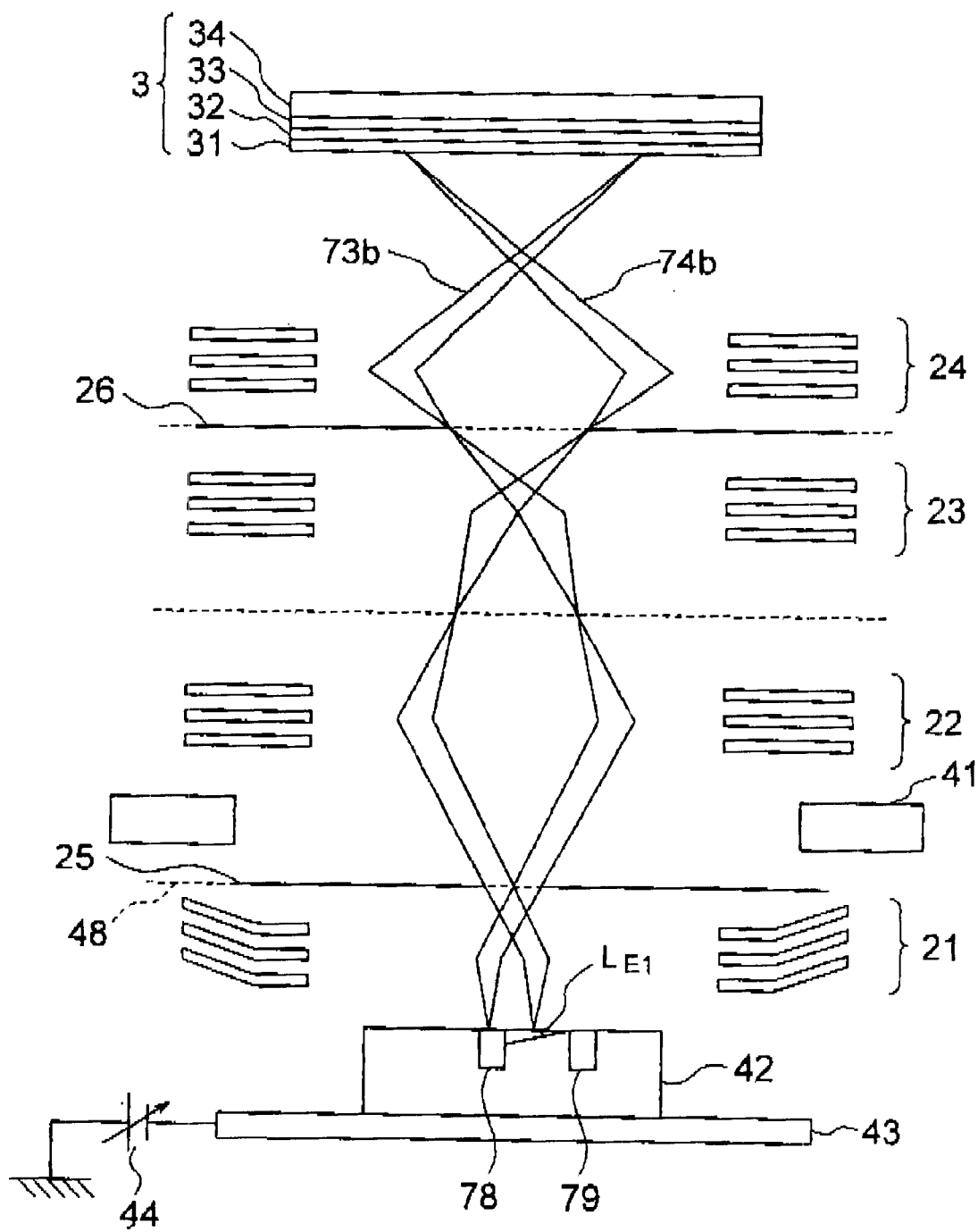
FIG. 22 is a schematic view showing the fifth embodiment of the substrate inspecting method of the present invention.

Accordingly, to start with, the secondary optical system image focusing condition for causing the secondary beams from the metal wires to focus into the images and pieces of information about the inspection target regions on the wafer 42, are inputted from the inspecting condition input unit 87. The measurement command unit 64, based on this image focusing condition, generates the control signals and transmits these control signals to the individual control units 16, 17 and 51–57. Then, the inspection target region is irradiated with the electron beams while the stage 43 is moved aiming at the inspection target region. In accordance with the fifth embodiment, the respective control units 16, 17 and 51 through 57, are controlled so that the secondary beams emitted from the metal wire regions focus into the adequate image are adequately formed on the electron detector, and hence, if the metal wire assumes the configuration as prescribed in the design layout, for example, secondary beams 73b emitted from the metal wire 78 properly form the image on the electron detector as illustrated in FIG. 21. In an insulator region 103 between the wire 78 and the wire 79, however, the secondary beams 74b does not focus into the image on the electron detector, and therefore the electron image according to the design layout is obtained. By contrast, if having the short-circuit defective portion LE2, shown in FIG. 20B, as illustrated in FIG. 22, both of the secondary beams 73b, 74b emitted from the region 78 and the defective portion LE1, focus into images are formed on the electron detector, thereby obtaining the electron image containing a fragment of image corresponding to the short-circuit defective portion LE1.

Next, a method by which the configuration judging unit 86 judges the configuration on the basis of the image signals obtained, will be discussed more specifically by way of fifth and sixth embodiments of the substrate inspecting method of the present invention. Incidentally, in the following discussion, a wire portion, it is assumed, embraces the wire and, in addition, an insulator in a region peripheral to the wire.

The fifth embodiment of the substrate inspecting method according to the present invention deals with a method of segmenting, in the same way as the fourth embodiment discussed above, the inspection target area on the wafer into arbitrary unit regions having the same layout, and comparing the images with each other which are obtained from those regions.

Figure 23:
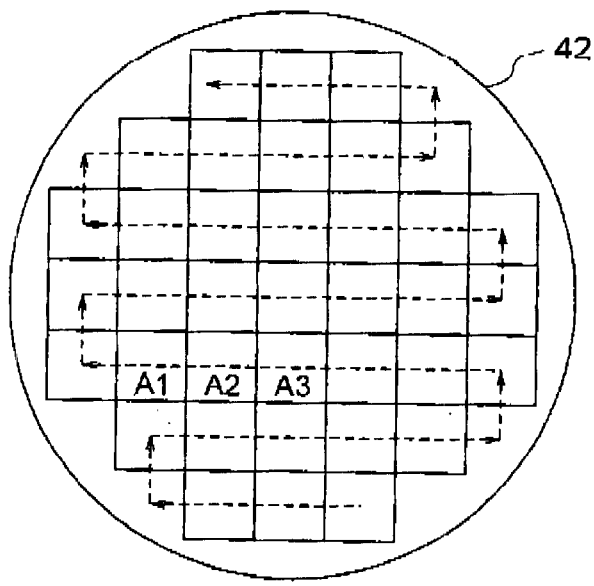
FIG. 23 is an explanatory schematic view showing the substrate inspecting method of the present invention.
Figure 25:
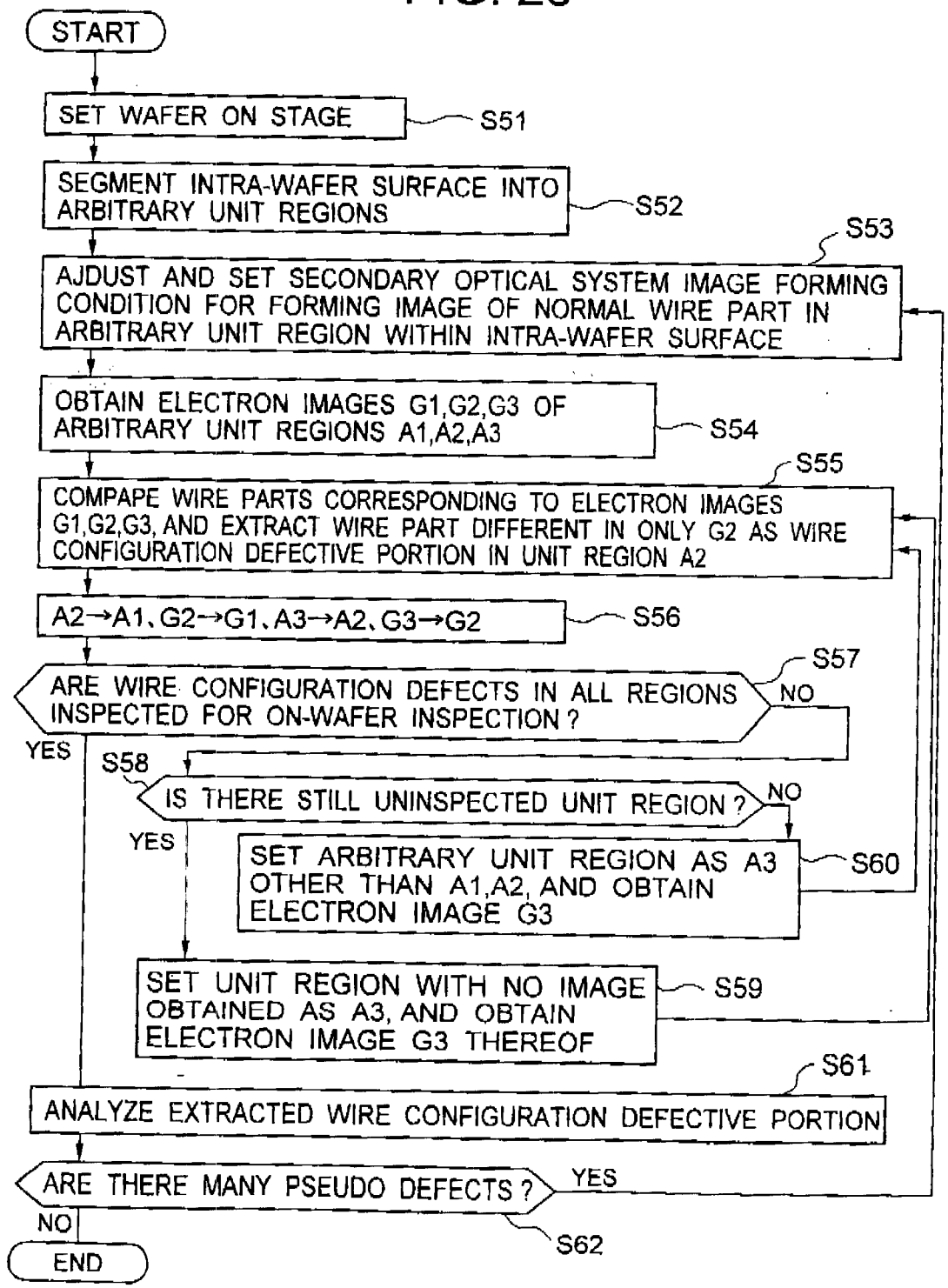
FIG. 25 is a flowchart showing the fifth embodiment of the substrate inspecting method of the present invention.
Figure 26:
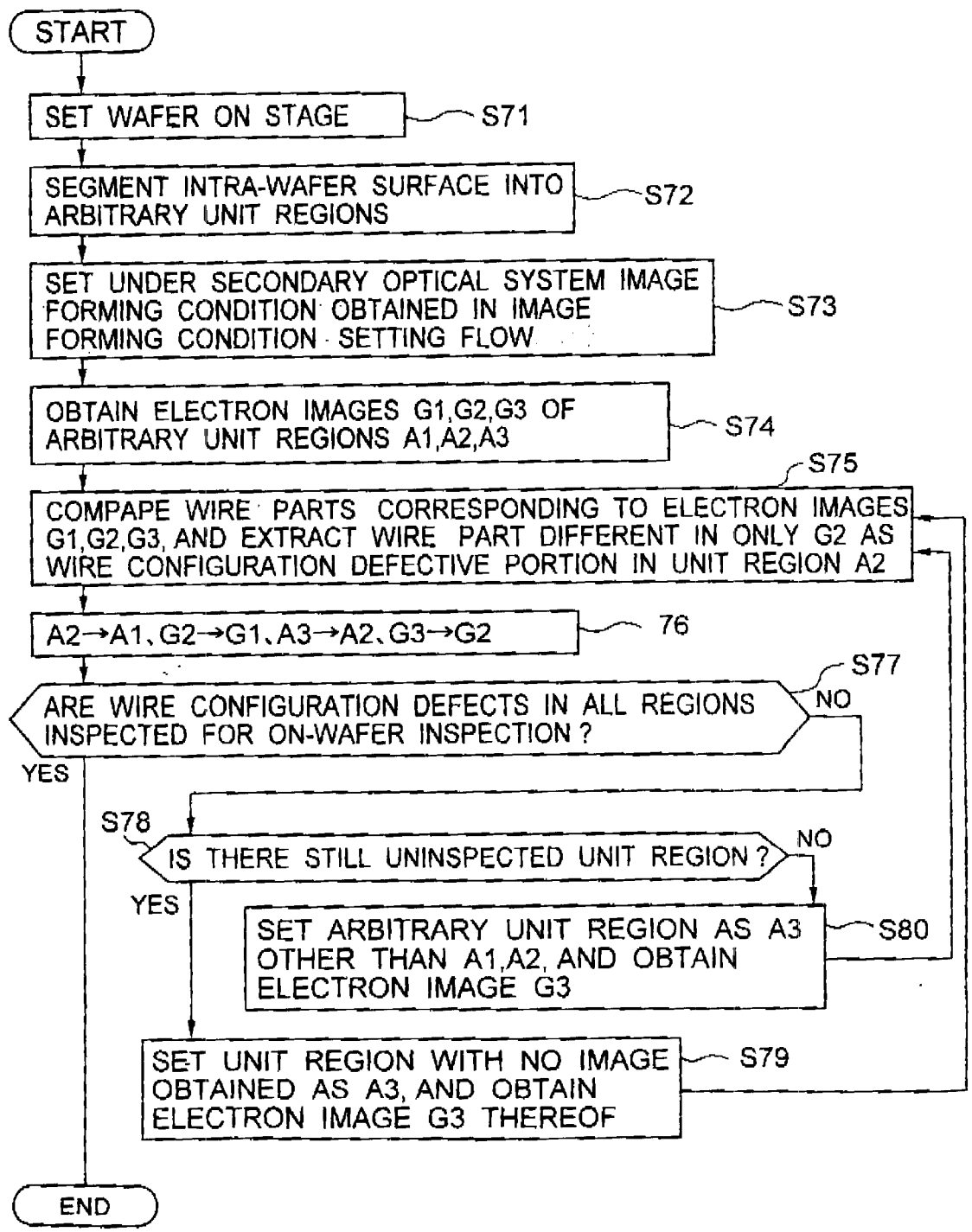
FIG. 26 is a flowchart showing the fifth embodiment of the substrate inspecting method of the present invention.

FIGS. 23 and 24A–24D are explanatory schematic views showing the fifth embodiment. FIG. 23 is the same as FIG. 15 given above and is again shown for an explanatory convenience. Further, FIG. 25 is a flowchart showing a process of adjusting the image focusing condition of the secondary optical system. FIG. 26 is a flowchart showing a process of judging based on the above flowchart whether or not there is a defect in the wire configuration.

As obvious in contrast with FIGS. 17 and 18, the flowchart in FIG. 25 is very similar to the flowchart in FIG. 17, wherein the steps with numerals 50s excluding steps S53, S55, S57, S61 are the same as the steps with the numerals each plus 40 in FIG. 17. Similarly in the flowchart in FIG. 26, the steps with numerals 70s excluding steps S75, S77 are the same as the steps with the numerals each plus 40 in FIG. 18.

Accordingly, the different steps from the flowcharts in FIGS. 17 and 18 will be focused on in the following discussion.

As shown in FIG. 25, at first, the wafer 42 is set on the stage, and the intra-surface area of the wafer 42 is segmented into arbitrary unit regions (steps S51, S52).

Next, if the wires are normally formed, values of the respective control units 16, 17 and 51–57 are adjusted by setting the image focusing condition of the secondary optical system under which the secondary beams are to focus into the image on the electron detector 3 (step S53).

Subsequently, arbitrary three unit regions, e.g., A1, A2, A3 shown in FIG. 23 are irradiated with the electron beams under the image focusing condition set in the above procedure, and image signals of the electron images G1b, G2b, G3b of these unit regions are thereby obtained and stored in the memory 61 (step S54).

Figures 24A, 24B, 24C:
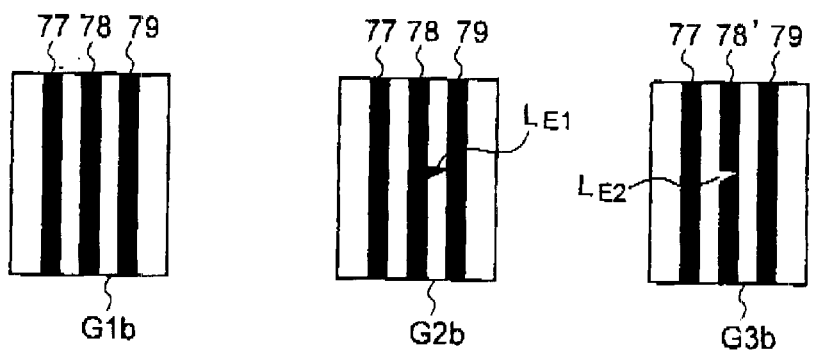
FIGS. 24A–24D are schematic views showing the fifth embodiment of the substrate inspecting method of the present invention.
Figure 24D:
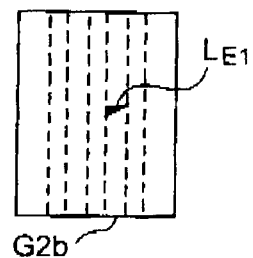

FIGS. 24A–24C schematically illustrate the obtained electron images G1b, G2b, G3b corresponding to those in the specific examples shown in FIGS. 20–20C, respectively.

The configuration judging unit 86 reads these electron images G1b, G2b, G3b from the memory 61, and compares the wire portions corresponding thereto. Then, the configuration judging unit 86 extracts the short-circuit defective portion $L_{E1}$ formed between the wire 78 and the wire 79 in an example shown in FIG. 24D and short-circuiting these wires in the wire portion that is different in only the electron image G2b, as a wire configuration defective portion within the unit region A2, and this short-circuit defective portion is stored in the memory 61 (step S55).

Next, the configuration judging unit 86 deletes pieces of information on the unit region A1 and the electron image G1b from the memory 61, and makes the previous unit region A2 and electron image G2b stored as a new unit region A1 and a new electron image G1b thereof. The configuration judging unit 86 similarly makes the previous unit region A3 and electron image G3b stored as a new unit region A2 and a new electron image G2b thereof (step S56).

Subsequently, the measurement command unit 64 judges whether or not the wire configurations in all the inspection target regions are inspected to detect their defects (step S57). If the inspections of the defects in all the target regions are not yet finished and if there is an uninspected region (step S58), the measurement command unit 64 sets the unit region with no image obtained as a new unit region A3, and obtains an electron image G3b thereof (step S59). The configuration judging unit 86 extracts the defective wire portion within the new unit region A2 and stores the memory 61 with this defective portion. In an example shown in FIG. 24C, with this processing, the electron image G3b in FIG. 24C turns out to be an electron image G2b, thereby detecting an open defective portion $L_{E2}$.

If there is no uninspected region (step S58), the unit regions A1, A2 just anterior become final unit regions, and the measurement command unit 64 selects as a final unit region A3 an arbitrary unit region other than those final unit regions A1, A2 within the inspection target area, and obtains an electron image G3b thereof (step S60). Then, the wire configuration defective portion in the electron image G2b of the final unit region A2 is extracted and stored in the memory 61 (step S55).

Upon finishing the inspections of the wire configuration defects in all the inspection target regions on the wafer 42 (step S57), the measurement command unit 64 notifies the configuration judging unit 86 of the end-of-inspection information, and the configuration judging unit 66 reads the information on the wire configuration defective portions from the memory 61 and analyzes the information (step S61). Specifically, as in the fourth embodiment discussed above, a numerical value of pseudo defects is judged from a comparison with a predetermined threshold value (step S62), if judging that there are many pseudo defects, a loop process of steps S53 through S62 is repeated. Whereas if judging that there are a small number of pseudo defects, the image focusing condition set last is judged valid, and the image focusing condition adjusting flow comes to an end.

Next, the stage-scan is again performed based on the secondary optical system image focusing condition determined in the image focusing condition adjusting flow described above, and the wire defect on the wafer 42 is actually detected.

To be specific, as shown in FIG. 26, the wafer 42 is set on the stage, and the intra-surface area of the wafer is segmented into arbitrary unit regions (see FIG. 23) (steps S71, S72).

Next, arbitrary three unit regions, e.g., A1, A2, A3 are irradiated with the electron beams under the secondary optical system image forming condition acquired in the image forming condition setting flow described above, and the measurement command unit 64 obtains image signals of the electron images G1b, G2b, G3b of these unit regions (steps S73, S74).

Next, the configuration judging unit 86 reads these electron images G1b, G2b, G3b from the memory 61, and compares the wire portions corresponding thereto. Then, the configuration judging unit 86 extracts the wire portion that is different in only the electron image G2b as a wire configuration defective portion (see FIG. 24D) within the unit region A2, and stores the memory 61 with this defective portion (step S75).

Next, the configuration judging unit 86 deletes pieces of information about the unit region A1 and the electron image G1b from the memory 61, and makes the previous unit region A2 and electron image G2b stored as a new unit region A1 and a new electron image G1b thereof. The configuration judging unit 86 similarly makes the previous unit region A3 and electron image G3b stored as a new unit region A2 and a new electron image G2b thereof (step S76).

The above-described inspections of the wire configuration defects are executed with respect to all the inspection target regions on the wafer 42 (step S77). The procedure in the case of the defect inspections being unfinished in all the target regions (steps s78–S80), is substantially the same as that shown in FIG. 18 (steps s38–S40), however, a different point is that the defect is extracted not by the image comparison processing unit 84 but by the configuration judging unit 86, and that a set of electron images are not G1a, G2a, G2 but G1b, G2b, G2b.

When finishing the inspections of the wire configuration defects with respect to all the inspection target regions (step s77), the measurement command unit 64 reads the information about the wire configuration defective portions from the memory 61, and displays the electron images thereof on the display unit 60 through the image display processing unit 66. The defect inspections are thus ended.

Next, arbitrary three unit regions, e.g., A1, A2, A3 are irradiated with the electron beams under the secondary optical system image focusing condition acquired in the image focusing condition setting flow described above, and the measurement command unit 64 obtains image signals of the electron images G1b, G2b, G3b of these unit regions (steps S73, S74).

According to the substrate inspecting method in the fifth embodiment discussed above, the image condition of the secondary optical system is adjusted by comparing the plurality of electron images with each other which have been obtained from the unit regions arranged in the same layout. In a case where the electron image of the normal wire portion exhibiting no defect as illustrated in FIG. 20A can be obtained, this image is stored an a reference normal image in the memory 61. The configuration defect can be checked by making a comparison with the reference normal image. This method will be explained referring again to FIGS. 19 and 20A–20C by way of a sixth embodiment of the substrate inspecting method of the present invention.

To begin with, the memory 61 is stored with the reference normal image. The image focusing condition of the secondary optical system when this reference normal image is obtained (which condition will hereinafter be referred to as a reference normal image focusing condition), is inputted from the inspecting condition input unit 87. Information on the inspection target regions on the wafer 42 are also inputted from the inspecting condition input unit 87.

The measurement command unit 82 transmits the control signals based on the reference normal image focusing condition to the individual control units 16, 17 and 51–57, then performs the stage-scan, and sequentially acquires the electron images of the inspection target regions. The electron image is obtained per unit region having same layout as the normal wire portion region from which the reference normal image is obtained. The obtained electron image is then subjected to predetermined signal processing in the image signal processing unit 58, and supplied to the configuration judging unit 86.

The configuration judging unit 86 reads the reference normal image from the memory 61, and sequentially compares, with this reference normal image, the electron image of each unit region which is given from the image signal processing unit 58. As a result of this comparing process, if there is an inspection target region having a wire configuration difference from the reference normal image as shown in FIGS. 20B and 20C, a piece of positional information and an electron image of the configuration defect region are stored in other location on the memory 61.

Upon an end of the stage-scans with respect to all the inspection target regions on the wafer 42, the measurement command unit 64 reads the positional information and the electron image of the configuration defect region which are stored in the memory 61, and displayed on the display unit 60 through the image display processing unit 66.

Thus, according to the substrate inspecting method of the present invention, the abnormality in the configuration of the metal wire formed on the substrate is detected with a simple construction, and it is therefore feasible to gain the configuration information about the short-circuit defective portion and the open defective portion in the non-contact manner. Hence, the substrate can be inspected after finishing each manufacturing process, and the manufacturing process with the occurrence of defect in the configuration can be easily specified. This can make a large contribution to an enhancement of the yield in the semiconductor manufacturing process.

Next, the sixth embodiment of the substrate inspecting system according to the present invention will be explained with reference to the drawings. A feature of the sixth embodiment is that a substrate inspecting system 70 includes, as shown in FIG. 27, a chemical property judging unit 88 for getting chemical property information on the substrate.

Figure 27:
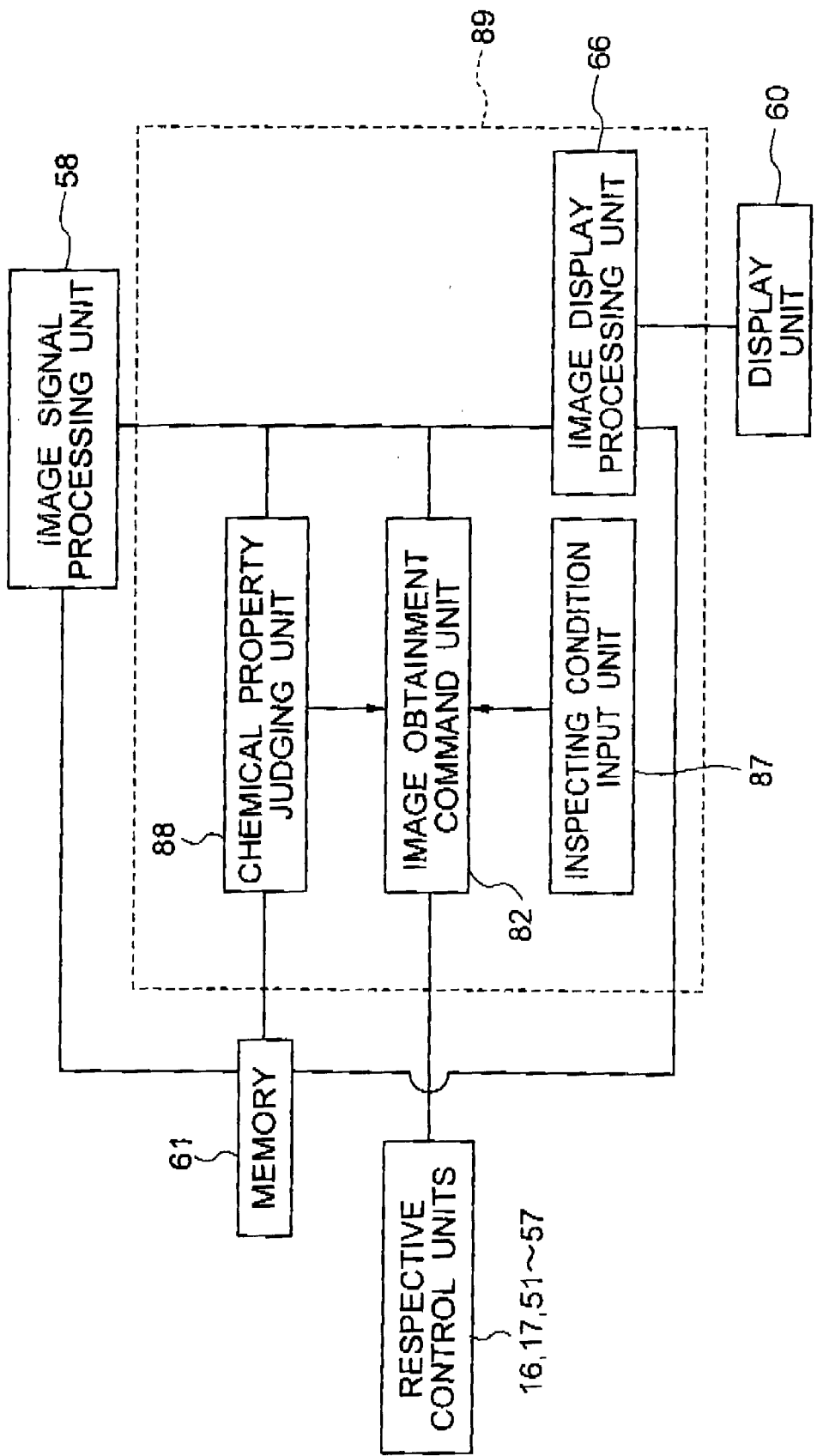
FIG. 27 is a block diagram schematically showing a principal construction of the host computer provided in a sixth embodiment of the substrate inspecting system of the present invention.

FIG. 27 is a block diagram schematically showing a principal architecture of a host computer 89 incorporated into a substrate inspecting system 70 in the sixth embodiment. Other constructions of the substrate inspecting system 70 are substantially the same as the substrate inspecting system 200 shown in FIG. 1.

The host computer 89 shown in FIG. 27 includes a chemical property judging unit 88 characteristic of the sixth embodiment in addition to the inspecting condition input unit 87, an image obtainment command unit 82 and the image display processing unit 66.

The chemical property judging unit 88 judges based on the image signals transmitted from the image signal processing unit 58 whether or not there occur metal contamination in a region peripheral to the metal wire on the substrate and oxidation on the surface of the metal wire, and detects pieces of information on positions of the occurrences thereof.

The measurement command unit 82 transmits the control signals based on the reference normal image focusing condition to the individual control units 16, 18 and 51–57, then performs the stage-scan, and sequentially acquires the electron images of the inspection target regions. The electron image is obtained per unit region having the same layout as the normal wire portion region from which the reference normal image is obtained. The obtained electron image is then subjected to predetermined signal processing in the image signal processing unit 58, and supplied to the configuration judging unit 86.

Figure 28:
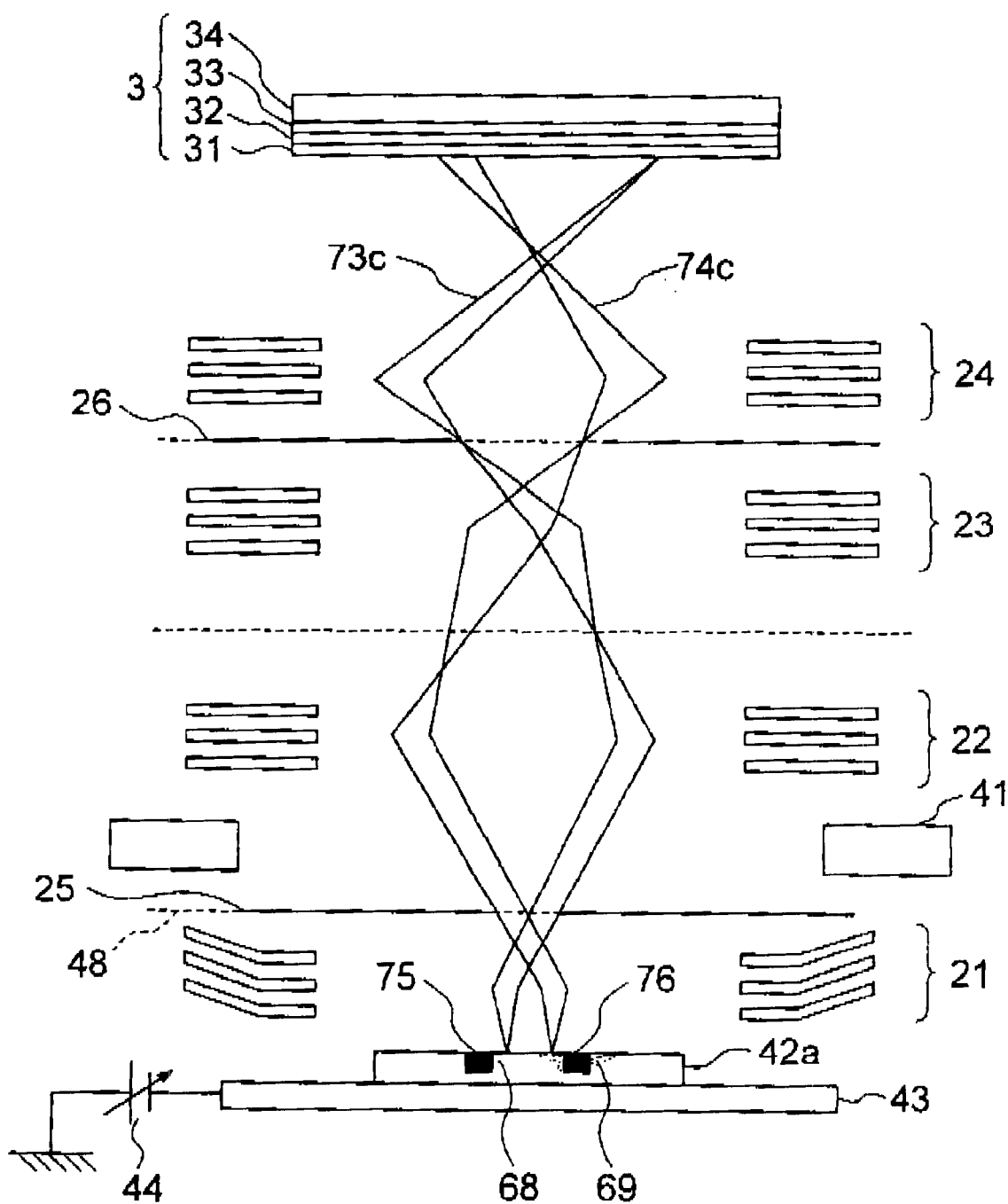
FIG. 28 is a schematic view showing a seventh embodiment of the substrate inspecting method of the present invention.
Figure 29:
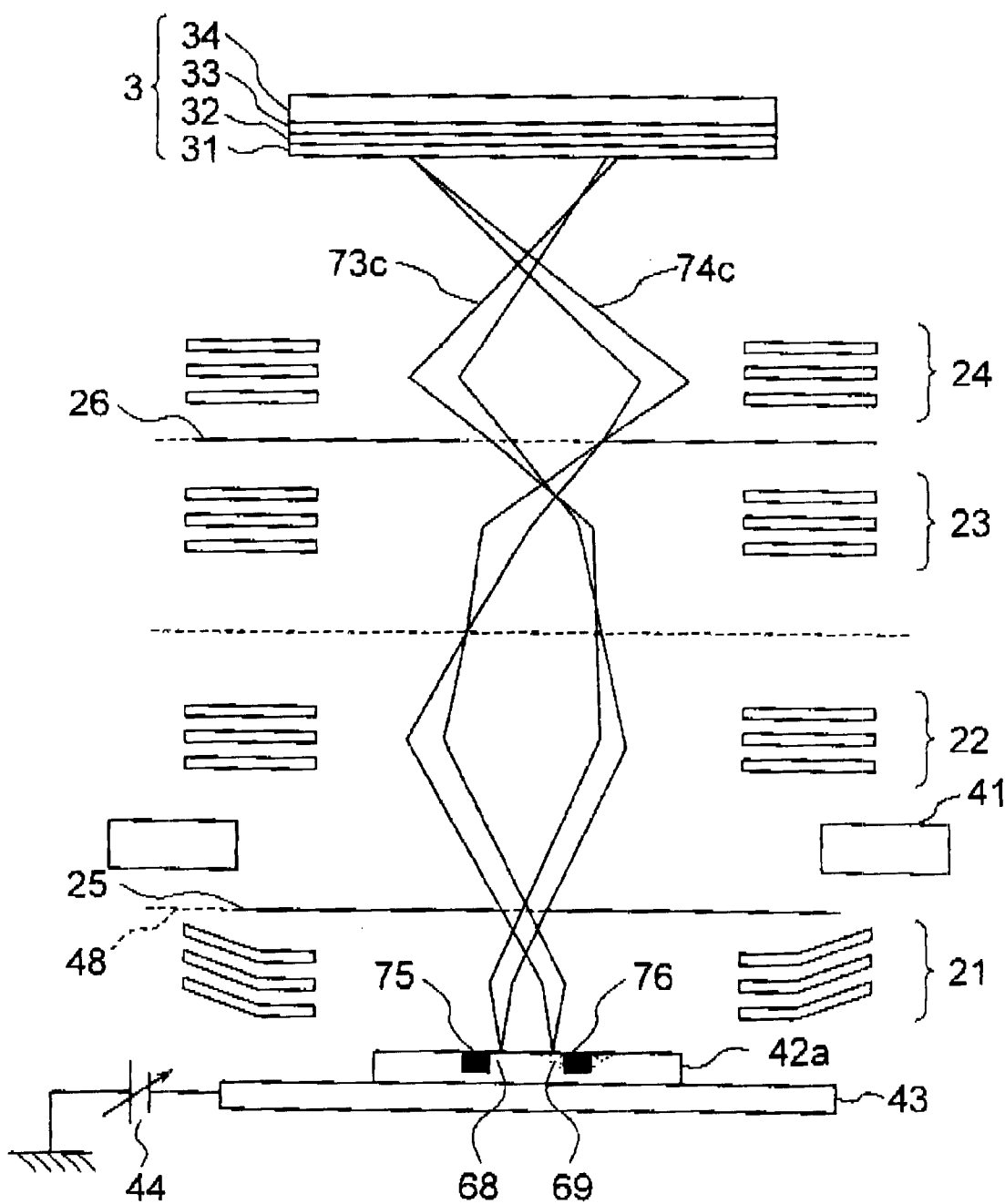
FIG. 29 is a schematic view showing the seventh embodiment of the substrate inspecting method of the present invention.

Metal wires 75, 76 ate formed on a wafer 42a shown in FIGS. 28 and 29 by a damascene process. The peripheral region to the metal wire 76 is a region 69 contaminated with acid and a wire metal in a CMF (Chemical Mechanical Polishing) process in the damascene process, while the region peripheral to the metal wire 75 is a non-contaminated region 68 having no such contamination. The contamination of the peripheral portion of the metal wire exerts an influence on a circuit characteristic due to changes in dielectric constant and resistance value as well, and hence it is of importance to judge whether or not a quantity of the contamination is small enough to meet the circuit characteristic based on the specification required. As shown in FIG. 28, the image focusing condition of the secondary beams becomes different corresponding to the contaminated region 69 and the non-contaminated region 68. It may be therefore possible to judge whether or not the circuit formed in a region relative to the contaminated regions satisfies the required specification by obtaining the image correspondent to the region under the image focusing condition for focusing the secondary beams emitted from the contaminated region exhibiting the contamination quantity, which does not meet the required specification, into the image on the electron detector. That is, if there is no region of which the electron image is obtained and properly formed, it is to be judged that the circuit relative to the contaminated region satisfies the required specification. If there exists a region of which the electron image is properly formed, it is to be judged that the circuit does not satisfy the required specification.

Figure 30:
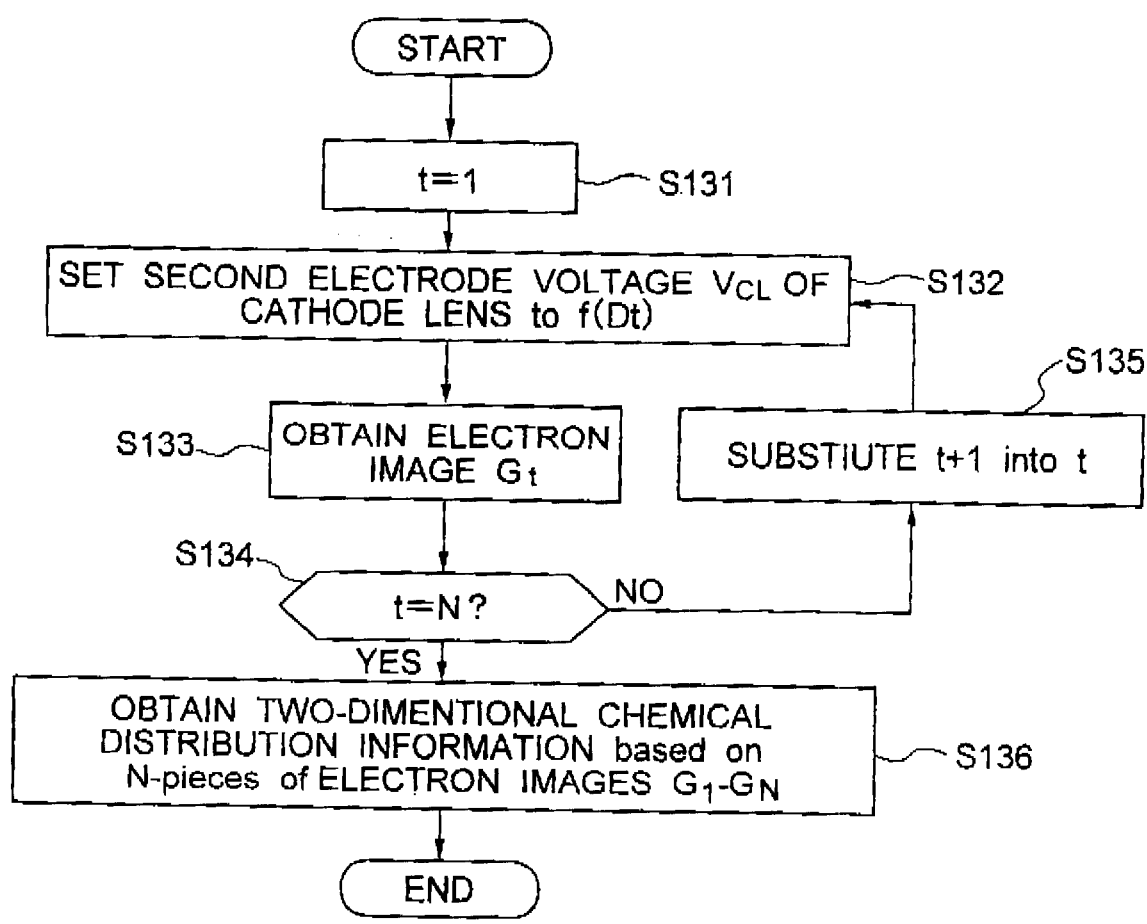
FIG. 30 is a flowchart showing the seventh embodiment and a tenth embodiment of the substrate inspecting method of the present invention.

A method of detecting the contaminated region on the basis of the substrate inspecting method in the seventh embodiment will be specifically described referring to a flowchart in FIG. 30. Referring to FIG. 30, N is the number of the electron images to be obtained, Dt is a chemical parameter which will be explained later on, $D_1$–$D_N$. represents a measurement range, Gt indicates a t-th electron image, and $V_{CL}$ is a voltage (V) applied to the second electrode of the cathode lens 21. Further, there is established a relationship such as $V_{CL}$=f(Dt). Note that the voltage $V_{CL}$, applied to the second electrode of the cathode lens 21 is selected as an image focusing condition of the secondary optical system for simplifying the discussion in the seventh embodiment, however, without being confined to this mode, the contaminated region can be detected by controlling other constructive elements of the secondary optical system such as, e.g., the second lens 22, the third lens 23 and the fourth lens 24 or the Wien filter 41.

To begin with, the range $D_1$–$D_N$ of the chemical parameter Dt is set. In accordance with the seventh embodiment, the parameter $D_1$–$D_N$ is set with respect to a range of density of the contamination which does not meet the circuit characteristic corresponding to the specification required.

Next, a sample is analyzed off-line, then a relationship between $V_{CL}$ and the contamination density is evaluated, and there is made a specific calculation about the relationship of $V_{CL}$=f(Dt). The sample for use may be, e.g., a wafer manufactured in the actual processes and including a metal contaminated region, or a wafer with a defect intentionally formed by the metal contamination.

Next, the inspecting condition input unit 87 inputs the positional information on the inspection target region, the chemical property parameter Dt ($D_1$–$D_N$), the relationship of $V_{CL}$=f(Dt), and N is the number of the electron images to be obtained.

Subsequently, as shown in FIG. 30, when t=1, the image obtainment command unit 82 substitutes the parameter $D_1$ into Dt (step S131), and the voltage $V_{CL}$ applied to the second electrode of the cathode lens 21 is set to f($D_1$) (step S132). Under this image focusing condition, a predetermined region on the surface of the substrate 42 is irradiated with the electron beams while moving the stage 43, thereby obtaining the first electron image G1 (t=1; $G_1$). This electron image is stored in the memory 61 (step S133). Upon gaining the electron image, the image obtainment command unit 82 judges by comparing t with N whether the measurement is finished or not (step S234). When judging that the measurement is not yet finished, the image obtainment command unit 82 substitutes t+1 into t (step S135). The command unit 82 also substitutes the chemical property parameter $D_2$, into Dt, thus obtains a next electron image Gt (t=2; $G_2$) by varying the image focusing condition by a value corresponding to a change in the above chemical property parameter, and makes the memory 61 stored with this electron image (steps S132, S133).

When t comes to N and judging that the measurement is finished (step S134), the image obtainment command unit 82 outputs a control signal indicating the end of the measurement. The chemical property judging unit 88, upon receiving this control signal, reads N-pieces of electron images $G_1$–$G_N$. from the memory 61, then obtains two-dimensional chemical property distribution information by synthesizing these electron images, makes the memory 61 stored with this item of distribution information, and displays it on the display unit 60 through the image display-processing unit 66 (step S136). Herein, the range of the image focusing condition of the secondary optical system is set to the range of the image focusing condition for focusing the secondary beams emitted from the contaminated region into the image on the electron detector, and hence two-dimensional contamination distribution information is obtained as the two-dimensional chemical property distribution information.

Thus, the substrate inspecting system 70 in the sixth embodiment outputs the two-dimensional contamination distribution information indicating a state of the contamination on the substrate and is therefore capable of obtaining the electron image of the contaminated region and the positional information thereof together with the contamination level. This makes it feasible to promptly judge whether or not each circuit portion satisfies the specification required, and to easily specify the manufacturing process with the occurrence of the contamination. As a result, it is possible to quickly save from the defect by utilizing a redundant circuit and detect a cause of the occurrence of the contamination. Note that the electron images each obtained per chemical property parameter may be displayed in sequence and synthesized on the display unit 60 instead of displaying the two-dimensional chemical property distribution chart created by synthesizing all the electron images after finishing the measurement.

Further, the substrate inspecting system 70 in the sixth embodiment is, as in the fifth embodiment, capable of obtaining the chemical property information on the substrate by comparing the electron images with each other which have been acquired from the unit regions arranged in the same layout. This method will be explained by way of an eighth embodiment of the substrate inspecting method of the present invention with reference to schematic views in FIGS. 32A–32D and flowcharts in FIGS. 33 and 34.

Figure 31:
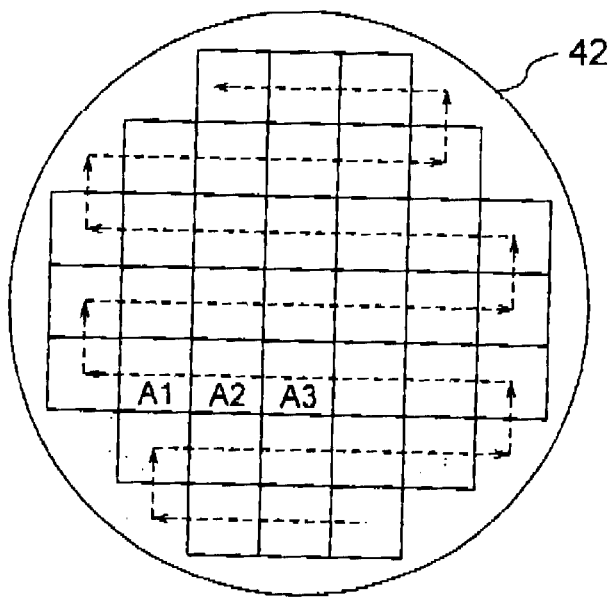
FIG. 31 is an explanatory schematic view showing the substrate inspecting method of the present invention.
Figures 32A, 32B, 32C:
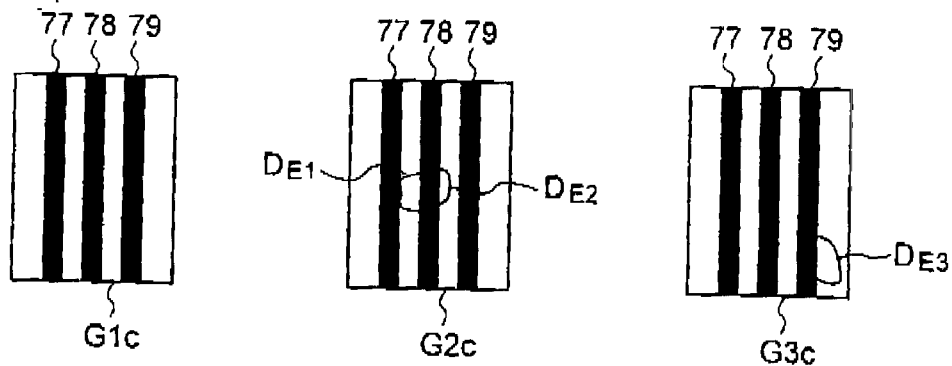
FIGS. 32A–32D are schematic views showing an eighth embodiment of the substrate inspecting method of the present invention.

FIG. 32A shows an electron image G1c of an adequately formed unit region including no contaminated region in the area on the wafer 42. FIG. 32B shows an electron image G2c of a unit region formed with a contaminated region $D_{E1}$ in an insulator region between the metal wires 77 and 78 and a contaminated region $D_{E2}$ in an insulator region between the metal wires 78 and 79. Furthermore, FIG. 32C shows an electron image G3c of a unit region formed with a contaminated region $D_{E3}$ in an insulator region disposed outwardly of the metal wire 79. Incidentally, FIG. 31a is the same as FIG. 31 and given again for an explanatory convenience.

Figure 33:
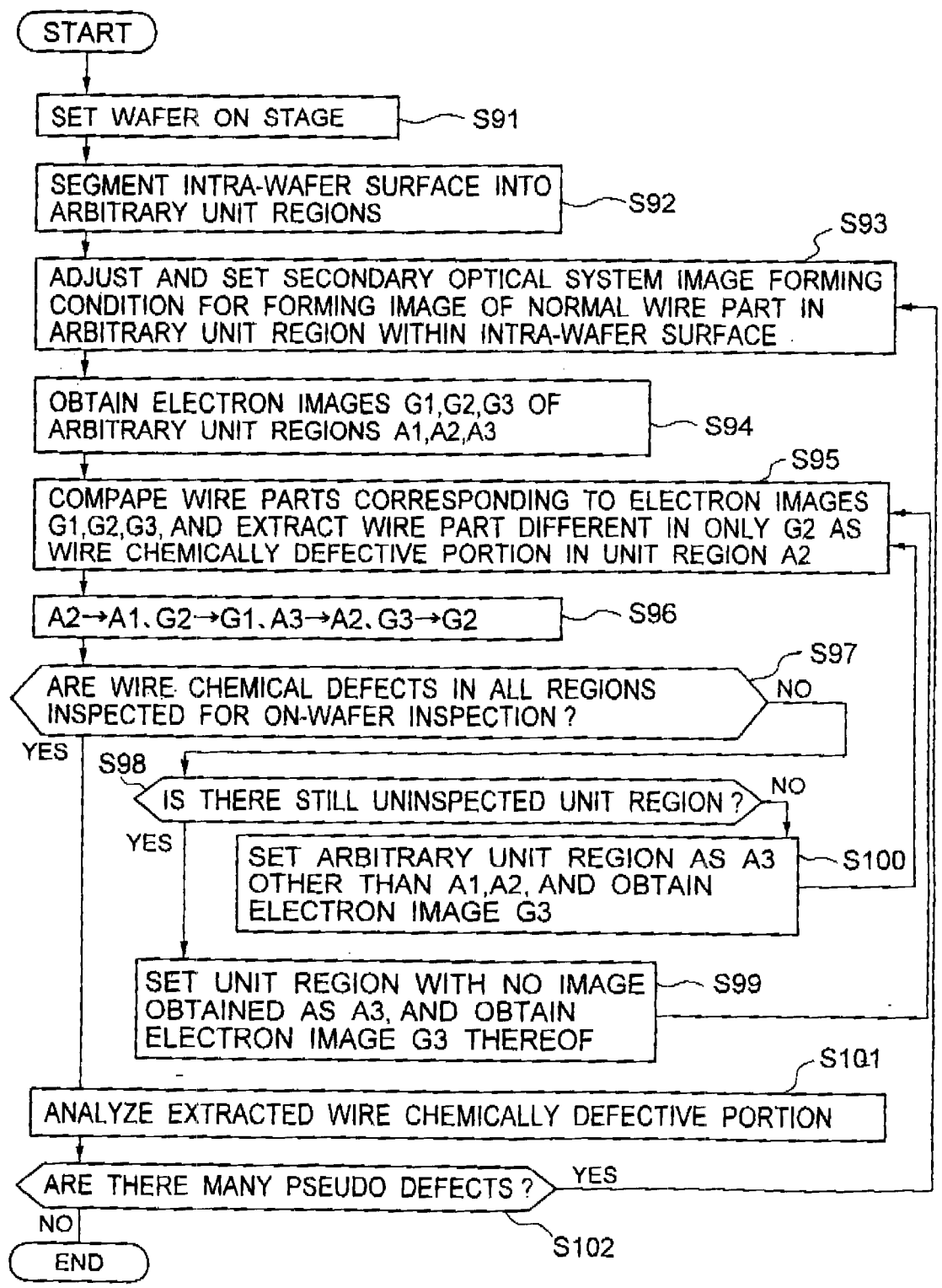
FIG. 33 is a flowchart showing the eighth embodiment of the substrate inspecting method of the present invention.

Further, the flowchart in FIG. 33 is approximate to the flowchart in FIG. 25, wherein the steps with numerals 90s and 100s excluding steps S97 and S101 are substantially the same as the steps with the numerals each plus 40 in FIG. 25. Similarly in the flowchart in FIG. 34, the steps with numerals 110s excluding steps S115, S117 are the same as the steps with the numerals each plus 40 in FIG. 26. Accordingly, the different steps from the flowcharts in FIGS. 25 and 26 will be focused on in the following discussion.

At first, as shown in FIG. 33, the wafer 42 is set on the stage, and the intra-surface of the wafer is segmented into arbitrary unit regions (see FIG. 31) (steps S91, S92).

Next, there is got and inputted the image focusing condition of the secondary optical system, under which the secondary beams emitted from the non-contaminated region is to focus the image on the electron detector, and the image embodiment command unit 82 adjusts control values of the respective control units 16, 17 and 51 through 57 (step S93).

Subsequently, the image obtainment command unit 82 generates control signals to irradiate, as respectively shown in FIGS. 32A–32C, arbitrary three unit regions A1, A2, A3 with the electron beams under the image focusing condition set in the above procedure, thus obtains image signals of electron images G1c, G2c, G3c of these unit regions, and stores the memory 61 with these image signals (step S94).

Figure 32D:
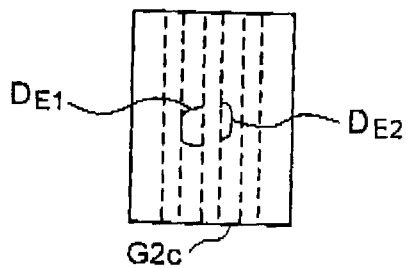

The chemical property judging unit 88 reads those electron images G1c, G2c, G3c from the memory 61, then compares wire portions corresponding thereto with each other, subsequently extracts the different wire portions (which are $D_{E1}$ and $D_{E2}$ in an example illustrated in FIG. 32D) in only the electron image G2c as chemical property defective portions within the unit region A2, and stores the memory 61 with these defective portions (step S95).

Next, the chemical property judging unit 88 deletes pieces of information about the unit region A1 and the electron image G1c from the memory 61, and makes the previous unit region A2 and electron image G2c stored as a new unit region A1 and a new electron image G1c thereof. The chemical property judging unit 88 similarly makes the previous unit region A3 and electron image G3c stored as a new unit region A2 and a new electron image G2c thereof (step S96).

Next, the image obtainment command unit 82 judges whether or not the chemical properties in all the inspection target regions are inspected to detect their defects (step S97). If the inspections of the defects in all the target regions are not yet finished and if there is an uninspected region (step S98), the image obtainment command unit 82 sets a unit region with no image obtained as a new unit region A3, and obtains an electron image G3c thereof (step S99). The chemical property judging unit 88 extracts the defective chemical property portion within the new unit region A2 and stores the memory 61 with this defective portion. In an example shown in FIG. 32C, with this processing, the electron image G3c in FIG. 32C turns out to be an electron image G2c, thereby detecting a contaminated region $D_{E3}$.

If there is no uninspected region, the measurement command unit 64 sets the unit region A2 just anterior and the electron image G2c thereof as a new unit region A1 and a new electron image G1c thereof, and similarly sets the unit region A3 just anterior and the electron image G3c thereof as a new unit region A2 and a new electron image G2c thereof (steps S95–S98). Thereafter, the measurement command unit 64 selects as a final unit region A3 an arbitrary unit region other than those unit regions A1, A2 just anterior within the inspection target area, and obtains an electron image G3c thereof (step S100). Then, a chemical property defective portion in the electron image G2c of the final unit region A2 would be extracted and stored in the memory 61 (step S95).

Upon finishing-the inspections of the chemical property defects in all the inspection target regions on the wafer 42 (step S97), the image obtainment command unit 82 notifies the chemical property judging unit 88 of the end-of-inspection information, and the chemical property judging unit 88 reads the information on the chemical property defective portions from the memory 61 and analyzes the information (step S101). Specifically, as in the fifth embodiment discussed above, a numerical value of pseudo defects is judged from a comparison with a predetermined threshold value based on an empirical value and so on (step S102), if judging that there are many pseudo defects, a loop process of steps S93 through S102 is repeated. Whereas if judging that there are a small number of pseudo defects, the image focusing condition set last is judged valid, and the image focusing condition adjusting flow comes to an end.

Next, the stage-scan is again executed based on the secondary optical system image focusing condition determined in the image focusing condition adjusting flow described above, and the chemical property defect on the wafer 42 is actually detected.

Figure 34:
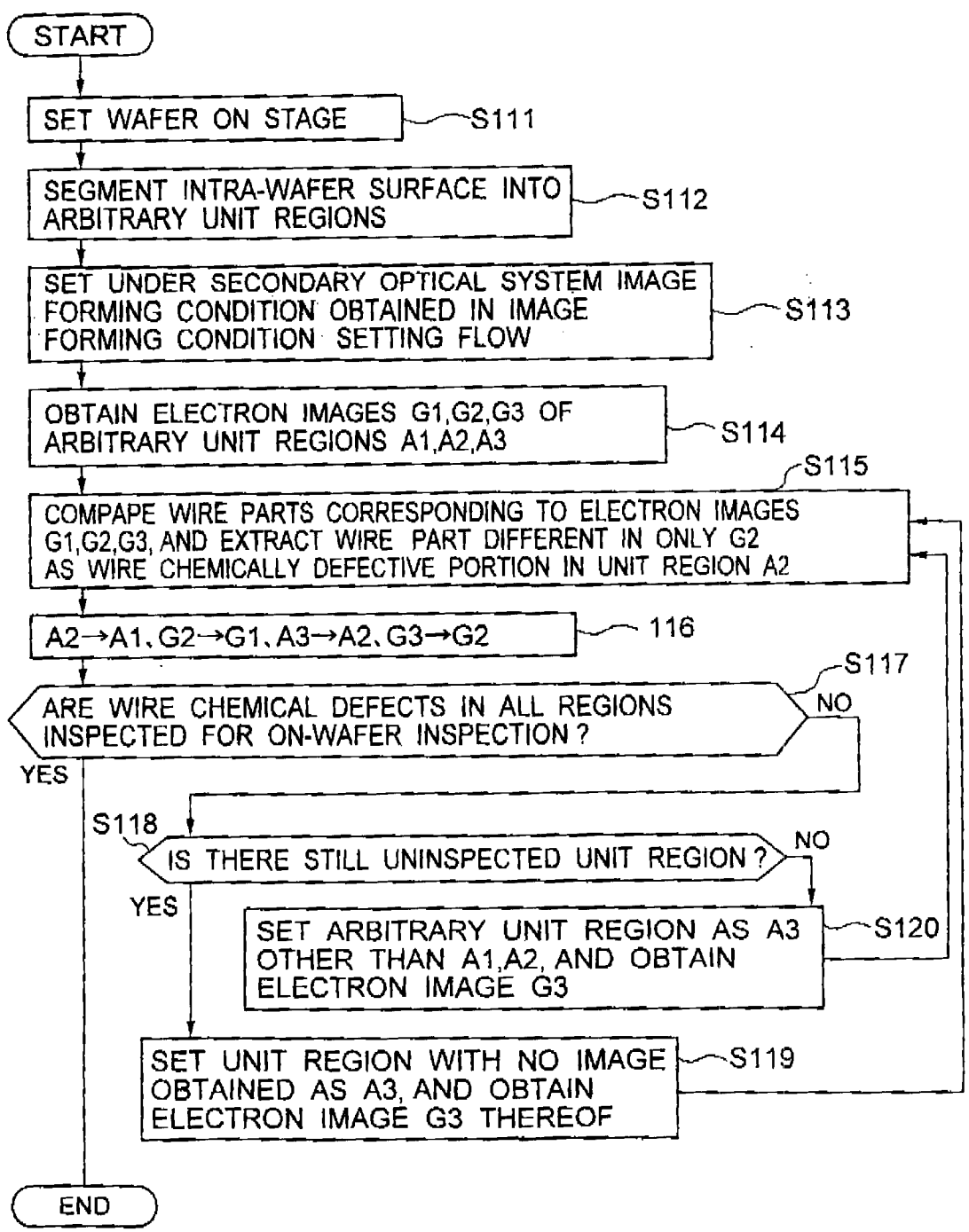
FIG. 34 is a flowchart showing the eighth embodiment of the substrate inspecting method of the present invention.

To start with, as shown in FIG. 34, the wafer 42 is set on the stage, and the intra-surface area of the wafer is segmented into arbitrary unit regions (see FIG. 31) (steps S111, S112).

Next, the image obtainment command unit 82 generates the control signals according to the image focusing condition of the secondary optical system which has been obtained in the image focusing condition setting flow described above, and transmits these control signals to the respective control units 16, 17 and 51–57 (step S113). Then, arbitrary three unit regions A1, A2, A3 are irradiated with the electron beams under the secondary optical system image focusing condition, and the image obtainment command unit 82 obtains image signals of the electron images G1c, G2c, G3c of these arbitrary three unit regions A1, A2, A3 and stores the memory 61 with these image signals (step S114).

Next, the chemical property judging unit 88 reads these electron images G1e, G2c, G3c from the memory 61, and compares the wire portions corresponding thereto. Then, the chemical property judging unit 88 extracts the wire portion (see FIG. 32D) that is different in only the electron image G2c as a chemical property defective portion within the unit region A2, and stores the memory 61 with this defective portion (step S115). The wire portion including the contaminated regions $D_{E1}$, $D_{E2}$ is thereby detected.

Next, the chemical property judging unit 88 deletes pieces of information about the unit region A1 and the electron image G1c from the memory 61, and makes the previous unit region A2 and electron image G2s stored as a new unit region A1 and a new electron image G1c thereof. The chemical property judging unit 88 similarly makes the previous unit region A3 and electron image G3c stored as a new unit region A2 and a new electron image G2c thereof (step S116).

Subsequently, the image obtainment command unit 82 judges whether or not the chemical properties in all the inspection target regions on the wafer 42 are inspected to detect their defects (step S117). If the inspections of the defects in all the target regions are not yet finished, it is judged whether or not there exists an uninspected unit region (step s118). If there is the uninspected region, the unit region with no image obtained is set as a new unit region A3, then the stage 43 is moved, and an electron image G3c thereof is gained (step S119). The electron image G3c is given to the memory 61 and the chemical property judging unit 88 as well. The chemical property judging unit 88 extracts the chemical property defective portion within the new unit region A2 in accordance with the procedure given in step S115, and stores the memory 61 with this defective portion.

The chemical property defect inspection described above is carried out with respect to all the inspection target regions on the wafer 42 (step S117). The procedure in the case of the defect inspection being unfinished with respect to all the target regions (steps S118 through S120), is substantially the same as the procedure shown in FIG. 26 (steps S78 through 580). A different point is that the defective portion is extracted not by the configuration judging unit 86 but by the chemical property judging unit 88, and that the electron images are not G1b, G2b, G2b but G1c, G2c, G2c.

When finishing the inspections of the chemical property defects with respect to all the inspection target regions (step S117), the image obtainment command unit 82 reads the information about the chemical property defective portions from the memory 61, and displays these portions on the display unit 60 through the image display processing unit 66. The defect inspections are thus ended.

According to the substrate inspecting method in the eighth embodiment discussed above, the image focusing condition of the secondary optical system is adjusted by comparing the plurality of electron images with each other which have been obtained from the unit regions arranged in the same layout. However, in a case where the electron image of the normal wire portion exhibiting no defect can be obtained as in the case of the region 68 illustrated in FIGS. 28 and 29, this image is stored as a reference normal image in the memory 61. The chemical property defect can be checked based on a pixel value of this reference normal image. This method will be explained referring again to FIG. 27 by way of a ninth embodiment of the substrate inspecting method of the present invention.

To begin with, the memory 61 is stored with the reference normal image. The image focusing condition of the reference normal image when this reference normal image is obtained, is inputted from the inspecting condition input unit 87. Information on the inspection target regions on the wafer 42 are also inputted from the inspecting condition input unit 87.

The image obtainment judging unit 82 transmits the control signals based on the reference normal image focusing condition to the individual control units 16, 17 and 51–57, then performs the stage-scan, and sequentially acquires the electron images of the inspection target regions. The electron image is obtained per unit region having the same layout as the non-contaminated region from which the reference normal image is obtained. The obtained electron image is then subjected to predetermined signal processing in the image signal processing unit 58, and supplied to the chemical property judging unit 88.

The chemical property judging unit 88 reads the reference normal image from the memory 61 and sequentially compares, with this reference normal image, the electron image per unit region which has been supplied from the image signal processing unit 58 under the processes described above. As a result of the comparing process, a region having the chemical property defect due to the contamination in the insulator region, might appear as an image fragment of the electron image which has a pixel value different from the pixel value of the non-contaminated region as the image G2c is schematically illustrated in FIG. 32B as in the case of the region 69 shown in FIGS. 28 and 29. Thus, if there exists the inspection target region from which the electron image is obtained containing the image fragment having the different pixel value from others whereas all the electron image should properly have the same pixel value, an electron image of this region is stored in other location on the memory 61 as a chemical property defective region together with a piece of positional information thereof.

Upon an end of the stage-scans with respect to the all the inspection target regions on the surface of the wafer 42, the image obtainment command unit 82 reads from the memory 61 the electron image and the positional information of the chemical property defective region which have been stored in the memory 61, and displays them on the display unit 60 through the image display processing unit 66.

Further, the substrate inspecting system 70 in the ninth embodiment is also capable of detecting whether or not a metal oxide layer is formed on the surface of the metal wire.

Figure 35:
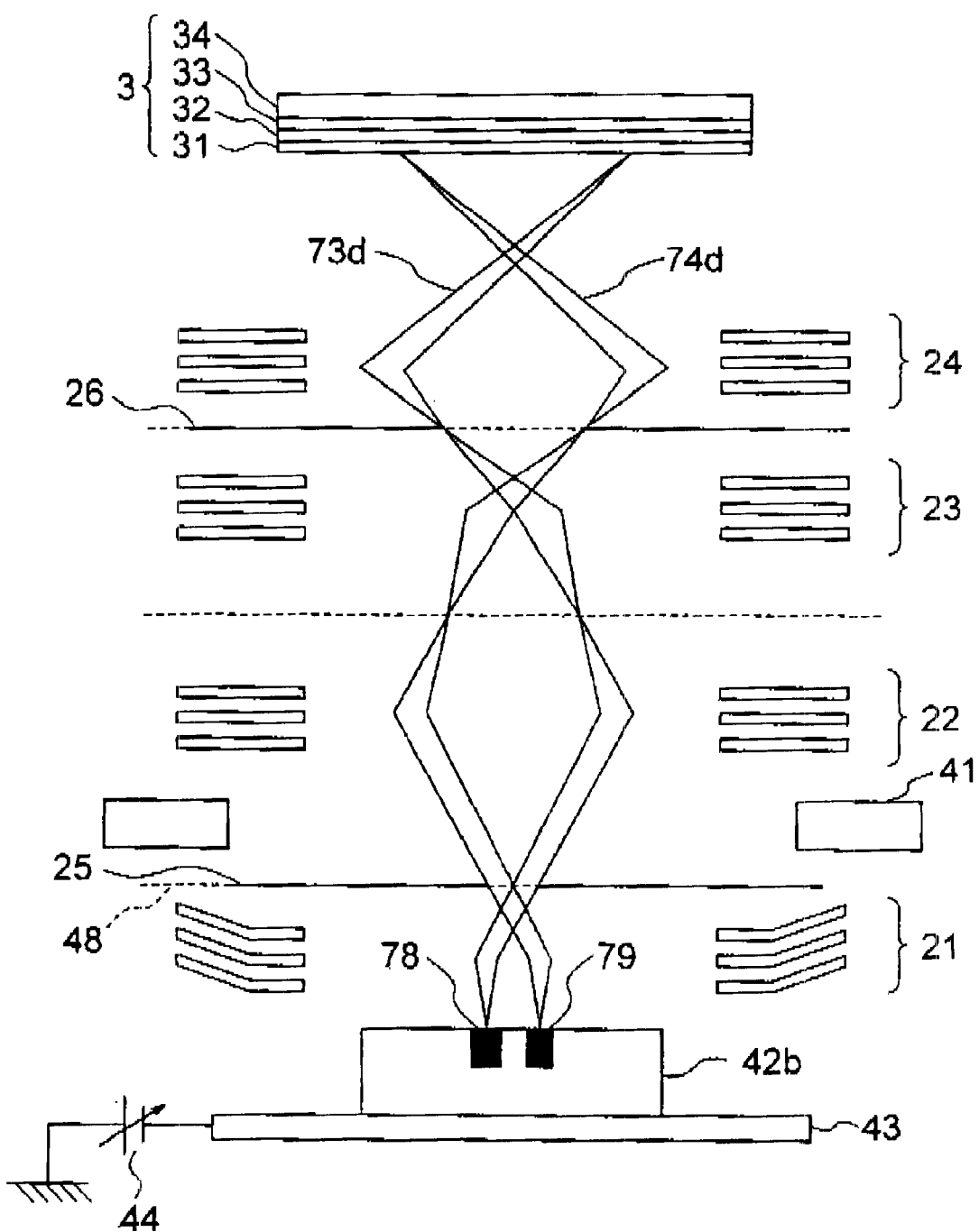
FIG. 35 is an explanatory schematic view showing a tenth embodiment of the substrate inspecting method of the present invention.
Figure 36:
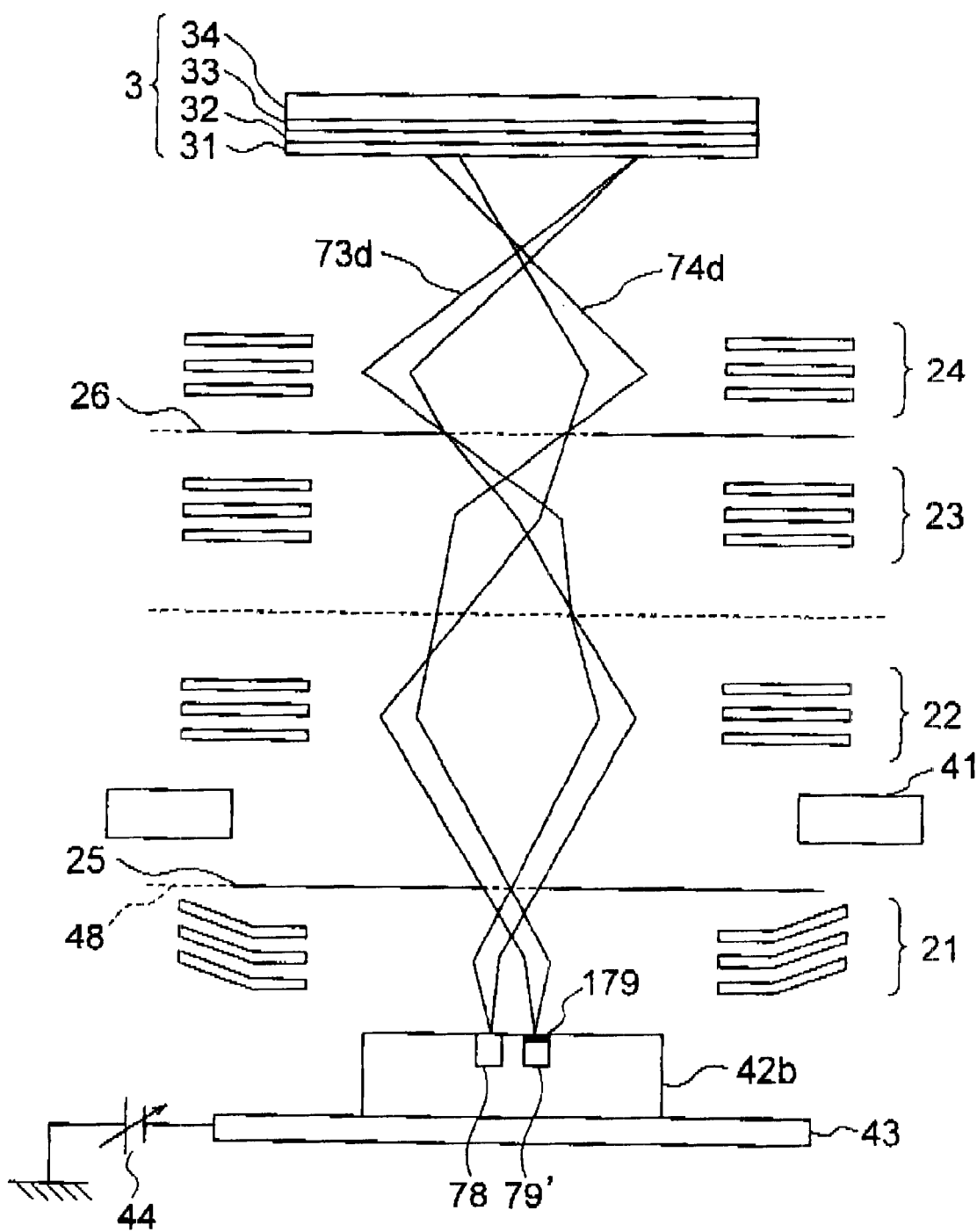
FIG. 36 is an explanatory schematic view showing the tenth embodiment of the substrate inspecting method of the present invention.

For example, metal wires 78, 79 formed on a wafer 42b are shown in FIG. 36. The metal wire 78 is formed normally as designed. On the other hand, the surface of the metal wire 79 is formed with a metal oxide layer 179 due to oxidation thereof, with the result that the wire 79 becomes a defective metal wire 79'. As illustrated in FIG. 35, if the metal wires 78, 79 are normally formed, the electron images thereof can be obtained under the same image focusing condition. If there exists the defective metal wire 79' as shown in FIG. 36, however, an image focusing condition of secondary beams 73d for the normal metal wire 78 is different from an image focusing condition of secondary beams 74d for the defective metal wire 79'.

Figure 37:
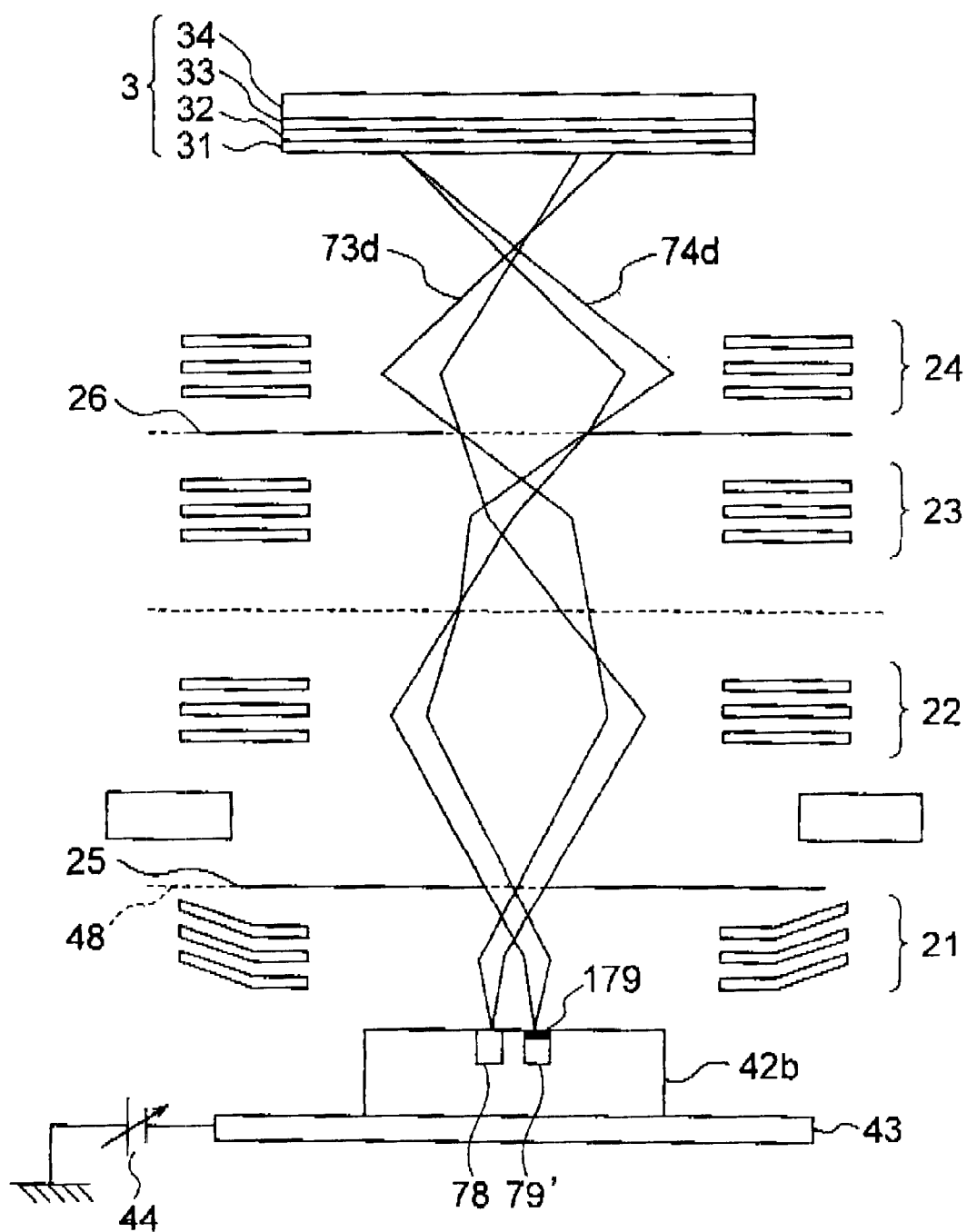
FIG. 37 is an explanatory schematic view showing the tenth embodiment of the substrate inspecting method of the present invention.

Such being the case, as illustrated in FIG. 37, an image focusing condition, under which the secondary beams 74d emitted from the defective metal wire 79' adequately focusing into the image on this electron detector, is inputted from the inspecting condition input unit 87, and the stage-scan is performed in accordance with the procedure shown in a flowchart in FIG. 30, whereby it is possible to obtain the electron image of the metal wire including the metal oxide layer formed on the surface thereof.

This method will be described by way of a tenth embodiment of the substrate inspecting method of the present invention.

In the tenth embodiment, a chemical property parameter Dt shown in FIG. 30 is a layer thickness of the metal oxide layer formed on the surface of the metal wire, and a measurement range is defined by parameters $D_1$–$D_N$ depending on a layer thickness range which does not satisfy a circuit characteristic corresponding to the specification required. The symbols $G_p$, $V_{CL}$ are the same as those described in FIG. 13, and the repetitive explanations are herein omitted. Further, there is established a relationship such as $V_{CL}=f(Dt)$.

At the first onset, the range $D_1$–$D_N$ of the chemical parameter Dt is set. To be specific, there is analyzed off-line, for instance, a wafer manufactured in the actual processes in which the oxide layer is formed on the surface of the metal wire, or a wafer containing a defective portion intentionally formed due to the metal oxide layer. Then, a relationship between $V_{CL}$ and a thickness of the metal oxide layer is evaluated, and there is performed a specific calculation about the relationship of $V_{CL}=f(Dt)$.

Next, the inspecting condition input unit 87 inputs the positional information of the inspection target region, the chemical property parameter Dt ($D_1$–$D_N$), the relationship of $V_{CL}=f(Dt)$, and the number N of the electron image to be obtained.

A specific procedure thereafter is the same as that shown in a flowchart in FIG. 30, and hence the repetitive explanations in depth are herein omitted.

In the tenth embodiment, the range of the image focusing condition of the secondary optical system is set to a range of the image focusing condition under which the secondary beams emitted from the metal wire containing the metal oxide layer formed on the surface thereof focus into the image on the electron detector 3, so that a two dimensional metal oxide layer distribution chart is gained as the two-dimensional chemical property distribution information.

Thus, the substrate inspecting system 70 according to the sixth embodiment outputs the two-dimensional metal oxide layer distribution information indicating the distribution of the metal oxide layer which might be formed on the surface of the metal wire on the substrate, and is therefore capable of obtaining the electron image, and the positional information of the metal oxide layer together with a value of the layer thickness, it is therefore feasible to promptly judge whether or not each circuit portion satisfies the specification required, and to specify the manufacturing process with the occurrence of the metal oxidation. As a consequence, it is possible to quickly save from the defect by utilizing a redundant circuit and detect a cause of forming the metal oxide layer. Note that the electron images each obtained per image focusing condition may be sequentially displayed in superposition and synthesized on the display unit 60 instead of displaying the two-dimensional chemical property distribution chart created by synthesizing all the electron images after finishing the measurement.

Further, the substrate inspecting system 70 in accordance to the sixth embodiment is, as the substrate inspecting method in the eighth embodiment discussed above, capable of obtaining the information on the metal oxide layer formed on the surface of the metal wire by comparing the electron images with each other which have been acquired from the unit regions arranged in the same layout. This method will be explained by way of an eleventh embodiment of the substrate inspecting method of the present invention with reference to schematic views in FIGS. 38 and 32A–32D and flowcharts in FIGS. 33 and 34. Incidentally, FIG. 38 is the same as the schematic view in FIG. 23 and again given for an explanatory convenience.

A processing flow for obtaining the information about the oxide layer formed on the surface of the metal wire in accordance with the eleventh embodiment, is substantially the same as the flow in the eighth embodiment discussed above, and hence, in the following discussion, an emphasis is put on only different points.

To begin with, according to the image forming condition adjusting flow shown in FIG. 33, an image focusing condition of the secondary optical system, under which the secondary beams emitted from the metal wire containing no metal oxide layer formed on the surface thereof focus into the image on the electron detector 3, is set as an initial condition (step S93).

Figure 38:
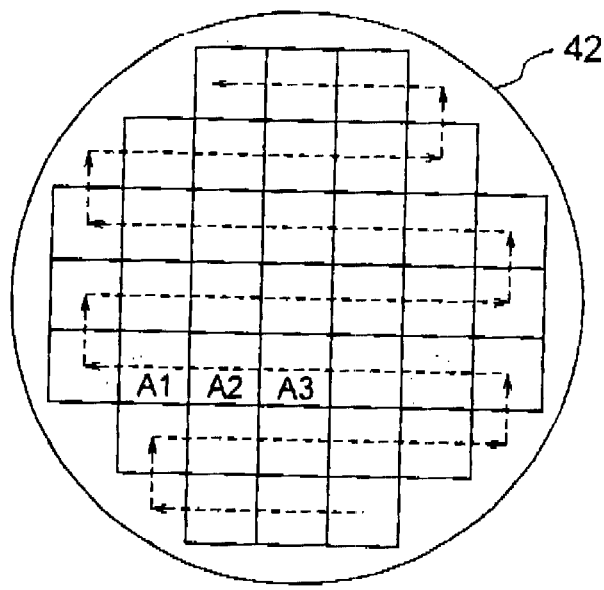
FIG. 38 is an explanatory schematic view showing the substrate inspecting method of the present invention.
Figures 39A, 39B, 39C:
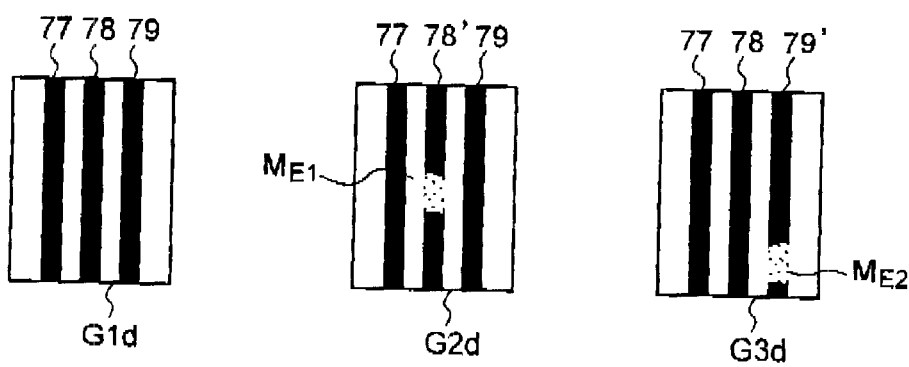
FIGS. 39A–39D are schematic views showing an eleventh embodiment of the substrate inspecting method of the present invention.

FIGS. 39A–39C respectively show specific examples of the electron images obtained from arbitrary three unit regions A1, A2, A3 exemplified in FIG. 38. That is, FIG. 39A shows an electron image G1d of an adequately formed unit region including no metal oxide layer provided on the surface of the metal wire in the area on the wafer 42. FIG. 39B shows an electron image G2d of a unit region including a metal oxide layer $M_{E1}$ formed on the surface of the metal wire 78. FIG. 39C shows an electron image G3d of a unit region including a metal oxide layer $M_{E2}$ provided on the surface of the metal wire 79.

In both of the image focusing condition adjusting flow in FIG. 33 and the chemical property defect detecting flow in FIG. 34, if electron image G2d among the electron images G1d, G2d, G3d in FIGS. 39A–39C is an electron image corresponding to the unit region A2, the chemical property judging unit 88 extracts this image as a chemical property defective portion including the metal oxide layer $M_{E1}$. If the electron image G3d is an electron image corresponding to the unit region A2, the chemical property judging unit 88 extract this image and stores it in the memory 61 as a chemical property defective portion including the metal oxide layer $M_{E2}$ (steps S95, S115). Other procedures are the same as those in the eighth embodiment of the substrate inspecting method.

Based on the substrate inspecting method in the eleventh embodiment discussed above, the image focusing condition of the secondary optical system is adjusted by comparing a plurality of electron images with each other which have been acquired from the unit regions arranged in the same layout. However, in the case of being capable of obtaining the electron image of the normal metal wire with no defect as seen in the regions 78, 79 in FIG. 35, as in the ninth embodiment described above, this image is stored as a reference normal image in the memory 61, and the chemical property can be checked based on a pixel value of this reference normal image. This method will be explained by way of a twelfth embodiment of the substrate inspecting method of the present invention with reference again to FIG. 27.

To start with, the reference normal image is stored in the memory 61, and a reference normal image focusing condition under which this reference normal image is obtained, is inputted from the inspecting condition input 87. Pieces of information about the inspection target regions on the wafer 42 are also inputted from the inspection condition input unit 87.

The image obtainment command unit 82 transmits the controls signals based on the reference normal image focusing condition to the individual control units 16, 17 and 51–57, then performs the stage-scan, and sequentially acquires the electron images of the inspection target regions. The electron image is obtained per unit region having the same layout as the contaminated region from which the reference normal image is obtained. The obtained electron image is then subjected to predetermined signal processing in the image signal processing unit 58, and supplied to the chemical property judging unit 88.

Figure 39D:
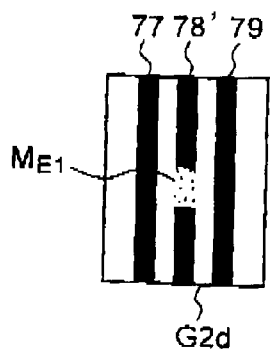

The chemical property judging unit 88 reads the reference normal image from the memory 61 and sequentially compares, with this reference normal image, the electron image per unit region which has been supplied from the image signal processing unit 58. As a result of the comparing process, a region having the metal oxide layer formed on the surface as seen in the region 79' shown in FIGS. 36 and 37, might appear as an image fragment within the electron image which has a pixel value different from a pixel value of a corresponding region in the reference normal image as the image G2d is schematically illustrated in FIG. 39D. Thus, if there exists the inspection target region from which the electron image containing the image fragment is obtained having the different pixel value from others whereas all the electron images should properly have the same pixel value, an electron image of this region as a chemical property defective region is stored in other location on the memory 61 together with a piece of positional information thereof.

Upon an end of the stage-scans with respect to the all the inspection target regions on the surface of the wafer 42, the image obtainment command unit 82 reads the electron image and the positional information of the chemical property defective region which have been stored in the memory 61, and displays them on the display unit 60 through the image display processing unit 66.

Next, a seventh embodiment of the substrate inspecting system of the present invention will be discussed referring to the drawings.

In the fourth embodiment discussed above, three pieces of electron images at the respective via-plugs are obtained and compared with each other, thus detecting a defective via-plug. Under the secondary optical system condition for causing the secondary beams coming from the normal via-plug containing no open defective portion focus into the image on the electron detector, a value of gradation of a pixel corresponding to a central point of the normal via-plug increases (the pixel appears bright) on the electron image obtained on the electron detector. On the other hand, a value of gradation of a pixel corresponding to a central point of the via-plug containing the open defective portion decreases (the pixel appears dark). Namely, there is, though having a scatter in each case, a large difference between the gradation value of the pixel of the central point of the normal via-plug and the gradation value of the pixel of the central point of the defective via-plug. Accordingly, it is feasible to determine a gradation threshold value Bth for distinguishing between the normal via-plug and the defective via-plug by making the use of that point.

A feature of the seventh embodiment lies in a point of distinguishing between a normal via-plug and a defective via-plug by obtaining pieces of information on only the gradation values of the pixels of the central points of the via-plugs, and making a comparison in terms of magnitude between the pixel gradation value of the central point of each via-plug and the gradation threshold value Bth.

Figure 40:
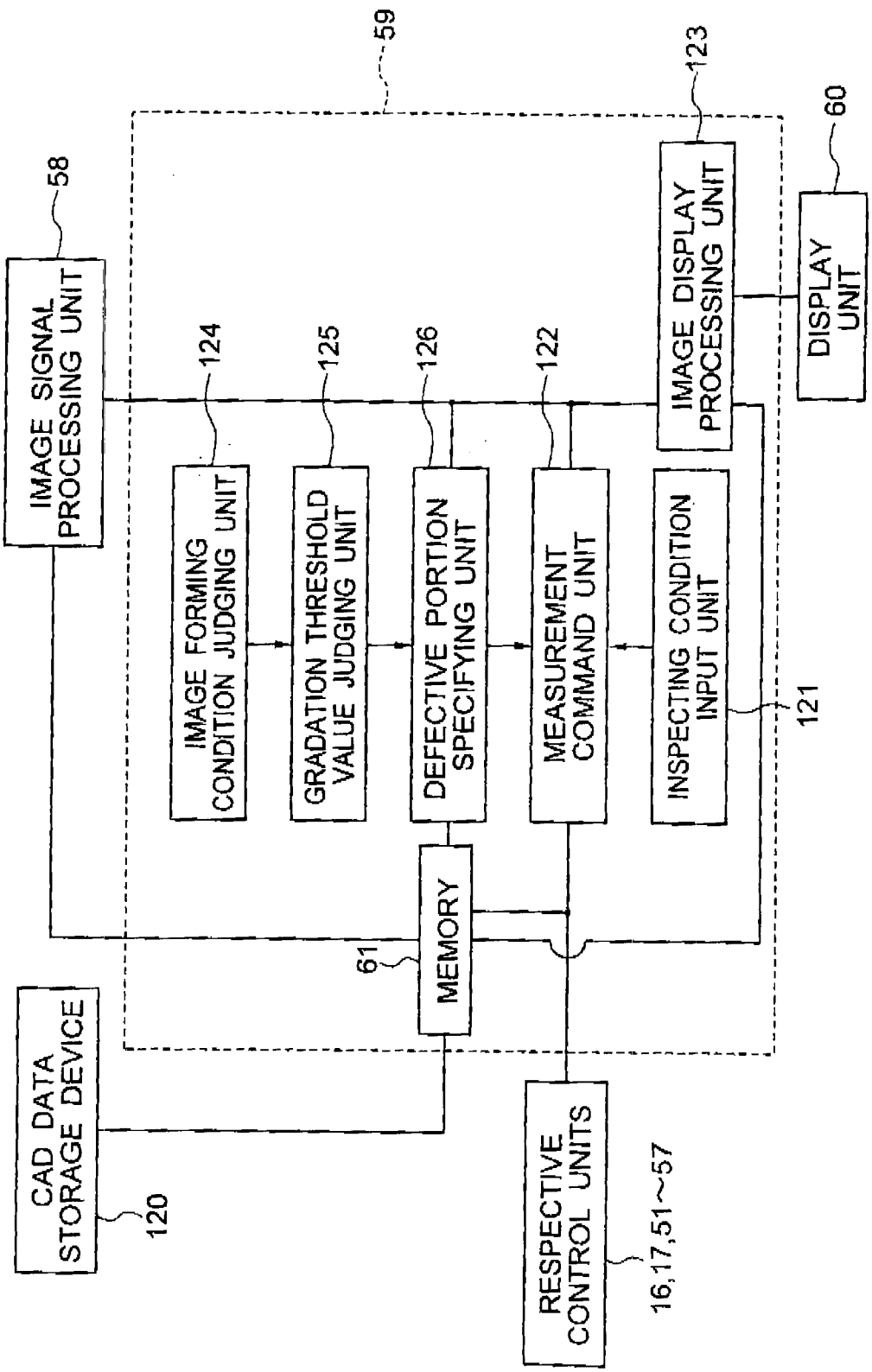
FIG. 40 is a block diagram showing the principal portion in the seventh embodiment of the substrate inspecting system of the present invention.

FIG. 40 is a block diagram illustrating a principal architecture of a substrate inspecting system 110 in the seventh embodiment. As shown in FIG. 40, the substrate inspecting system 110 includes a host computer 59 and a CAD data storage device 120. Other constructions of the substrate inspecting system 110 are substantially the same as the substrate inspecting system 200 shown in FIG. 1.

The CAD data storage device 120 is stored with design information containing a layout of an integrated circuit provided on the inspection target substrate, Particularly, pieces of data of central coordinates of the respective via-plugs in a stage coordinate system are converted into those in a wafer coordinate system, and thus stored in the storage device 120. The coordinates after the conversion are hereinafter be called on-wafer coordinates.

The host computer 59 shown in FIG. 40 includes a gradation threshold value judging unit 125 characteristic of the seventh embodiment in addition to an inspecting condition input unit 121, a measurement command unit 122, an image focusing condition judging unit 124, a defective portion specifying unit 126, an image display processing unit 123 and the memory 61.

The gradation threshold value judging unit 125, as will be mentioned later on, outputs the gradation threshold value Bth for specifying a defective portion in a desired region within the electron image on the basis of the pixel gradation data.

Figure 41:
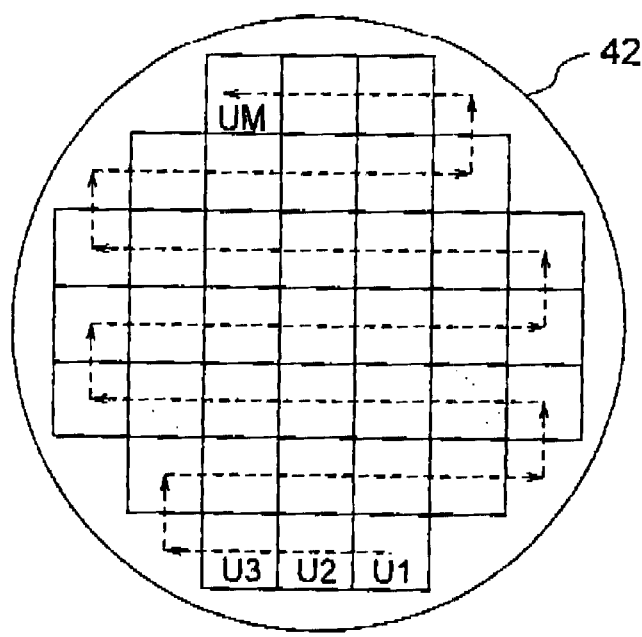
FIG. 41 is an explanatory schematic view showing the substrate inspecting method of the present invention.
Figure 42:
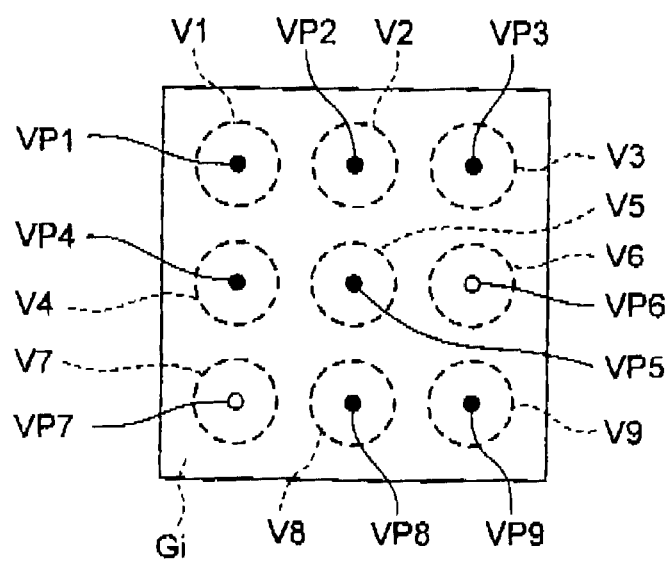
FIG. 42 is a schematic view showing a thirteenth embodiment of the substrate inspecting method of the present invention.
Figure 43:
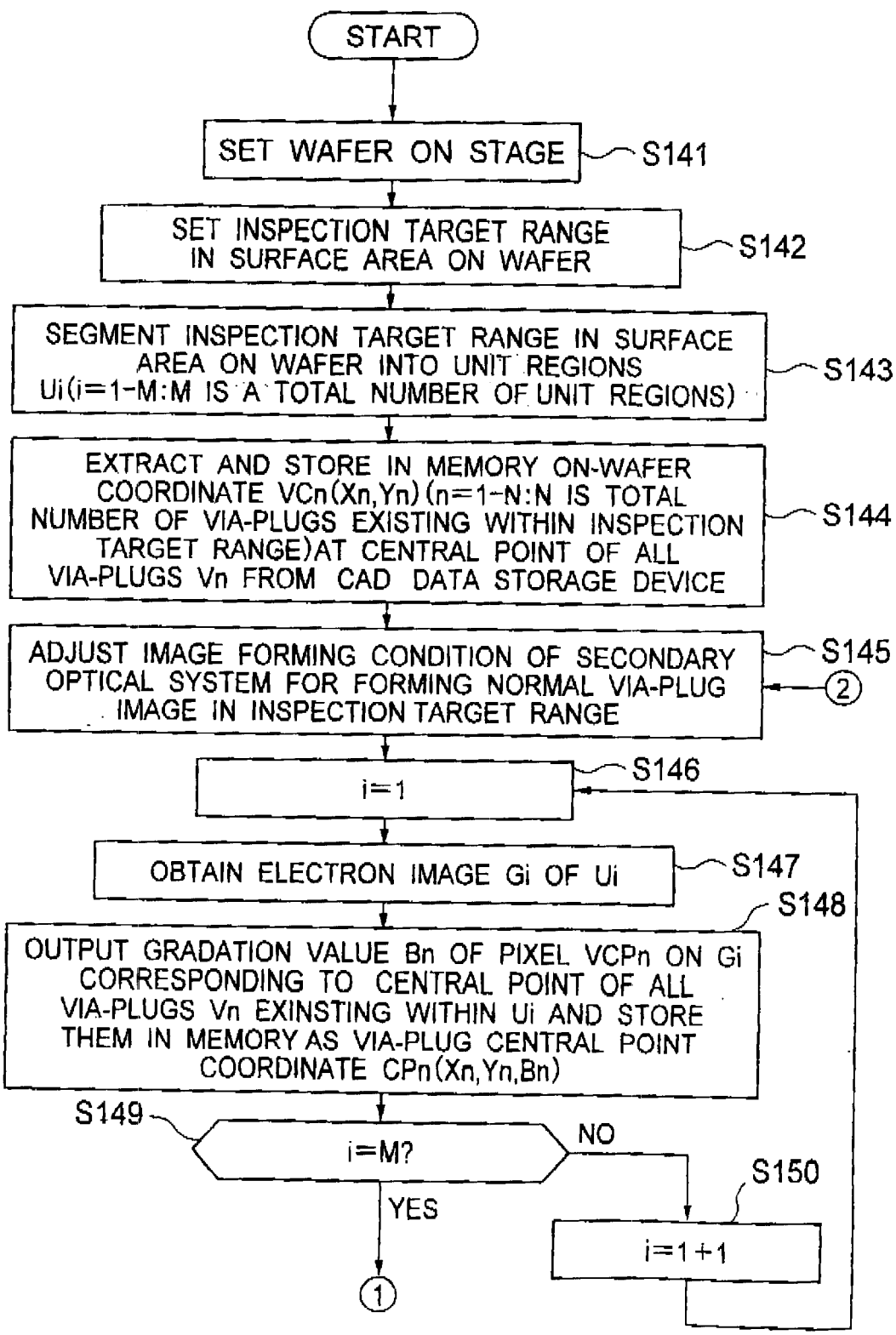
FIG. 43 is a flowchart showing the thirteenth embodiment of the substrate inspecting method of the present invention.
Figure 44:
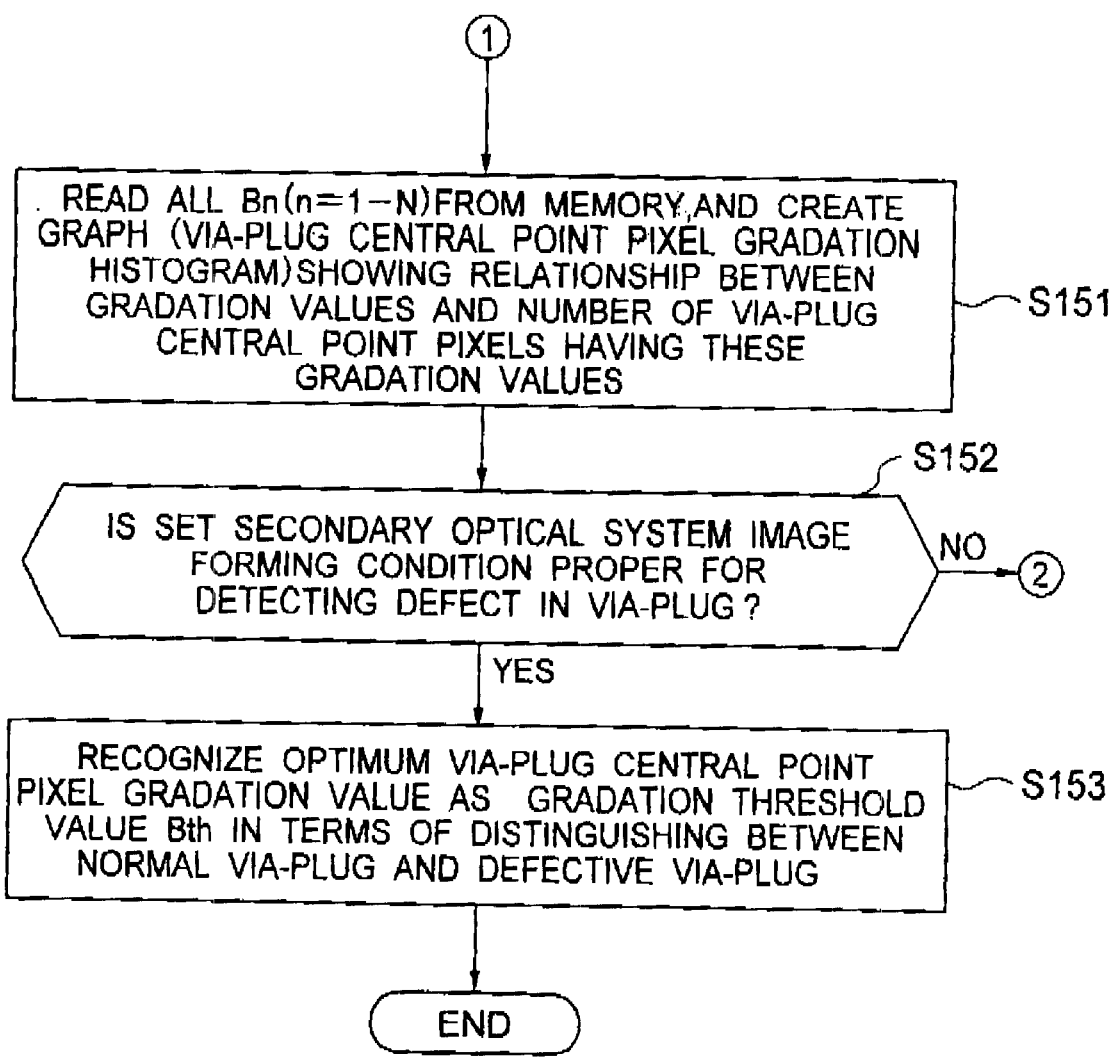
FIG. 44 is a flowchart showing the thirteenth embodiment of the substrate inspecting method of the present invention.
Figure 45A:
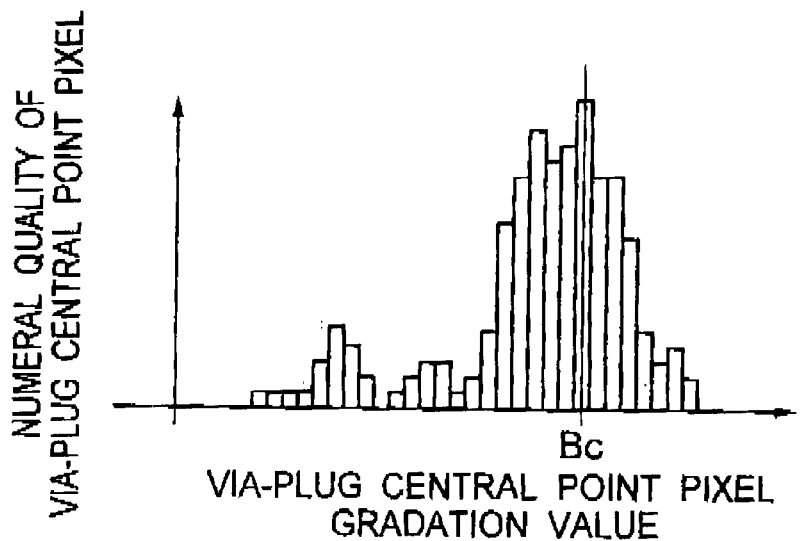
FIGS. 45A and 45B are schematic views showing the thirteenth embodiment of the substrate inspecting method of the present invention.
Figure 45B:
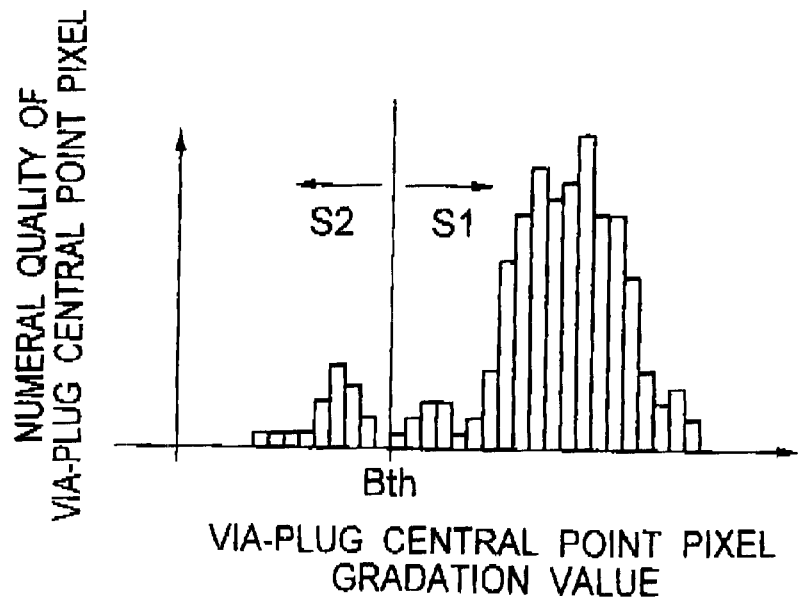
Figure 46:
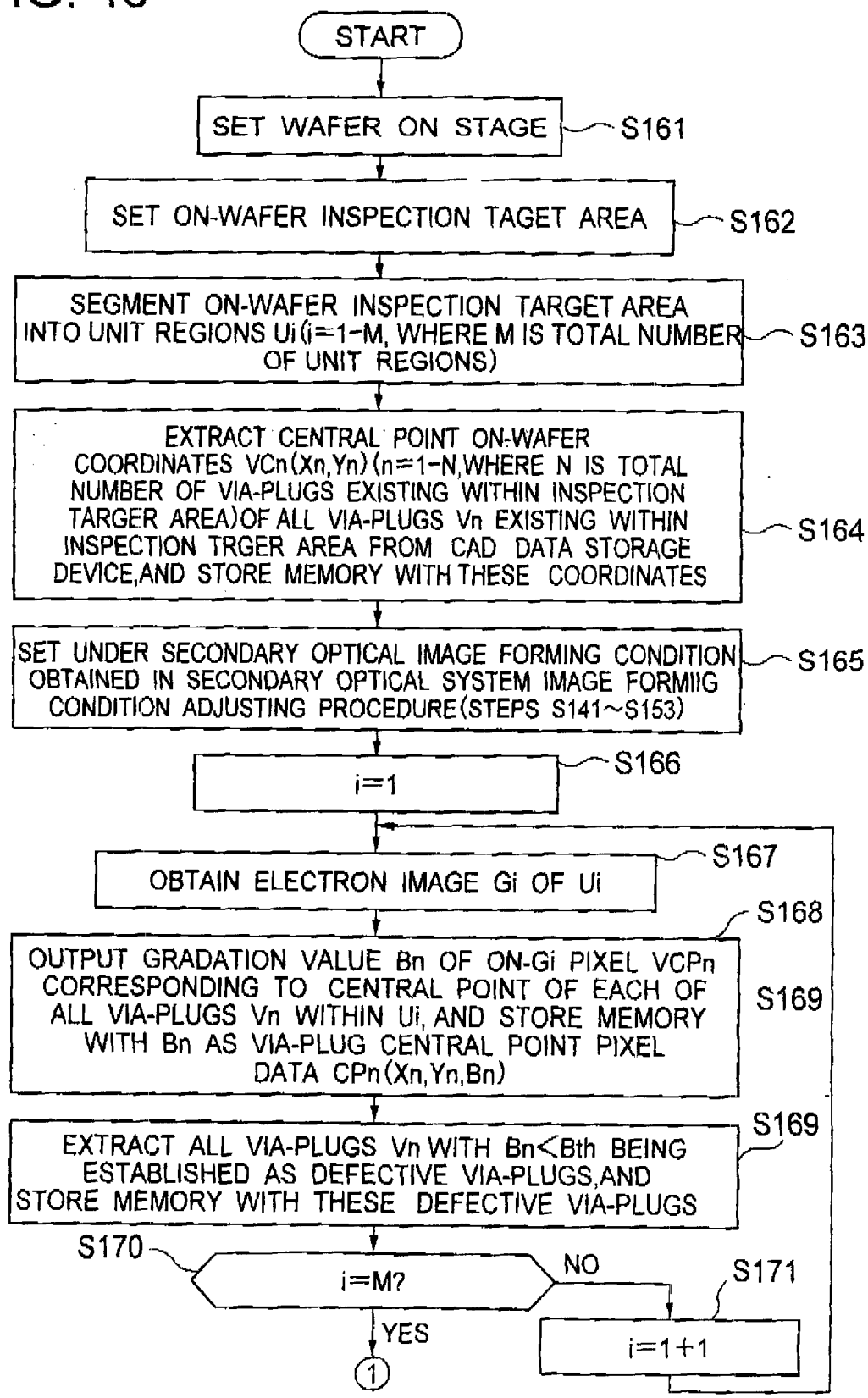
FIG. 46 is a flowchart showing the thirteenth embodiment of the substrate inspecting method of the present invention.

One operation of the substrate inspecting system 110 will be explained by way of a thirteenth embodiment of the substrate inspecting method of the present invention. FIGS. 41 and 42 are- explanatory schematic views showing the inspecting method in the thirteenth embodiment. FIGS. 45A and 45B are explanatory graphs in the thirteenth embodiment, FIGS. 43, 44 and 46 are explanatory flowcharts showing the inspecting method in the thirteenth embodiment. FIGS. 43 and 44 are the flowcharts for adjusting the image focusing condition of the secondary optical system 2 and the gradation threshold value Bth. FIG. 46 is the flowchart for detecting a defect in the via-plug on the basis of the contents of the flowchart in FIG. 44.

To begin with, as shown in FIG. 43, the wafer 42 defined as the inspection target substrate is set on the stage 43 (step S141). An inspection target range in the surface area on the wafer 42 is set (step S142).

Next, as shown in FIG. 41, the inspection target range in the surface area on the wafer 42 is segmented into unit regions Ui (I=1–M, where M is a total number of the unit regions within the inspection target range) (step S143 in FIG. 43). It is desirable that a size of the unit region Ui be maximized when selecting this size so that the substrate inspecting system 110 is capable of obtaining batchwise the image.

Referring back to FIG. 43, an on-wafer coordinate VCn (Xn, Yn) (n=1–N, where N is a total number of the via-plugs existing within the inspection target range) at the central point of all via-plugs Vn existing within the inspection target range, is extracted from contents stored in the CAD data storage device 120, and stored in the memory 61 (step S144).

Subsequently, as to an arbitrary via-plug within the inspection target range, if this via-plug is normally formed, the inspecting condition input unit 121 inputs, to the measurement command unit 122, an image focusing condition of the secondary optical system 2 under which the secondary beams emitted from that normal via-plug are to focus into an image on the electron detector 3. Then, the measurement command unit 122 generates the control signals based on the image focusing condition to the respective control units 15, 17 and 51–57 (step S145). This image focusing condition is individually determined based on the design information in consideration of a wire material, etc.

Next, the measurement command unit 122 sets a unit region number I to an initial value 1 (Step S146). Subsequently, the measurement command unit 122 generates signals to irradiate the unit regions Ui with the electron beams while moving the stage 43 as indicated by a broken line with arrowheads in FIG. 41 under the image focusing condition set in the procedure in step S145 described above, thereby obtaining electron images Gi (Step S147).

Next, the measurement command unit 122 extract, from the obtained electron images G1, a pixel (which will hereinafter be referred to as a via-plug central point pixel) VCPn corresponding to a central point VCn of all the via-plugs Vn existing within the unit regions Ui, and respectively outputs a gradation value Bn of the pixel VCPn by a known data converting process. Then, the measurement command unit 122 stores the memory with the via-plug central pixel data CPn (Xn, Yn, Bn) in a manner of making each central point coordinate VCn and each gradation value Bn corresponding to each other (step S148).

FIG. 42 schematically shows via-plugs V1–V9 within the electron images Gi obtained within the unit regions Ui, and central pixels VCP1–VCP9 of the respective via-plugs. Referring to FIG. 42, the central point pixels of the normally formed via-plugs are indicated by black circles, while the central point pixels of the via-plugs containing open defective portions and/or cracks are indicated by while circles.

Referring to FIG. 43, the measurement command unit 122 judges whether or not the inspections of all the unit regions within the-entire inspection target area are finished, i.e., whether or not the number i of the unit regions in the process of being inspected at the present reaches the total number M of the unit regions (step S149). If there exists an uninspected unit region (I<M), an inspection of the next unit region $U_{i+1}$ is started (i=i+1, step S150), and a loop process of steps S147 through S150 is repeated until the inspections of all the unit regions are finished. The measurement command unit 122, when recognizing that the inspections of all the unit regions have been ended (i=M), notifies the image focusing condition judging unit 124 of this purport as a piece of information. Then, the image focusing condition judging unit 124 reads from the memory 61 the pixel gradation values Bn of the central points of all the via-plugs within the inspection target area, and creates a graph showing a relationship between the gradation values and the number of the central point pixels having these gradation values (which graph will hereinafter be termed a via-plug central point pixel gradation histogram) (step S151 in FIG. 44). The via-plug central point pixel gradation histogram is the graph in which the gradation values are given on the axis of abscissa, and the numerical quantities of the via-plug central point pixels having the above gradation values are given on the axis of ordinates. FIGS. 45A and 45B show specific examples of the via-plug central point pixel gradation histogram created in step S151.

Referring to FIG. 44, the image focusing condition judging unit 124 judges based on the thus created via-plug central point pixel gradation histogram whether or not the set image focusing condition of the secondary optical system is proper for defecting a defect in the via-plug (step S152). This judging method maybe, as shown in, e.g., FIG. 45A, exemplified such as judging that the set image focusing condition of the secondary optical system is adequate when a value of the numerical quantity of the via-plug central point pixels is maximized at a normal via-plug central point pixel gradation value Bc.

The image focusing condition judging unit 124, when judging that the set image focusing condition of the secondary optical system is proper for detecting the defect in the via-plugs, supplies the gradation threshold value judging unit 125 with the via-plug central point pixel gradation histogram data. Whereas if judging that the set image focusing condition of the secondary optical system is not adequate, the image focusing condition judging unit 124 notifies the measurement command unit 122 of a purport of being inadequate. The measurement command unit 122 modifies the image forming condition of the secondary optical system, and a loop of processes of steps S145 through S152 are repeated until the image focusing condition judging unit 124 judges that a newly set image focusing condition of the secondary optical system is adequate in the substrate inspecting system 110. The gradation threshold value judging unit 125 is supplied with the via-plug central point pixel gradation histogram data from the image focusing condition judging unit 124, and determines a gradation threshold value Bth. In this embodiment, the via-plug central point pixel gradation value optimal in terms of distinguishing between the normal via-plug and the defective via-plug-, is acknowledged as the gradation threshold value Bth (step S153). More specifically, what the defect detection factor becomes a defect detection factor F based on an empirical value etc. previously inputted as an inspecting condition, may be acknowledged as the gradation threshold value Bth, it to be noted that if difficult to sat the defect detection factor F based on the empirical value etc., for instance, an SEN image of the section of the defective portion detected by the substrate inspecting system is separately obtained, and an operator visually confirms the defect on the baste of this SEM image and may determine, as the gradation threshold value Bth, a value with which a true defect detection factor F containing no pseudo defect is maximized.

The method of determining the gradation threshold value Bth will be explained in greater details with reference to the via-plug central point pixel gradation, histogram shown in FIG. 45B. Let S1 be a numerical quantity of the via-plug central point pixels having a gradation value equal to or over Bth, and S2 be a numerical quantity of the via-plug central point pixels having a gradation value less than Bth, and the defect detection factor F is calculated by the following formula:

$$F=S2/(S1+S2)$$

Then, Bth may be determined so that the normal via-plug central point pixel is not contained in S2 and the defect detection factor F is maximized.

Next, the gradation threshold value judging unit 125 supplies the memory 61 with the determined gradation threshold value Bth, and further notifies the measurement command unit 122 of information indicating an end of the determination of the gradation threshold value. The measurement command unit 122, upon receiving the information that the determination of the gradation threshold value has been ended, finishes the second optical system image focusing condition/gradation threshold value adjusting flow.

Next, a procedure of actually detecting a defect in the via-plug on the wafer 42 by executing again the stage-scan based on the gradation threshold value and the secondary optical system image forming condition which have been determined in the procedures described above, will be explained with reference to a flowchart in FIG. 46.

At first, the procedure starting from setting the wafer 42 on the stage 43 and extracting on-wafer coordinates VCn (Xn, Yn) at the central points of all the via-plugs Vn within the inspection target area and ending with storing the memory 61 with those coordinates VCn (steps S161 through S164), is the same as that shown in FIG. 43 (see steps 141–S144 in FIG. 43).

Next, a procedure of actually detecting a defect in the via-plug on the wafer 42 by executing again the stage-scan based on the gradation threshold value and the secondary optical system image focusing condition which have been determined in the procedures described above, will be explained with reference to a flowchart in FIG. 46.

Next, the measurement command unit 122 sets the number i of the unit regions to the initial value 1 (step S166). Subsequently, the measurement command unit 122 generates to irradiate the unit regions Ui with the electron beams while moving the stage 43 an indicated by, e.g., the broken line with the arrowheads in FIG. 41 under the image focusing condition set in the procedure in step S165 described above, thereby obtaining electron images Gi of the unit regions Ui (step S167).

Next, the measurement command unit 122 extract, from the obtained electron images Gi, a via-plug central point pixel VCPn corresponding to each of central points VCn of all the via-plugs Vn existing within the unit regions Ui, and respectively outputs a gradation value Bn of the pixel VCPn by a known data converting process. Then, the measurement command unit 122 stores the memory with the via-plug central pixel data CPn (Xn, Yn, Bn) in a manner of making each central point coordinate VCn and each gradation value Bn corresponding to each other (step S168).

Next, the defective portion specifying unit 126 reads from the memory 61 all the via-plug central point pixel data CPn and the gradation threshold value Bth obtained in the procedure shown in FIGS. 43 and 44. The specifying unit 126 compares each of the gradation values Bn in the CPn data with the threshold value Bth, then extracts, as a defective via-plug, the via-plug Vn with Bn<Bth being established therein, and stores the memory 61 with information (Xn, Yn, Bn) thereof (step S169).

Next, the measurement command unit 122 judges whether or not the inspections of all the unit regions within the entire inspection target area are finished, i.e., whether or not the number "i" of the unit regions in the process of being inspected at the present reaches the total number M of the unit regions (step S170). If there exists an uninspected unit region (i<M), an inspection of the next unit region $U_{i+1}$ is started (i=i+1, step S171), and a loop process of steps S167 through S171 is repeated till the inspections of all the unit regions are finished. The measurement command unit 122, when recognizing that the inspections of all the unit regions have been ended (i=M), notifies the respective control units 16, 17 and 51–57 of this purport as a piece of information. Then, those settings are reset to the initial conditions, and the information on the defective via-plugs is read from the memory 61 and displayed on the display unit 60 through the image display processing unit 123, thus finishing the inspections.

As discussed above, the substrate inspecting system 110 in this embodiment is capable of distinguishing between the normal via-plug and the defective via-plug by obtaining the information on only the gradation values of the central point pixels of the via-plugs, determining the threshold value Bth serving as the criterion for judging whether the via-plug is normal or defective, and making the comparison in magnitude between the gradation value of the central point pixel and the threshold value Bth. The time needed for the inspection of the electrical defect in the via-plug can be thereby remarkably reduced. Further, it may be sufficient that the memory is recorded with the information on only the gradation values of the central point pixels of the via-plugs, and hence a storage capacity can be made by far smaller than in the substrate inspection system 50 for executing the image comparing process described above.

According to the inspecting method in the thirteenth embodiment discussed above, the pixel gradation values of only the central points of the via-plugs are used as parameters for distinguishing between the normal via-plug and the defective via-plug. An average gradation value of the plurality of pixels in the vicinity of the central point of the via-plug may also be, however, used for detecting the defect. The plurality of pixels should be, however, those within the via-plug regions. This method is effective in preventing the normal via-plug from being mis-recognized as a defective via-plug if there exist much electron image noises.

Moreover, according to the inspecting method in the thirteenth embodiment discussed above, the inspection is implemented by setting the image forming condition of the secondary optical system so that the secondary beams coming from the normal via-plug form the image on the electron detector 3. However, the same defect inspection as the above-mentioned may also be carried out by use of the secondary optical system image forming condition under which the image of the defective via-plug is formed. Further, the single value is determined as the threshold value Bth, however, a plurality of threshold values Bth may be set, and contents of the defects may also be classified corresponding to the required specifications of the integrated circuit device.

Figure 47:
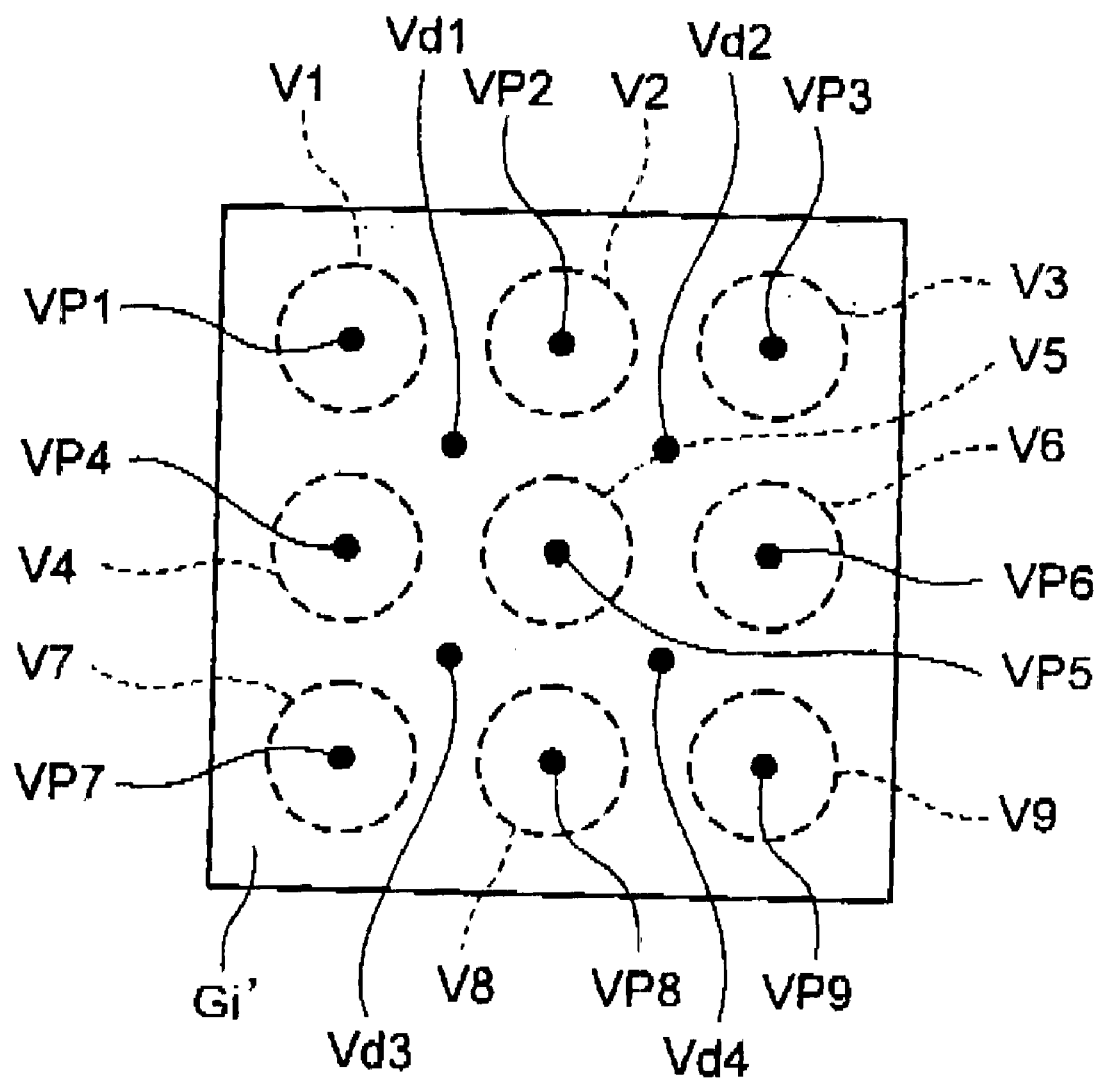
FIG. 47 is a schematic view showing the thirteenth embodiment of the substrate inspecting method of the present invention.

Moreover, the substrate inspecting system 110 is capable of inspecting whether or not, for example, the contamination is caused by acid and/or metal etc. on the inter-wire insulator in the vicinity of the wire, and the level of the contamination as well. This inspection can be attained with the aid of the flowcharts shown in FIGS. 43, 44 and 46, wherein the inspection target region extends a predetermined distance from, e.g., the center of the via-plug. Further, as illustrated in FIG. 42, in an area where the via-plugs V1–V9 are disposed in matrix, if points Vd1–Vd4 having equal distances from central points VP1–VP9 of the via-plugs V1–V9 are set as inspection target points as seen in an electron image Gi' shown in a schematic view in FIG. 47, it can be judged at a high speed whether or not the inter-wire insulator formed between the via-plugs is contaminated. Further, the contamination levels can be classified with a high throughput by setting a plurality of threshold values.

A considerable number of embodiments of the present invention have been discussed so far, however, the present invention is not limited to the embodiments described above and may be carried out as a variety of modifications within the scope of the present invention without departing from the spirit of the present invention. The embodiments discussed above have dealt with the stage-scan for scanning the electron beams over the surface of the substrate while moving the stage by way of the electron beam scanning methods, and may also be, as a matter of course, applied to a beam-scan for scanning the electron beams themselves over the surface of the substrate by use of a deflector. Moreover, though the semiconductor wafer is used as the substrate, a reticle etc. can be also of course inspected.

What is claimed is:

1. A substrate inspecting system comprising:
    an electron beam irradiating device which irradiates a substrate specified as an inspection target with a primary electron beam, the irradiation of the primary electron beam causing secondary electrons and reflected electrons to generate from the substrate;
    an electron beam detection device which detects an image and outputs signals of the image, said detection device having a surface facing the substrate;
    wherein the secondary electron beam is comprised of the secondary electrons and the reflected electrons generated from the substrate, and the image is formed by said secondary electron beam and indicates a physical characteristic and/or a chemical characteristic of a region of the substrate; and
    a projection device which projects the secondary electrons and the reflected electrons as the secondary beam on the surface of said electron beam detection device, said projection device including:
        an electron beam separator which separates the secondary electron beam from the primary beam by deflecting the primary electron beam so as to travel to the substrate and by allowing the secondary electron beam to travel in a direction of said electron beam detection device; and
        a control device which provides a control signal to said projection device so as to project the secondary electron beam under an image focusing condition in accordance with a correlation between the chemical characteristic of the substrate and energy of the secondary electrons and the reflected electrons and which detects the physical characteristic and/or the chemical characteristic of the substrate on the basis of the control signal,
    wherein the energy of the secondary electrons and the reflected electrons varies depending on a state of the substrate, and wherein said image focusing condition is a condition for substantially focusing the secondary beam on the surface of said electron beam detection device.

2. The substrate inspecting system according to claim 1, wherein said physical characteristic is an electric characteristic; and
    said control device quantitatively measures a surface potential of an arbitrary region on the substrate on the basis of the control signal provided to said projection device.

3. The substrate inspecting system according to claim 1, further comprising a stage; wherein the stage placing the substrate thereon and being movable within a plane substantially horizontal to the surface of the substrate,
    said image focusing condition is a condition for focusing, on the surface of said electron beam detection device, into an image formed by only the secondary beam from a region on the surface of the substrate,
    wherein the region exhibiting an arbitrary electric potential,
    said control device outputs the image formed by the secondary beam from the region and positional information thereon,
    the image representing a configuration of the region, and
    the positional information being obtained based on coordinates of the stage.

4. The substrate inspecting system according to claim 1, wherein said control device controls said projection device under the various image forming condition in accordance with the correlation, and outputs two-dimensional potential distribution information on the surface of said substrate, and,
    the two-dimensional potential distribution information being created by synthesizing a plurality of the images obtained from regions exhibiting various electric potentials.

5. The substrate inspecting system according to claim 1, wherein the substrate has an interconnection formed on a surface part thereof, and, said control device outputs information on a defective portion of the interconnection on the basis of the image signals gained under the image forming condition.

6. The substrate inspecting system according to claim 1, wherein the substrate has a wire formed on the surface thereof, and, said control device outputs configuration information on a defective portion of the wire on the basis of the image signals gained under the image forming condition.

7. The substrate inspecting system according to claim 1, wherein the substrate is to be formed with an electronic device, and,
    said control device outputs information on a chemical characteristic of a material formed on the substrate, said material may cause deterioration in quality of the device.

8. A substrate inspecting system comprising:
    an electron beam irradiating device which irradiates a substrate specified as an inspection target with a primary electron beam, the substrate to be formed with an integrated circuit, and the irradiation of the primary electron beam causing secondary electrons and reflected electrons to generate from the substrate;

an electron beam detection device which detects an image formed by a secondary electron beam and outputs signals of the image, wherein said detection device has a surface facing the substrate, the secondary electron beam comprises the secondary electrons and the reflected electrons generated from the substrate, and the image indicates a physical characteristic and/or a chemical characteristic of a region of said substrate; and a projection device which projects the secondary electrons and the reflected electrons as the secondary beam on the surface of said electron beam detection device, said projection device including:

an electron beam separator which separates the secondary electron beam from the primary beam by deflecting the primary electron beam to travel to the substrate and by allowing the secondary electron beam to travel in a direction of said electron beam detection device;

a storage device which stores design information associated with the integrated circuit;

an image signal processing device which outputs a plurality of numerical values indicating an electrical state of the integrated circuit on the basis of signals of the image;

an arithmetic device which calculates an image focusing condition on the design information and which calculates, based on the numerical values, a threshold value serving as a criterion for judging whether or not the integrated circuit has an electrical defect, wherein said image focusing condition is a condition for substantially focusing the secondary beam on the surface of said electron beam detection device in accordance with a correlation between the physical characteristic and/or the chemical characteristic of the substrate and the energy of the secondary electrons and the reflected electrons, and wherein the energy of the secondary electrons and the reflected electrons varies depending on the electrical state of the integrated circuit; and a control device which controls said projection device so as to project the secondary electron beam under an image focusing condition, and which detects an electrical defect in the integrated circuit by comparing each of the numerical values with the threshold value.

9. The substrate inspecting system according to claim 8, wherein the inspection target is an interconnection arranged within the integrated circuit.

10. The substrate inspecting system according to claim 8, wherein said arithmetic device calculates a plurality of threshold values, and,
said control device classifies a level of the electrical defect in the integrated circuit.

11. A substrate inspecting method comprising the steps of:
irradiating a substrate specified as an inspection target with a primary electron beam, the irradiating of the primary electron beam causing secondary electrons and reflected electrons to generate from the substrate;
deflecting the primary electron beam to travel to the substrate;
projecting the secondary electrons and the reflected electrons as a secondary beam, wherein said projecting step includes allowing the secondary electron beam to travel in a direction opposite of the substrate;
detecting an image and outputting signals of the image, the image formed by the secondary electron beam and indicating a physical characteristic and/or a chemical characteristic of the substrate;
controlling the secondary electron beam under an image focusing condition, said focusing condition causing the secondary beam, from an arbitrary region on the substrate, to substantially focus an image in a position of detecting the secondary beam in accordance with a correlation between the physical characteristic and/or the chemical characteristic of the substrate and energy of the secondary electrons and the reflected electrons; and
detecting the physical characteristic and/or the chemical characteristic of the substrate on the basis of said image focusing condition, the energy of the secondary electrons and the reflected electrons varying according to the state of said substrate.

12. The substrate inspecting method according to claim 11, wherein said physical characteristic is an electric characteristic; and
said detecting of the physical characteristic and/or the chemical characteristic is quantitatively measuring a surface potential of an arbitrary region on said substrate on the basis of said image focusing condition.

13. The substrate inspecting method according to claim 11, further comprising moving the substrate within a plane substantially horizontal to the surface thereof;
wherein said image focusing condition is a condition for focusing, in the position of detecting the secondary beams, the image being formed by only the secondary beam from a region exhibiting an arbitrary electric potential on the surface of the substrate, and
said detecting of the physical characteristic and/or the chemical characteristic is detecting an image which represents a configuration of the region and outputting positional information thereof on the basis of the image signals and coordinates of the substrate.

14. The substrate inspecting method according to claim 11, wherein said controlling of the secondary beams is controlling the secondary beams under various image forming conditions in accordance with the correlation;
wherein said detecting of the physical characteristic and/ or the chemical characteristic includes synthesizing a plurality of electron images obtained from the regions exhibiting various electric potentials to output two-dimensional potential distribution information on the surface of the substrate.

15. The substrate inspecting method according to claim 11, wherein the substrate has an interconnection formed on a surface part thereof; and
wherein said detecting of the physical characteristic and/ or the chemical characteristic includes outputting information of a defective portion in the interconnection on the basis of correlation between said image focusing condition and the physical characteristic and/or the chemical characteristic of the defective portion.

16. The substrate inspecting method according to claim 11, wherein the substrate has an interconnection formed on the surface thereof; and
said detecting of the physical characteristic and/or the chemical characteristic includes obtaining configuration information on a defective portion of the interconnection on the basis of the correlation between the image focusing condition and they physical characteristic and/or the chemical characteristic of the defective portion.

17. The substrate inspecting method according to claim 11, wherein the substrate is to be formed with an electronic device; and said detecting of the physical characteristic and/or the chemical characteristic includes of obtaining information on a chemical characteristic of a material formed on the substrate, the material causing deterioration in quality of the device.

18. A substrate inspecting method comprising:

irradiating a substrate, formed with an integrated circuit and specified as an inspection target, with a primary electron beam thereby causing secondary electrons and reflected electrons to generate from the substrate;

deflecting the primary electron beam to travel to the substrate;

projecting the secondary electrons and the reflected electrons as a secondary beam, wherein projecting the secondary electrons and the reflected electrons includes allowing the secondary electron beam to travel in a direction opposite of the substrate;

detecting an image and outputting signals of the image, the image formed by the secondary electron beam and indicating the physical characteristic and the chemical characteristic of the substrate;

controlling the secondary electron beam under such an image forming condition that the secondary beam from an arbitrary region on the substrate focuses into an image in a position of detecting the secondary beams in accordance with a correlation between the physical characteristic and the chemical characteristic of the substrate and the energy of the secondary electrons and the reflected electrons, wherein the energy of the secondary electrons and the reflected electrons varies depending on the physical characteristic and the chemical characteristic of said substrate;

storing design information related to the integrated circuit;

processing the image signals and outputting a plurality of numerical values indicating an electrical state of the integrated circuit on the basis of the image signals;

calculating said image focusing condition based on the design information and calculating, based on the numerical values, a threshold value serving as a criterion for judging whether or not the integrated circuit is appropriately formed; and detecting an electrically defective portion in the integrated circuit by comparing each of the numerical values with the threshold value.

19. The substrate inspecting method according to claim 18, wherein the inspection target is an interconnection arranged within the integrated circuit.

20. The substrate inspecting method according to claim 18, wherein said calculating of the threshold value is calculating a plurality; and said detecting of the defective portion includes classifying a level of the electrical defect in the integrated circuit.

21. A substrate inspecting system comprising:

an electron beam irradiating device to irradiate a substrate using a primary electron beam, said irradiation causing the substrate to generate secondary electrons and reflected electrons;

an electron beam detection device, having a surface facing the substrate, to detect an image formed by a secondary electron beam and to output image signals, the secondary electron beam comprising the secondary electrons and the reflected electrons, and the image indicating a characteristic of a region of the substrate;

an electron beam separator to deflect the primary electron beam such that said primary beam travels substantially perpendicular to the substrate and to allow the secondary electron beam to travel to the electron beam detection device;

a projection device to project the secondary electron beam on the surface of the detection device;

a control device to control the projection device such that the secondary electron beam is projected under an image focusing condition, said image focusing condition being in accordance with a correlation between the characteristic of the substrate and energy of the secondary electrons and the reflected electrons; and a computing device to receive the image signals from the detection device, the computing device comprising:

a measuring condition input unit to supply measuring conditions, said measuring conditions including positional information related to a region of the substrate;

a command unit to receive the measuring conditions and to supply at least one control signal to at least one control device based on the measuring condition; and a judging unit to determine whether the image formed by the secondary electron beam is accurately formed on the detection unit, wherein, in response to a determination that the image is not accurately formed, the command unit modifies the image focusing condition and the region of the substrate indicted by the image is re-irradiated by the electron beam irradiating device, and in response to a determination that the image is accurately formed, the command unit supplies the image focusing condition to a potential calculating unit, which calculates an electrical potential associated with said region of the substrate.

* * * * *

UNITED STATES PATENT AND TRADEMARK OFFICE
CERTIFICATE OF CORRECTION

PATENT NO. : 6,563,114 B1
DATED : May 13, 2003
INVENTOR(S) : Nagahama et al.

It is certified that error appears in the above-identified patent and that said Letters Patent is hereby corrected as shown below:

Column 39,
Line 29, change "the design" to -- the basis of the design --.

Column 40,
Line 65, change "they" to -- the --.

Column 41,
Line 5, change "includes of obtaining" to -- includes obtaining --.

Column 42,
Line 46, change "indicted" to -- indicated --.

Signed and Sealed this

Twenty-third Day of September, 2003

JAMES E. ROGAN
*Director of the United States Patent and Trademark Office*